(12) United States Patent
Hayashi et al.

(10) Patent No.: US 9,129,932 B2
(45) Date of Patent: Sep. 8, 2015

(54) SEMICONDUCTOR MODULE

(75) Inventors: Kenji Hayashi, Kyoto (JP); Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/129,262

(22) PCT Filed: Jun. 27, 2012

(86) PCT No.: PCT/JP2012/066358
§ 371 (c)(1),
(2), (4) Date: Dec. 24, 2013

(87) PCT Pub. No.: WO2013/002249
PCT Pub. Date: Mar. 1, 2013

(65) Prior Publication Data
US 2014/0124915 A1    May 8, 2014

(30) Foreign Application Priority Data

Jun. 27, 2011 (JP) ................................ 2011-142036
Feb. 17, 2012 (JP) ................................ 2012-033142

(51) Int. Cl.
*H01L 23/10* (2006.01)
*H01L 23/34* (2006.01)
(Continued)

(52) U.S. Cl.
CPC .............. *H01L 23/367* (2013.01); *H01L 23/24* (2013.01); *H01L 23/3735* (2013.01); *H01L 23/4006* (2013.01); *H01L 24/49* (2013.01); *H01L 25/072* (2013.01); *H01L 25/18* (2013.01); *H01L 23/36* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/291* (2013.01);
(Continued)

(58) Field of Classification Search
USPC .................. 257/703, 706, 707, 713, 718, 719
See application file for complete search history.

(56) References Cited

U.S. PATENT DOCUMENTS 5,508,560 A    4/1996 Koehler et al.
5,793,106 A    8/1998 Yasukawa et al.
(Continued)

FOREIGN PATENT DOCUMENTS

DE    4338107 C1    3/1995
DE    19609929 A1    9/1997
(Continued)

OTHER PUBLICATIONS

Extended European Search Report dated Mar. 17, 2015.

*Primary Examiner* — S. V. Clark
(74) *Attorney, Agent, or Firm* — Rabin & Berdo, P.C.

(57) ABSTRACT

A semiconductor module includes an insulating substrate (200) that is made of AlN and that has a first plane (201) and a second plane (202) both of which face mutually opposite directions, a first conductor layer (210) formed on the first plane (201), a second conductor layer (220) formed on the second plane (202), a semiconductor device (300) bonded to the first conductor layer (210) with a first solder layer (510) interposed therebetween, and a heat dissipation plate (400) that is formed in a rectangular shape when viewed planarly and that is bonded to the second conductor layer (220) with a second solder layer (520) interposed therebetween, and, in this semiconductor module, the heat dissipation plate (400) is deformed so as to become convex in a direction in which the second plane (202) is pointed when viewed from a width direction thereof.

17 Claims, 26 Drawing Sheets

(51) Int. Cl.
*H01L 23/367* (2006.01)
*H01L 25/18* (2006.01)
*H01L 25/07* (2006.01)
*H01L 23/24* (2006.01)
*H01L 23/373* (2006.01)
*H01L 23/40* (2006.01)
*H01L 23/36* (2006.01)
*H01L 23/00* (2006.01)

(52) U.S. Cl.
CPC ........ *H01L 2224/32225* (2013.01); *H01L 2224/45124* (2013.01); *H01L 2224/48137* (2013.01); *H01L 2224/48139* (2013.01); *H01L 2224/48227* (2013.01); *H01L 2224/49111* (2013.01); *H01L 2224/49175* (2013.01); *H01L 2224/73265* (2013.01); *H01L 2924/01013* (2013.01); *H01L 2924/01028* (2013.01); *H01L 2924/01029* (2013.01); *H01L 2924/10272* (2013.01); *H01L 2924/12032* (2013.01); *H01L 2924/12036* (2013.01); *H01L 2924/1305* (2013.01); *H01L 2924/1306* (2013.01); *H01L 2924/13055* (2013.01); *H01L 2924/13091* (2013.01); *H01L 2924/19107* (2013.01); *H01L 2924/30107* (2013.01)

(56) References Cited

U.S. PATENT DOCUMENTS

| | | | | |
|---|---|---|---|---|
| 6,833,617 B2* | 12/2004 | Kondo et al. | ............. | 257/707 |
| 7,018,670 B2* | 3/2006 | Baumer et al. | ............. | 426/660 |
| 7,196,413 B2* | 3/2007 | Shibuya et al. | ............. | 257/707 |
| 8,283,773 B2* | 10/2012 | Mori et al. | ............. | 257/705 |
| 2003/0102553 A1* | 6/2003 | Ishikawa et al. | ............. | 257/707 |
| 2004/0130018 A1* | 7/2004 | Sugiyama et al. | ............. | 257/706 |
| 2004/0144561 A1 | 7/2004 | Osanai et al. | | |
| 2005/0035445 A1 | 2/2005 | Manz et al. | | |
| 2006/0157862 A1 | 7/2006 | Nishimura et al. | | |
| 2008/0101032 A1 | 5/2008 | Tschirbs et al. | | |

FOREIGN PATENT DOCUMENTS

| | | |
|---|---|---|
| DE | 19707514 A1 | 8/1998 |
| EP | 1501127 A2 | 1/2005 |
| JP | H08-236667 A | 9/1996 |
| JP | 2000-200865 A | 7/2000 |
| JP | 2001-291809 A | 10/2001 |
| JP | 2006-202884 A | 8/2006 |
| JP | 2007-012928 A | 1/2007 |
| JP | 2009-147074 A | 7/2009 |
| WO | WO 01-08219 A1 | 2/2001 |

* cited by examiner

FIG. 4

| | Semiconductor module 101 | Comparative Example 1 | Comparative Example 2 | Comparative Example 3 |
|---|---|---|---|---|
| Insulating substrate material | AlN | AlN | Al2O3 | Al2O3 |
| Thermal conductivity [W/m·K] | 170 | 170 | 20 | 20 |
| Coefficient of linear expansion [×10⁻⁶/°C] | 4.5 | 4.5 | 6.4 | 6.4 |
| H1 [μm] | +30 | −100 | +30 | +80 |
| Thermal resistance [°C/W] | 0.15 | 0.21 | 0.21 | 0.23 |
| Electric current [A] | 100 | 92.8 | 92.8 | 90.7 |
| Required area [−] | 1 | 2.3 | 1.8 | 2.2 |

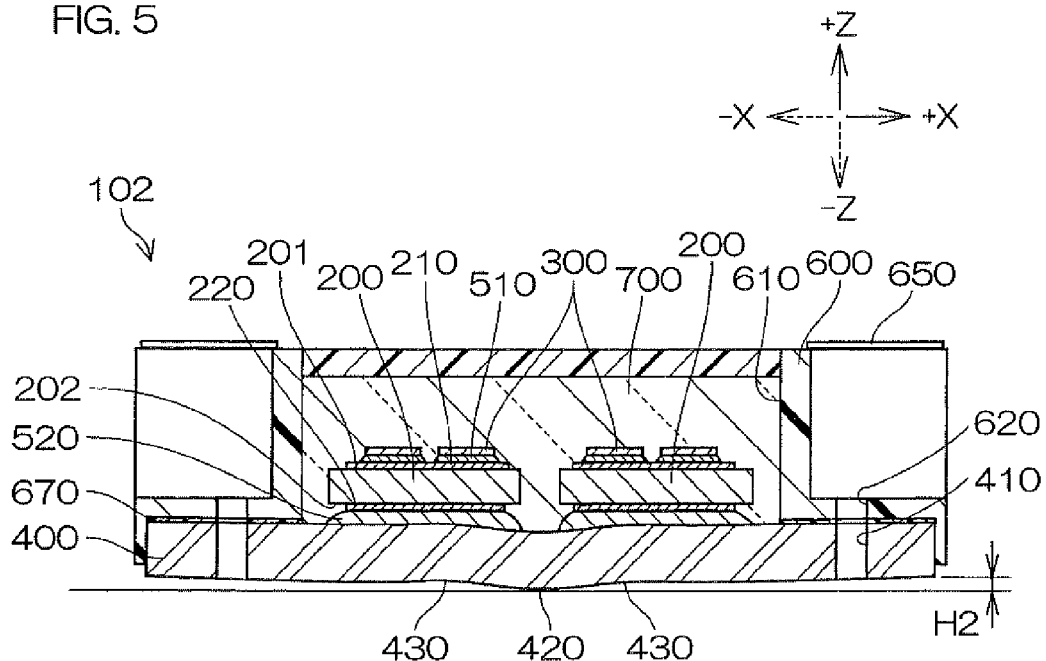
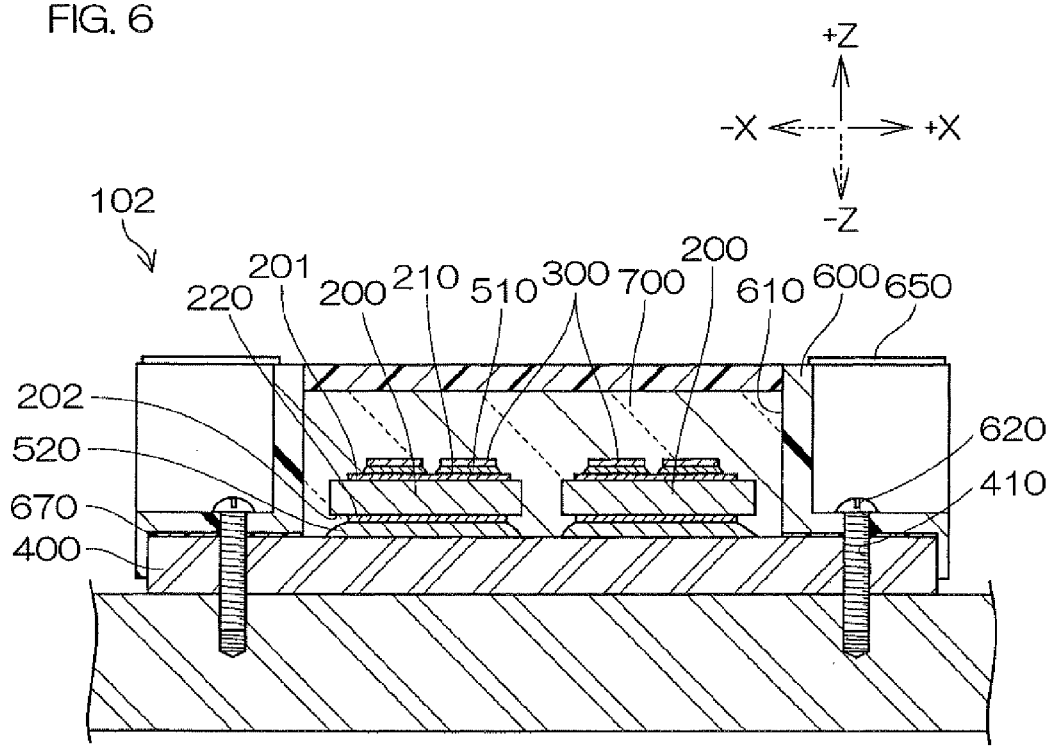

SEMICONDUCTOR MODULE

TECHNICAL FIELD

The present invention relates to a semiconductor module for use in, for example, power circuits of trains or of industrial equipment.

BACKGROUND ART

A semiconductor module using a semiconductor device that performs a so-called switching function is used in power circuits in a wide field. In particular, a semiconductor module for use in, for example, power circuits of trains or of industrial equipment is required to have high withstand voltage, heavy electric current, and high heat dissipation ability. FIG. 28 shows one example of a conventional semiconductor module that is usable for such purposes (see Patent Literature 1, for example). The semiconductor module 900 shown in this figure has conductor layers 992 and 993 made of, for example, Cu on both sides of an insulating substrate 991 made of $Al_2O_3$. A semiconductor device 994 is bonded to the conductor layer 992 with a solder layer 995 therebetween. The semiconductor device 994 is arranged as, for example, an IGBT (Insulated Gate Bipolar Transistor). A heat dissipation plate 997 made of, for example, Cu is bonded to the conductor layer 993 with a solder layer 996 therebetween.

When the semiconductor module 900 is used for trains or for industrial equipment, the heat dissipation plate 997 is attached to a fixing board (not shown) mounted in these devices. However, when the semiconductor module 900 is produced, the heat dissipation plate 997 is liable to deform so that its upper side becomes convex in FIG. 28. As a result, a gap is made between the board and the heat dissipation plate 997. Therefore, it is impossible to appropriately dissipate heat from the semiconductor module 900. This hinders the enhancement of an electric current.

CITATION LIST

Patent Literature

PTL 1: Japanese Unexamined Patent Publication No. 2006-202884

SUMMARY OF INVENTION

Technical Problem

The present invention has been conceived under the aforementioned circumstances, and aims to provide a semiconductor module capable of appropriately dissipating heat.

Solution to Problem

A semiconductor module provided according to a first aspect of the present invention includes an insulating substrate that is made of AlN and that has a first plane and a second plane both of which face mutually opposite directions, a first conductor layer formed on the first plane, a second conductor layer formed on the second plane, a semiconductor device bonded to the first conductor layer with a first solder layer interposed therebetween, and a heat dissipation plate that is formed in a rectangular shape when viewed planarly and that is bonded to the second conductor layer with a second solder layer interposed therebetween, and, in this semiconductor module, the heat dissipation plate is deformed so as to become convex in a direction in which the second plane is pointed when viewed from a width direction thereof.

According to the present invention, it is possible to form the heat dissipation plate so as to have a shape along a stationary plate by fixing both ends in the length direction of the heat dissipation plate by means of a bolt or the like in such a manner as to press the both ends onto the stationary plate that is an object to which the semiconductor module is attached. Therefore, a gap is not easily made between the heat dissipation plate and the stationary plate in a state in which the semiconductor module is being used, and it is possible to heighten the degree of contact between the heat dissipation plate and the stationary plate. As a result, it is possible to appropriately transmit heat generated from the semiconductor device to the stationary plate.

In one embodiment of the present invention, a distance in a thickness direction of a surface on a same side as a lengthwise center and lengthwise both ends of the heat dissipation plate is greater than 0 µm and is 100 µm or less.

In one embodiment of the present invention, a thickness of the second solder layer is 180 µm to 270 µm.

In one embodiment of the present invention, the semiconductor module further includes a case bonded to the heat dissipation plate and having a containing space that contains the insulating substrate and the semiconductor device.

In one embodiment of the present invention, the containing space is filled with an insulating sealing resin.

A semiconductor module provided according to a second aspect of the present invention includes two insulating substrates each of which is made of AlN and each of which has a first plane and a second plane facing mutually opposite directions, a first conductor layer formed on the first plane of each of the two insulating substrates, a second conductor layer formed on the second plane of each of the two insulating substrates, a semiconductor device bonded to each of the first conductor layers with a first solder layer interposed therebetween, and a heat dissipation plate that is formed in a rectangular shape when viewed planarly and that is bonded to both the second conductor layers with a second solder layer interposed therebetween, and, in this semiconductor module, the two insulating substrates are arranged side by side in a length direction of the heat dissipation plate, and the heat dissipation plate has a deformed portion that is positioned at an intermediate part in the length direction of the heat dissipation plate when viewed from a width direction of the heat dissipation plate and that is deformed so as to become convex in a direction in which the second plane is pointed and two inverted deformed portions that are positioned on both sides of the deformed portion and that are deformed so as to become convex in a direction in which the first plane is pointed.

According to the present invention, it is possible to form the heat dissipation plate so as to have a shape along a stationary plate by fixing both ends in the length direction of the heat dissipation plate by means of a bolt or the like in such a manner as to press the both ends onto the stationary plate that is an object to which the semiconductor module is attached. Therefore, a gap is not easily made between the heat dissipation plate and the stationary plate in a state in which the semiconductor module is being used, and it is possible to heighten the degree of contact between the heat dissipation plate and the stationary plate. As a result, it is possible to appropriately transmit heat generated from the semiconductor device to the stationary plate.

In one embodiment of the present invention, the deformed portion is disposed between the two insulating substrates when viewed planarly.

In one embodiment of the present invention, the two inverted deformed portions lie on the two insulating substrates when viewed planarly, respectively.

In one embodiment of the present invention, a distance in a thickness direction of a surface on a same side as lengthwise both ends of the heat dissipation plate and the deformed portion is greater than 0 μm, and is 100 μm or less.

In one embodiment of the present invention, a thickness of the second solder layer is 180 μm to 270 μm.

In one embodiment of the present invention, the semiconductor module further includes a case bonded to the heat dissipation plate and having a containing space that contains the insulating substrates and the semiconductor devices.

In one embodiment of the present invention, the containing space is filled with an insulating sealing resin.

In one embodiment of the present invention, the semiconductor module further includes a third conductor layer formed on the first plane of the insulating substrate and a connection metal member by which the semiconductor device bonded to the first conductor layer on the first plane of the insulating substrate and the third conductor layer are connected together, and, in this semiconductor module, the first conductor layer has a rectangular element bonding area, and the third conductor layer has a rectangular element connecting area that is disposed along one long side of the element bonding area of the first conductor layer and that has a long side facing the one long side of the element bonding area, and a plurality of semiconductor devices each of which is the aforementioned semiconductor device are arranged side by side in a length direction of the element bonding area on the element bonding area of the first conductor layer, and the semiconductor devices include two semiconductor devices that face both ends of the long side of the element connecting area of the third conductor layer.

According to this arrangement, the width (entire arrangement width) of the whole of the plurality of connection metal members by which the plurality of semiconductor devices and the element connecting area of the third conductor layer are connected together can be enlarged. As a result, inductance caused by the connection metal members can be reduced, and therefore the self-inductance of the semiconductor module can be reduced.

In one embodiment of the present invention, each connection metal member is disposed in parallel with a short side of the element bonding area of the first conductor layer, and one end thereof is bonded to the semiconductor device disposed on the first conductor layer whereas an opposite end thereof is bonded to the element connecting area of the third conductor layer.

In one embodiment of the present invention, the semiconductor module further includes a terminal electrically connected to the first conductor layer and a plurality of connection metal members one end of each of which is bonded to the first conductor layer and an opposite end of each of which is bonded to the terminal, and, in this semiconductor module, the plurality of connection metal members are disposed in parallel with each other when viewed planarly, and corresponding ends of the connection metal members adjoining each other are disposed at positions deviated in a length direction of the connection metal members, respectively, when viewed from a width direction of a whole of the plurality of connection metal members.

According to this arrangement, bonded parts of the adjoining connection metal members to the first conductor layer or to the terminal do not easily overlap with each other, and therefore the interval between the adjoining connection metal members can be narrowed, and it becomes easy to make an inspection (inspection by use of images) of the bonded parts of the connection metal members.

The aforementioned or other objects, features, and effects of the present invention will be clarified by the following description of embodiments given below with reference to the accompanying drawings.

BRIEF DESCRIPTION OF DRAWINGS

FIG. 4 is a table showing characteristics of the semiconductor module of the present embodiment and characteristics of semiconductor modules of comparative examples.

FIG. 5 is a sectional view showing a semiconductor module according to a second embodiment of the present invention.

FIG. 6 is a sectional view of a main part of the semiconductor module shown in FIG. 5, showing a state of being used.

DESCRIPTION OF EMBODIMENTS

Embodiments of the present invention will be hereinafter described in detail with reference to the accompanying drawings.

Hereinafter, preferred embodiments of the present invention will be specifically described with reference to the drawings.

Figure 1:
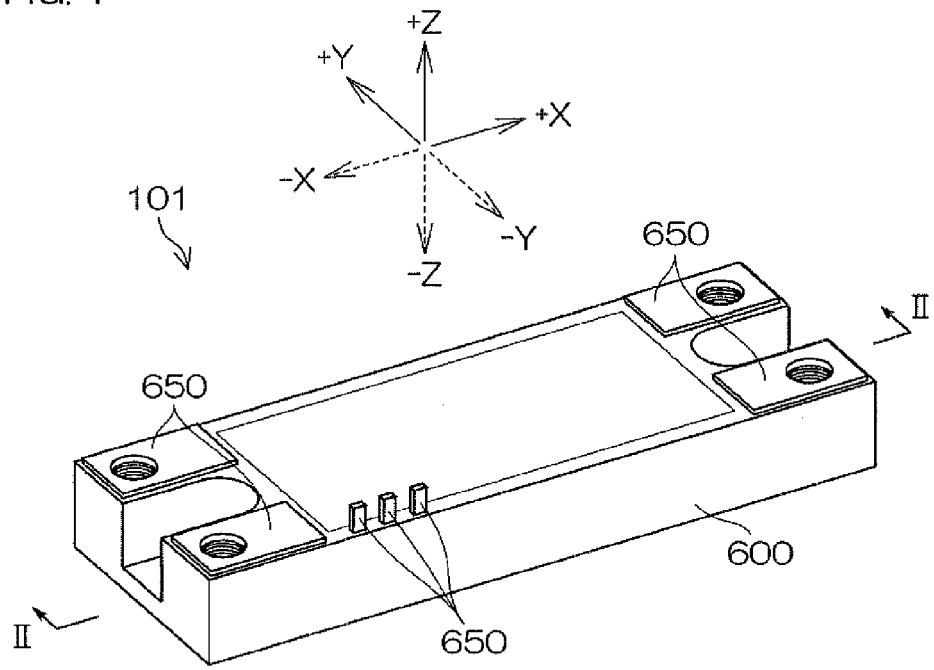
FIG. 1 is a perspective view showing a semiconductor module according to a first embodiment of the present invention.
Figure 2:
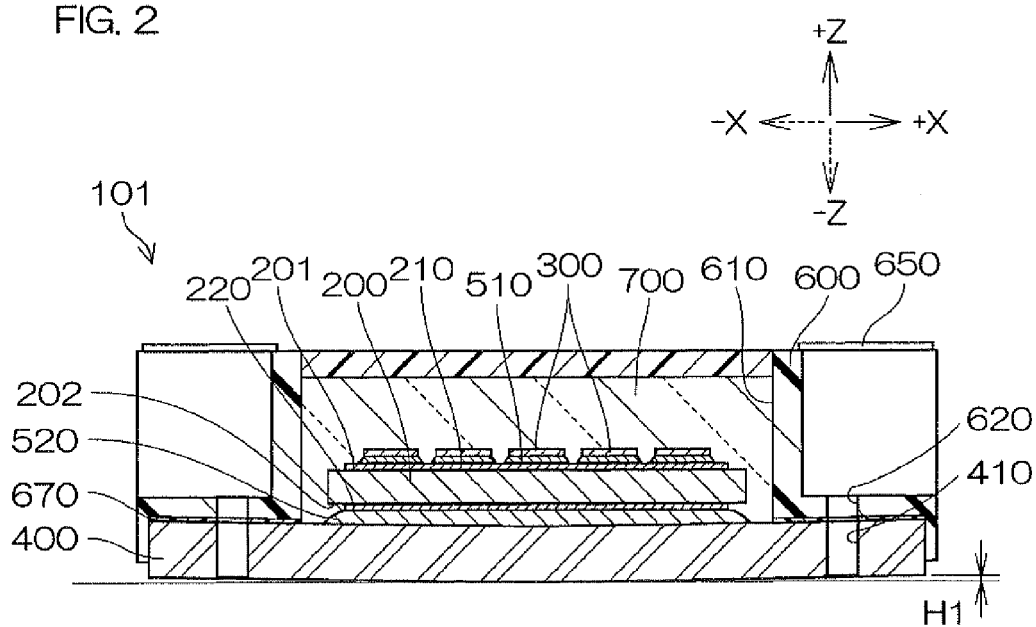
FIG. 2 is a sectional view along line II-II of FIG. 1.

FIG. 1 and FIG. 2 show a semiconductor module according to a first embodiment of the present invention.

The semiconductor module 101 is composed of an insulating substrate 200, a semiconductor device 300, a heat dissipation plate 400, and a case 600. Although the semiconductor module 101 is capable of realizing a high withstand voltage, a heavy electric current, and high heat dissipation ability that are suitable to be used in, for example, a high-side circuit or a low-side circuit of a power circuit that is used in trains or pieces of industrial equipment, the purpose of use of the semiconductor module 101 is not limited to this.

For descriptive convenience, in the following description, +X direction, −X direction, +Y direction, −Y direction, +Z direction, and −Z direction shown in FIG. 1 are used when necessary. +X direction and −X direction are two directions along the long side of the heat dissipation plate 400 formed in a rectangular shape when viewed planarly, and are generically referred to simply as "X direction" when necessary. +Y direction and −Y direction are two directions along the short side of the heat dissipation plate 400, and are generically referred to simply as "Y direction" when necessary. +Z direction and −Z direction are two directions along the normal of the heat dissipation plate 400, and are generically referred to simply as "Z direction" when necessary. When the heat dissipation plate 400 is placed on a horizontal plane, the X direction and the Y direction become two horizontal directions (first horizontal direction and second horizontal direction) along two horizontal straight lines (X axis and Y axis) perpendicular to each other, and the Z direction becomes a vertical direction (height direction) along a vertical straight line (Z axis).

The semiconductor module 101 is formed in a rectangular shape when viewed planarly, and has a length of about 122 mm in the length direction (X direction), a length of about 45 mm in the width direction (Y direction), and a length of about 20 mm in the thickness direction (Z direction).

The insulating substrate 200 is made of ceramic, and, in the present embodiment, is made of AlN (aluminum nitride). The insulating substrate 200 is formed in a rectangular shape when viewed planarly, and has a length of about 40 mm in the length direction (X direction), a length of about 30 mm in the width direction (Y direction), and a thickness of about 1 mm. It is recommended to set the length of a side of the insulating substrate 200 at about 20 mm to 40 mm when viewed planarly. The insulating substrate 200 has a first plane (+Z direction-side surface) 201 and a second plane (−Z direction-side surface) 202 that face mutually opposite sides. A first conductor layer 210 is formed on the first plane 201. The first conductor layer 210 is a sheet of Cu foil whose thickness is, for example, about 200 µm to 400 µm. A second conductor layer 220 is formed on the second plane 202. The second conductor layer 220 is a sheet of Cu foil whose thickness is, for example, about 200 µm to 400 µm.

The semiconductor device 300 is, for example, a SiC semiconductor device, and is formed of MOSFETs (Metal-Oxide-Semiconductor Field-Effect Transistors) that perform a switching function. In the present embodiment, the semiconductor module 101 includes a plurality of semiconductor devices 300. Each semiconductor device 300 is bonded to the first conductor layer 210 through a first solder layer 510. The thickness of the first solder layer 510 is, for example, about 60 µm to 140 µm.

The heat dissipation plate 400 serves to dissipate heat transmitted from the semiconductor device 300 through the insulating substrate 200 outwardly from the semiconductor module 101. The heat dissipation plate 400 is made of, for example, Cu, and has a length of about 107 mm in the length direction (X direction), a length of about 41 mm in the width direction (Y direction), and a thickness of about 3 to 5 mm. A pair of attaching through-holes 410 passing through the heat dissipation plate 400 in the thickness direction are formed in the widthwise middles, respectively, at both ends in the length direction of the heat dissipation plate 400. The interval between the two attaching through-holes 410 is, for example, about 81 mm.

As shown fully in FIG. 2, in a state in which the semiconductor module 101 has been completed, the heat dissipation plate 400 is deformed so as to become convex in a direction (−Z direction) that the second plane 202 faces when viewed from the Y direction. In other words, the heat dissipation plate 400 is deformed so that its lengthwise central part protrudes in the −Z direction when viewed from the Y direction. The distance H1 in the thickness direction of the surface (for example, −Z direction-side surface) on the same side as lengthwise both ends and the lengthwise center of the heat dissipation plate 400 is greater than 0 µm, and is 100 µm or less. Preferably, the distance H1 is 30 µm to 80 µm.

The heat dissipation plate 400 is bonded to the second conductor layer 220 through a second solder layer 520. The second solder layer 520 has a thickness of, for example, 180 µm to 270 µm.

The case 600 is made of a black resin, such as PPS resin (Poly Phenylene Sulfide Resin), and has a containing space 610 and a pair of attaching through-holes 620. The case 600 is bonded to the heat dissipation plate 400 with an adhesive 670 such as a silicone-based adhesive. The containing space 610 is a space formed in a rectangular parallelepiped shape, and contains the insulating substrate 200 and the semiconductor devices 300. The pair of attaching through-holes 620 are disposed apart from each other in the length direction (X direction), and positionally coincide with the pair of attaching through-holes 410 of the heat dissipation plate 400 with respect to the Z direction. As shown in FIG. 1, a plurality of electrodes 650 are built into the case 600. Four pairs of rectangular plate-like electrodes 650 that are disposed at the four corners of the case 600, respectively, are used for inputting (power-supply voltage, ground) and for outputting, for example. Three rod-like electrodes 650 disposed at a side part of the case 600 are used for inputting to perform a switching control operation.

As shown in FIG. 2, the containing space 610 is filled with a sealing resin 700. The sealing resin 700 is, for example, a transparent silicone resin. The +Z direction-side surface of the sealing resin 700 is covered with, for example, a resin that is the same in quality as the material of the case 600.

When the semiconductor module 101 is produced, a heat dissipation plate 400 that has been beforehand deformed in the same direction as a direction in which the heat dissipation plate 400 of FIG. 2 is deformed is used. A step of forming the first solder layer 510 and the second solder layer 520 and a step of bonding the case 600 are undergone, and, as a result, the heat dissipation plate 400 is repeatedly deformed in a slight degree, and finally has a shape shown in FIG. 2.

Figure 3:
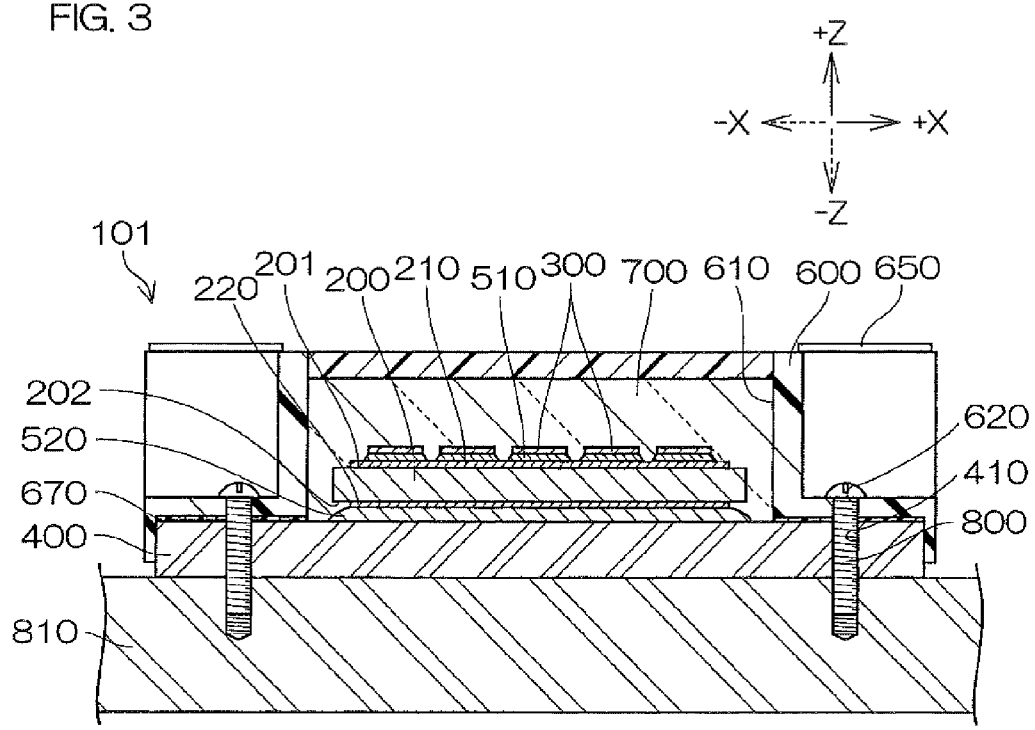
FIG. 3 is a sectional view of a main part of the semiconductor module shown in FIG. 1, showing a state of being used.

FIG. 3 shows a state in which the semiconductor module 101 is being used. When the semiconductor module 101 is used, this module 101 is attached to, for example, a stationary plate (object to which the module is attached) 810 disposed on a train or on a piece of industrial equipment. The stationary plate 810 has rigidity satisfactory enough to hold the semiconductor module 101, and is made of a material through which heat from the semiconductor module 101 can be efficiently transmitted.

The semiconductor module 101 is attached to the stationary plate 810 with two bolts 800. The two bolts 800 are inserted into the pair of attaching through-holes 620 and the pair of attaching through-holes 410, respectively, and are tightened into bolt holes formed in the stationary plate 810. A bending moment by which the lengthwise both ends of the heat dissipation plate 400 are moved to the side (the −Z direction side) of the stationary plate 810 acts on the heat dissipation plate 400 by means of the tightening force of the two bolts. As a result, in a state in which the semiconductor module 101 has been attached to the stationary plate 810, the heat dissipation plate 400 has a shape substantially horizontal along the stationary plate 810.

Next, the operation of the semiconductor module 101 will be described.

According to the present embodiment, in a state in which the semiconductor module 101 is being used, the heat dissipation plate 400 has a shape along the stationary plate 810 by means of the tightening force of the bolts 800 inserted in the attaching through-holes 410 as shown in FIG. 3. As a result, a gap is not easily made between the heat dissipation plate 400 and the stationary plate 810, and it is possible to heighten the degree of contact between the heat dissipation plate 400 and the stationary plate 810. As a result, heat generated from the semiconductor device 300 can be appropriately transmitted to the stationary plate 810. Distance H1 equivalent to the amount of bend of the heat dissipation plate 400 is greater than 0 μm and is smaller than 100 μm, and therefore the occurrence of a gap between the heat dissipation plate 400 and the stationary plate 810 can be made difficult during the use of the semiconductor module 101. Additionally, the tightening force of the bolts 800 makes it possible to prevent the heat dissipation plate 400 from being excessively deformed, and therefore it is possible to avoid damaging the inside of the semiconductor module 101. In order to make these effects even higher, it is preferable to set the distance H1 at 30 μm to 80 μm.

The semiconductor device 300 made of SiC is small in on-resistance, and is excellent in operating characteristics under high-temperature environment, and is suitable to lower a loss in the use of the semiconductor module 101. AlN that is the material of the insulating substrate 200 is higher in thermal conductivity, and is smaller in coefficient of linear expansion than other ceramics such as $Al_2O_3$. This makes it possible to promote the heat dissipation of the semiconductor module 101, and makes it possible to restrain the heat dissipation plate 400 etc., from being unintentionally deformed.

FIG. 4 is a table showing a comparison between characteristics of the semiconductor module 101 and characteristics of semiconductor modules of comparative examples.

The material of the insulating substrate of Comparative Example 1 is AlN that is the same as that of the semiconductor module 101. The material of the insulating substrate of Comparative Example 2 and that of Comparative Example 3 are $Al_2O_3$. The thermal conductivity of AlN is 170 W/m·K, and the thermal conductivity of $Al_2O_3$ is 20 W/m·K. The coefficient of linear expansion of AlN is $4.5 \times 10^{-6}/°$ C., and the coefficient of linear expansion of $Al_2O_3$ is $6.4 \times 10^{-6}/°$ C. The distance H1 equivalent to the amount of bend of the heat dissipation plate 400 (or, alternatively, a member equivalent to this heat dissipation plate) is +30 μm in the semiconductor module 101, is −100 μm in Comparative Example 1, is +30 μm in Comparative Example 2, and is +80 μm in Comparative Example 3. It should be noted that the sign of the distance H1 is + when the direction of the curve of the heat dissipation plate is that of FIG. 2, and is − when the direction of the curve of the heat dissipation plate is opposite to that of FIG. 2.

Thermal resistance showing whether the heat dissipation ability of the semiconductor module is good or bad was 0.15° C./W in the semiconductor module 101, whereas it was 0.21° C./W in Comparative Example 1, it was 0.21° C./W in Comparative Example 2, and it was 0.23° C./W in Comparative Example 3. This shows that the heat dissipation ability becomes higher in proportion to a decrease in thermal resistance.

In the semiconductor module 101, the material of the insulating substrate is AlN, and hence is smaller in thermal resistance than in Comparative Examples 2 and 3 in which the material of the insulating substrate is $Al_2O_3$. Additionally, in comparison with Comparative Example 1 in which the material of the insulating substrate is likewise AlN, the distance H1 is −100 μm in Comparative Example 1, whereas the distance H1 is +30 μm in the semiconductor module 101, and therefore the semiconductor module 101 is smaller in thermal resistance than in Comparative Example 1. Therefore, under the condition that an electric current of 100 A can be passed with respect to the semiconductor module 101, electric currents that can be passed with respect to Comparative Example 1, Comparative Example 2, and Comparative Example 3 are 92.8 A, 92.8 A, and 90.7 A, respectively, each of which is smaller than that of the semiconductor module 101. Additionally, in comparison with an area necessary to pass an electric current having a certain magnitude, an area of 2.3 is required in Comparative Example 1, an area of 1.8 is required in Comparative Example 2, and an area of 2.2 is required in Comparative Example 3 when an area with respect to the semiconductor module 101 is defined as 1.

Therefore, in the present embodiment, the semiconductor module 101 can pass an electric current greater than in Comparative Examples 1 to 3. Additionally, in the present embodiment, an area smaller than in Comparative Examples 1 to 3 suffices to pass an electric current having the same magnitude, and therefore it is possible to make the semiconductor module 101 of the present embodiment smaller in size.

FIG. 5 and FIG. 6 show a semiconductor module according to a second embodiment of the present invention. In FIG. 5 and FIG. 6, the same reference sign as in FIG. 1 to FIG. 3 is given to each component corresponding to each component shown in FIG. 1 to FIG. 3.

The semiconductor module 102 of the present embodiment includes two insulating substrates 200. The two insulating substrates 200 are arranged side by side in the length direction (X direction) of the heat dissipation plate 400 on the single heat dissipation plate 400. A plurality of semiconductor devices 300 that form, for example, a high-side circuit of a power circuit are mounted on one of the two insulating substrates 200, whereas a plurality of semiconductor devices 300 that form, for example, a low-side circuit of the power circuit are mounted on the other insulating substrate 200. The two insulating substrates 200 are attached to the heat dissipation plate 400. The size of the insulating substrate 200 and that of the heat dissipation plate 400 is the same as in the semiconductor module 101.

The heat dissipation plate 400 is deformed so as to become convex toward the −Z direction side as a whole when viewed from the Y direction. The heat dissipation plate 400 has a deformed portion 420 that is positioned at a lengthwise intermediate part and that is deformed so as to become convex in the −Z direction when viewed from the Y direction and two inverted deformed portions 430 that are positioned on both sides of the deformed portion 420 and that are deformed so as to become convex in the +Z direction.

The deformed portion 420 is positioned between the two insulating substrates 200 when viewed planarly, and is a most protrudent part of the heat dissipation plate 400 toward the −Z direction side. The two inverted deformed portions 430 overlap with the two insulating substrates 200, respectively, when viewed planarly. Each inverted deformed portion 430 partially has an invertedly deformed shape so as to become convex in a direction (+Z direction) that the first plane 201 of the insulating substrate 200 faces. The thus formed heat dissipation plate 400 takes the shape shown in FIG. 5 by undergoing a step of bonding the two insulating substrates 200 and a step of bonding the case 600 while using the heat dissipation plate 400 uniformly deformed in the same direction as the direction of the curve of the heat dissipation plate 400 of FIG. 2 as an initial shape. Distance H2 in the thickness direction of a surface (for example, −Z direction-side surface) on the same side as the lengthwise both ends and the deformed portion 420 of the heat dissipation plate 400 is greater than 0 μm, and is 100 μm or less. Preferably, the distance H2 is 30 μm to 80 μm.

This embodiment also makes it possible to appropriately transmit heat generated from the semiconductor device 300 to the stationary plate 810 in the same way as in the semiconductor module 101. Additionally, it is possible to obtain substantially the same characteristics as the characteristics of the semiconductor module 101 shown in FIG. 4. As a result, it is possible to allow the semiconductor module 102 to pass an electric current greater than in Comparative Examples 1 to 3, and it is possible to reduce an area necessary to pass an electric current having the same magnitude.

FIG. 7 to FIG. 10 show a semiconductor module according to a third embodiment of the present invention.

Figure 7:
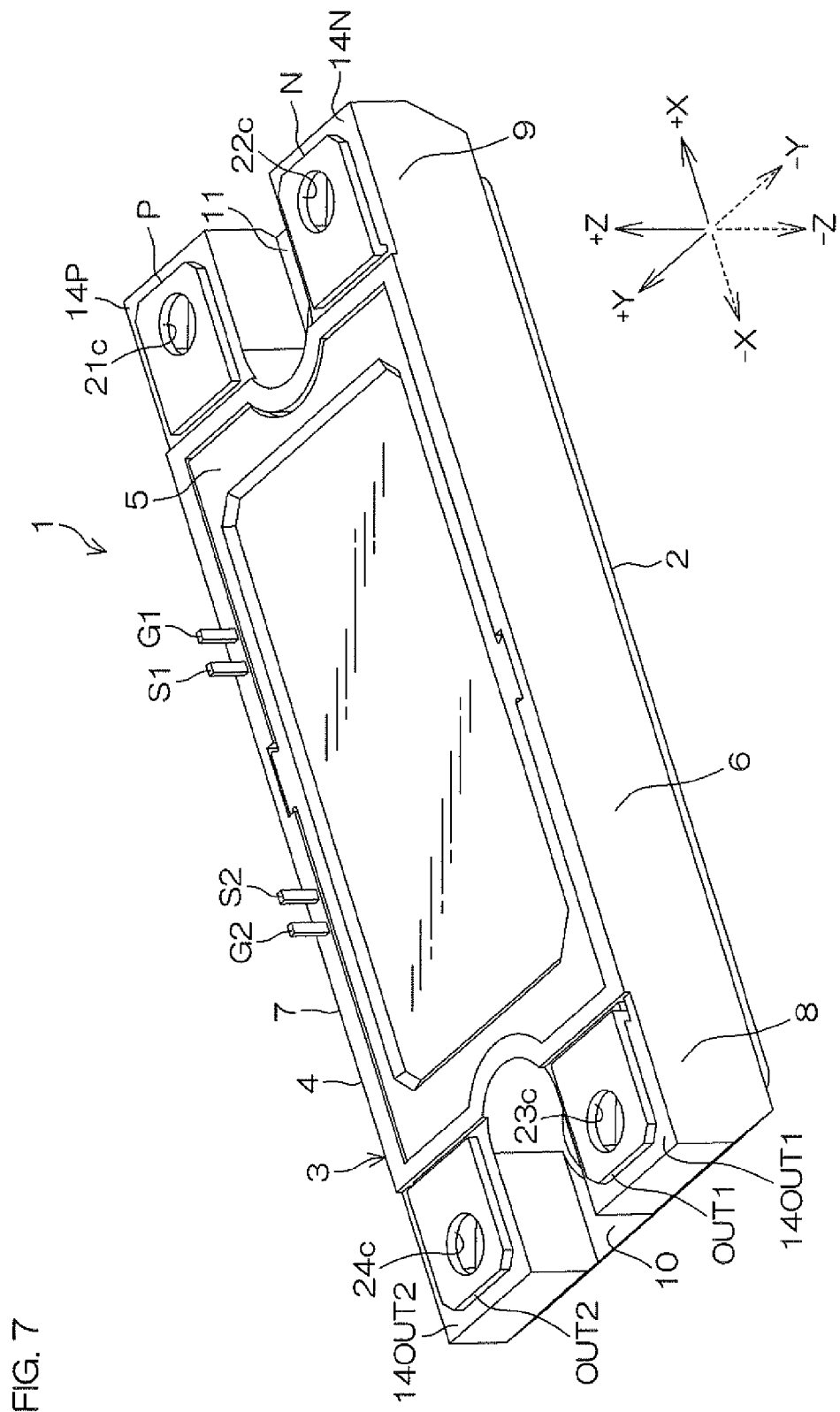
FIG. 7 is a perspective view showing an exterior of a semiconductor module according to a third embodiment of the present invention.

FIG. 7 is a perspective view showing an exterior of the semiconductor module according to the third embodiment of the present invention.

The semiconductor module 1 is composed of the heat dissipation plate 2, the case 3, and a plurality of terminals attached to the case 3. The terminals include a first power supply terminal (in this embodiment, a positive-side power supply terminal) P, a second power supply terminal (in this embodiment, a negative-side power supply terminal) N, a first output terminal OUT1, a second output terminal OUT2, a first source terminal S1, a first gate terminal G1, a second source terminal S2, and a second gate terminal G2. The first output terminal OUT1 and the second output terminal OUT2 will be referred to generically as the "output terminal OUT" if necessary.

For descriptive convenience, in the following description, +X direction, −X direction, +Y direction, −Y direction, +Z direction, and −Z direction shown in FIG. 7 are used when necessary. +X direction and −X direction are two directions along the long side of the heat dissipation plate 2 formed in a rectangular shape when viewed planarly, and are generically referred to simply as "X direction" when necessary. +Y direction and −Y direction are two directions along the short side of the heat dissipation plate 2, and are generically referred to simply as "Y direction" when necessary. +Z direction and −Z direction are two directions along the normal of the heat dissipation plate 2, and are generically referred to simply as "Z direction" when necessary. When the heat dissipation plate 2 is placed on a horizontal plane, the X direction and the Y direction become two horizontal directions (first horizontal direction and second horizontal direction) along two horizontal straight lines (X axis and Y axis) perpendicular to each other, and the Z direction becomes a vertical direction (height direction) along a vertical straight line (Z axis).

The heat dissipation plate 2 is a plate-like piece having a uniform thickness and having a rectangular shape when viewed planarly, and is made of a material having high thermal conductivity. More specifically, the heat dissipation plate 2 may be a copper sheet made of copper. This copper sheet may have its surface on which a nickel-plated layer is formed. A heat sink and other cooling means are attached to the −Z direction-side surface of the heat dissipation plate 2 when needed.

The case 3 is formed in a substantially rectangular parallelepiped shape, and is made of a resin material. Particularly, it is preferable to use a heat resistant resin such as PPS (polyphenylene sulfide). The case 3 is formed in a rectangle slightly greater than the heat dissipation plate 2 when viewed planarly, and is composed of a frame portion 4 fixed to one surface (+Z direction-side surface) of the heat dissipation plate 2 and a top plate 5 fixed to the frame portion 4. The top plate 5 closes one side (+Z direction side) of the frame portion 4, and faces one surface of the heat dissipation plate 2 that closes the other side (−Z direction side) of the frame portion 4. As a result, the circuit containing space is divided by the heat dissipation plate 2, the frame portion 4, and the top plate 5 in the case 3. In this embodiment, the frame portion 4 and the terminals are made by simultaneous molding.

The frame portion 4 is composed of a pair of side walls 6 and 7 and a pair of end walls 8 and 9 by which the pair of side walls 6 and 7 are connected together. Concave portions 10 and 11 opened outwardly are formed at intermediate parts in the Y direction of the +Z direction-side surfaces of the end walls 8 and 9, respectively. Walls on the side opposite to the outwardly opened parts of the concave portions 10 and 11 are deformed so as to protrude inwardly. Attaching through-holes 12 (see FIG. 8 and FIG. 9) passing through bottom walls of the concave portions 10 and 11 are formed in the bottom walls, respectively. Cylindrical metal members 20 (see FIG. 8 and FIG. 9) are fixedly fitted in the attaching through-holes 12, respectively. An attaching through-hole 13 (see FIG. 9) that leads to each attaching through-hole 12 is formed in the heat dissipation plate 2. With bolts (not shown) that are inserted into the attaching through-holes 12 and 13, respectively, the semiconductor module 1 is fixed at a predetermined fixing position of an object to which the module is attached. Cooling means, such as the aforementioned heat sink, may be attached by using these attaching through-holes 12 and 13.

Both side parts between which the concave portion 11 in the end wall 9 is interposed serve as terminal blocks 14P and 14N, respectively. Both side parts between which the concave portion 10 in the end wall 8 is interposed serve as terminal blocks 14OUT1 and 14OUT2, respectively. A nut (not shown) is buried in each of the terminal blocks 14P, 14N, 14OUT1, and 14OUT2.

A first power supply terminal P is disposed on a surface (+Z direction-side surface) of the terminal block 14P. A second power supply terminal N is disposed on a surface (+Z direction-side surface) of the terminal block 14N. A first output terminal OUT1 and a second output terminal OUT2 are disposed on surfaces (+Z direction-side surfaces) of the terminal blocks 14OUT1 and 14OUT2, respectively.

Each of the first power supply terminal P, the second power supply terminal N, the first output terminal OUT1, and the second output terminal OUT2 is produced by cutting a metallic plate (for example, a copper sheet plated with nickel) into a predetermined shape and bending the plate, and is electrically connected to circuits in the case 3. A forward end of the first power supply terminal P, a forward end of the second power supply terminal N, a forward end of the first output terminal OUT1, and a forward end of the second output terminal OUT2 are drawn out to the terminal blocks 14P, 14N, 14OUT1, and 14OUT2, respectively. The forward end of the first power supply terminal P, the forward end of the second power supply terminal N, the forward end of the first output terminal OUT1, and the forward end of the second output terminal OUT2 are formed so as to parallel the surfaces of the terminal blocks 14P, 14N, 14OUT1, and 14OUT2, respectively. Through-holes 21$c$, 22$c$, 23$c$, and 24$c$ are formed in the forward end of the first power supply terminal P, the forward end of the second power supply terminal N, the forward end of the first output terminal OUT1, and the forward end of the second output terminal OUT2, respectively. The terminals P, N, OUT1, and OUT2 can be connected to a bus bar provided on the side of an object to which the semiconductor module 1 is attached by using bolts that are inserted into the through-holes 21$c$, 22$c$, 23$c$, and 24$c$ and that are screwed into the aforementioned nuts, respectively.

A first source terminal S1, a first gate terminal G1, a second source terminal S2, and a second gate terminal G2 are attached to the side wall 7 that is one of the two side walls. Forward ends of these terminals S1, G1, S2, and G2 protrude from the surface (+Z direction-side surface) of the side wall 7 to the outside (+Z direction) of the case 3. The first source terminal S1 and the first gate terminal G1 are spaced in the X direction between the +X direction-side end and the lengthwise (X direction) center of the side wall 7. The second source terminal S2 and the second gate terminal G2 are spaced in the X direction between the –X direction-side end and the lengthwise (X direction) center of the side wall 7. Each of these terminals S1, G1, S2, and G2 is produced by bending a metal bar (for example, a rod-like piece of copper plated with nickel) formed in a cross-sectionally rectangular shape, and is electrically connected to circuits in the case 3.

Figure 8:
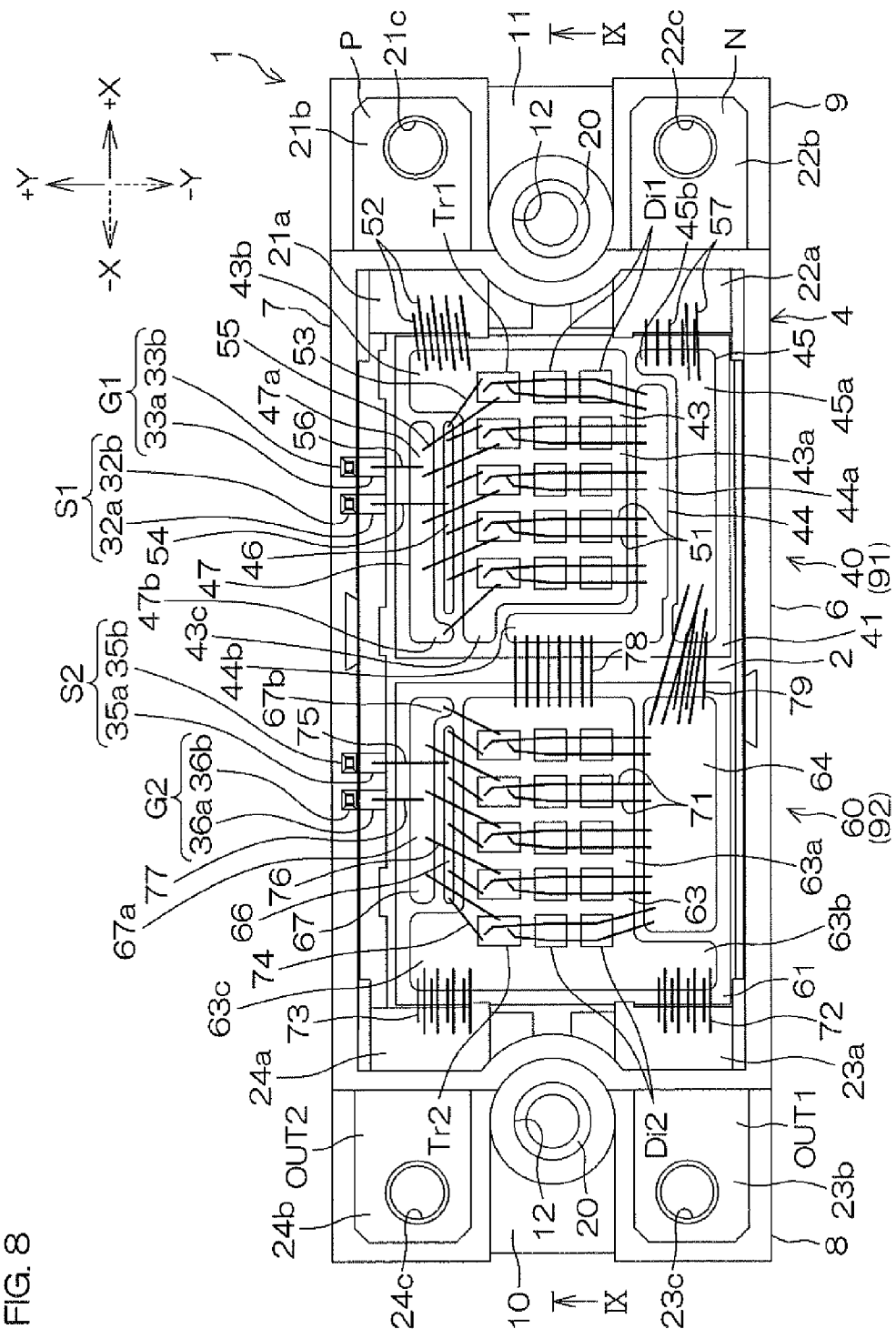
FIG. 8 is a plan view to describe an arrangement of semiconductor module circuits contained in a case.
Figure 9:
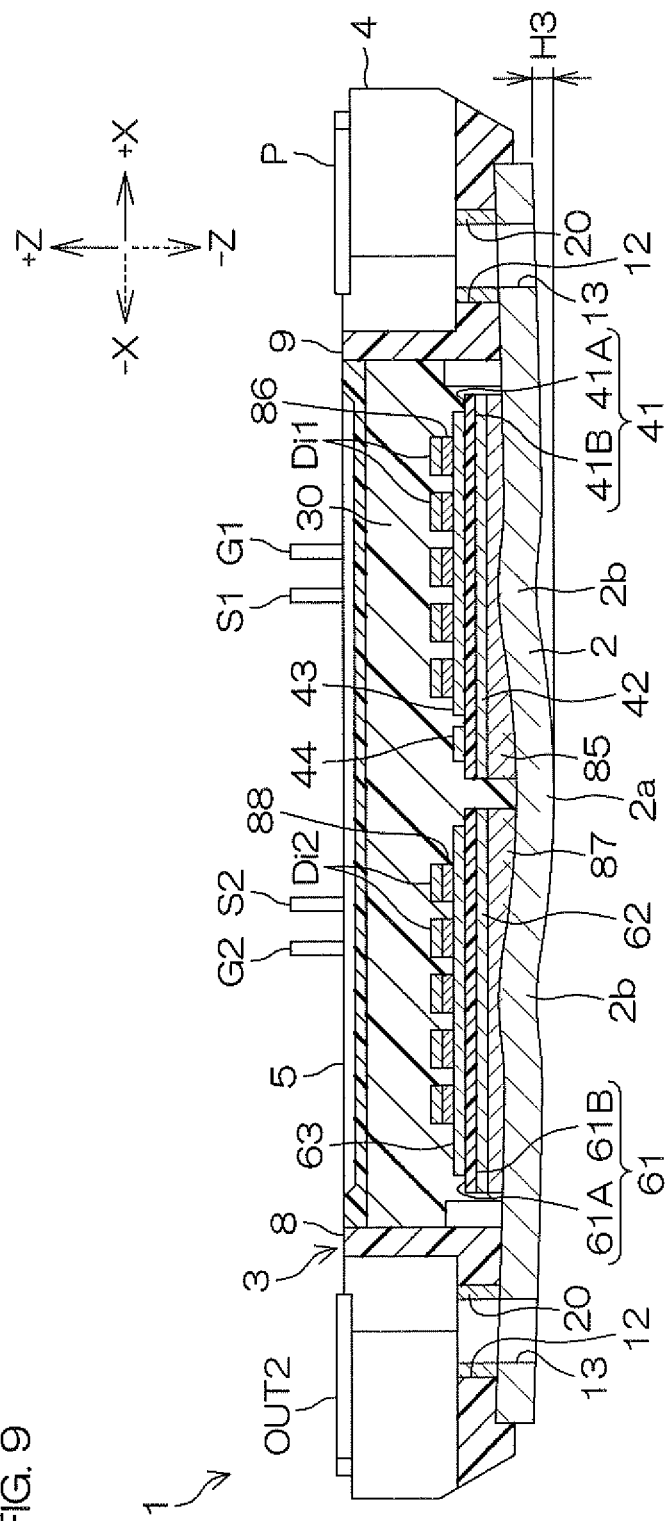
FIG. 9 is a pictorial sectional view along line IX-IX of FIG. 7.

FIG. 8 is a plan view to describe an arrangement of semiconductor module circuits contained in the case 3, showing a state in which the top plate 5 (see FIG. 7) has been detached. FIG. 9 is a pictorial sectional view along line IX-IX of FIG. 8, showing a state in which the top plate 5 has been attached.

The first power supply terminal P is in a crank-like shape when viewed from the Y direction, and is composed of an internal wiring connection portion 21$a$ disposed in the case 3, a rise portion joined to a +X direction-side edge of the internal wiring connection portion 21$a$, and an external wiring connection portion (forward end) 21$b$ joined to a +Z direction-side edge of the rise portion. The +X direction-side edge of the internal wiring connection portion 21$a$ and the rise portion of the first power supply terminal P are embedded in the end wall 9. Likewise, the second power supply terminal N is in a crank-like shape when viewed from the Y direction, and is composed of an internal wiring connection portion 22$a$ disposed in the case 3, a rise portion joined to a +X direction-side edge of the internal wiring connection portion 22$a$, and an external wiring connection portion (forward end) 22$b$ joined to a +Z direction-side edge of the rise portion. The +X direction-side edge of the internal wiring connection portion 22$a$ and the rise portion of the second power supply terminal N are embedded in the end wall 9.

The first output terminal OUT1 and the second output terminal OUT2 are each in a crank-like shape when viewed from the Y direction, and are composed of internal wiring connection portions 23$a$ and 24$a$ disposed in the case 3, rise portions joined to the –X direction-side edges of the internal wiring connection portions 23$a$ and 24$a$, and external wiring connection portions (forward ends) 23$b$ and 24$b$ joined to the +Z direction-side edges of the rise portions, respectively. The –X direction-side edges of the internal wiring connection portions 23$a$ and 24$a$ and the rise portions of the output terminals OUT1 and OUT2 are embedded in the end wall 8.

The first source terminal S1 is formed substantially in the shape of the capital letter L when viewed from the X direction, and is composed of a first part 32$a$ that extends in the Y direction and that is disposed in the case 3 and a second part 32$b$ that extends in the +Z direction from the +Y direction-side end of the first part 32$a$. Most of the second part 32$b$ and the +Y direction-side end of the first part 32$a$ are embedded in the side wall 7. The forward end of the second part 32$b$ protrudes in the +Z direction from the surface of the side wall 7.

The first gate terminal G1 is formed substantially in the shape of the capital letter L when viewed from the X direction, and is composed of a first part 33$a$ that extends in the Y direction and that is disposed in the case 3 and a second part 33$b$ that extends in the +Z direction from the +Y direction-side end of the first part 33$a$. Most of the second part 33$b$ and the +Y direction-side end of the first part 33$a$ are embedded in the side wall 7. The forward end of the second part 33$b$ protrudes in the +Z direction from the surface of the side wall 7.

The second source terminal S2 is formed substantially in the shape of the capital letter L when viewed from the X direction, and is composed of a first part 35$a$ that extends in the Y direction and that is disposed in the case 3 and a second part 35$b$ that extends in the +Z direction from the +Y direction-side end of the first part 35$a$. Most of the second part 35$b$ and the +Y direction-side end of the first part 35$a$ are embedded in the side wall 7. The forward end of the second part 35$b$ protrudes in the +Z direction from the surface of the side wall 7.

The second gate terminal G2 is formed substantially in the shape of the capital letter L when viewed from the X direction, and is composed of a first part 36$a$ that extends in the Y direction and that is disposed in the case 3 and a second part 36$b$ that extends in the +Z direction from the +Y direction-side end of the first part 36$a$. Most of the second part 36$b$ and the +Y direction-side end of the first part 36$a$ are embedded in the side wall 7. The forward end of the second part 36$b$ protrudes in the +Z direction from the surface of the side wall 7.

A first assembly 40 that forms an upper arm (high side) circuit 91 and a second assembly 60 that forms a lower arm (low side) circuit 92 are arranged side by side in the X direction in an area surrounded by the frame portion 4 in the surface (+Z direction-side surface) of the heat dissipation plate 2.

The first assembly 40 includes a first insulating substrate 41, a plurality of first switching elements Tr1, and a plurality of first diode elements Di1.

The first insulating substrate 41 is formed substantially in a rectangle when viewed planarly, and is bonded to the surface of the heat dissipation plate 2 in a posture in which the four sides of the first insulating substrate 41 are parallel to the four sides of the heat dissipation plate 2, respectively. A first bonding conductor layer (second conductor layer) 42 is formed on a surface 41B on the heat-dissipation-plate side (2) of the first insulating substrate 41 (−Z direction-side surface (second plane)). This first bonding conductor layer 42 is bonded to the heat dissipation plate 2 through a solder layer 85. A first element bonding conductor layer (first conductor layer) 43 for bonding elements, a first source conductor layer (third conductor layer) 44 for sources, an N terminal conductor layer 45 for N terminals, a first source terminal conductor layer 46 for source terminals, and a first gate terminal conductor layer 47 for gate terminals are formed on a surface (+Z direction-side surface (first plane)) 41A on the side opposite to the heat dissipation plate 2 of the first insulating substrate 41.

In the present embodiment, the first insulating substrate 41 is made of AlN. For example, a substrate (DBC: Direct Bonding Copper) in which a copper foil is bonded directly to both sides of ceramics can be used as the first insulating substrate 41. If a DBC substrate is used as the first insulating substrate 41, each of the conductor layers 42 to 47 can be made of its copper foil.

The first element bonding conductor layer 43 has a first part (element bonding area) 43a that is formed in a rectangular shape longer in the X direction when viewed planarly and with which an intermediate part in the Y direction in the surface of the first insulating substrate 41 is covered, a second part 43b that protrudes in the +Y direction from the +X direction-side end of the first part 43a, and a third part 43c that protrudes in the −X direction from the lateral part on the +Y direction side of the first part 43a.

The N terminal conductor layer 45 has a first part 45a that is formed in a rectangular shape longer in the X direction when viewed planarly and a second part 45b that protrudes in the +Y direction from the +X direction-side end of the first part 45a. The N terminal conductor layer 45 is disposed between a side on the −Y direction side of the first part 43a of the first element bonding conductor layer 43 and a side on the −Y direction side of the first insulating substrate 41.

The first source conductor layer 44 consists of a first part (element connecting area) 44a that is formed in a rectangular shape longer in the X direction when viewed planarly and a second part (element bonding area) 44b that extends in the +Y direction from the −X direction-side end of the first part 44a and that is formed in a rectangular shape longer in the Y direction when viewed planarly. The first part 44a is disposed between a side on the −Y direction side of the first part 43a of the first element bonding conductor layer 43 and the first part 45a of the N terminal conductor layer 45. The second part 44b is disposed between a side on the −X direction side of the first part 43a of the first element bonding conductor layer 43 and a side on the −X direction side of the first insulating substrate 41. The first part 44a is disposed along a long side on the −Y direction side of the first part 43a of the first element bonding conductor layer 43, and has a long side that faces the aforementioned long side of the first part 43a of the first element bonding conductor layer 43.

The first gate terminal conductor layer 47 has a first part 47a that is formed in a rectangular shape longer in the X direction when viewed planarly and a second part 47b that protrudes in the −Y direction from the −X direction-side end of the first part 47a. The first gate terminal conductor layer 47 is disposed between a side on the +Y direction side of the first part 43a and the third part 43c of the first element bonding conductor layer 43 and a side on the +Y direction side of the first insulating substrate 41. The first source terminal conductor layer 46 is formed in a rectangular shape longer in the X direction when viewed planarly, and is disposed between a side on the +Y direction side of the first part 43a of the first element bonding conductor layer 43 and the first part 47a of the first gate terminal conductor layer 47.

Drain electrodes of the first switching elements Tr1 are bonded to the surface of the first part 43a of the first element bonding conductor layer 43 through a solder layer (not shown), and cathode electrodes of the first diode elements Di1 are bonded thereto through a solder layer 86. Each first switching element Tr1 has a source electrode and a gate electrode on a surface opposite to the surface bonded to the first element bonding conductor layer 43. Each first diode element Di1 has an anode electrode on a surface opposite to the surface bonded to the first element bonding conductor layer 43.

Five first diode elements Di1 are spaced at intervals side by side in the X direction near the lengthwise center in the Y direction of the surface of the first part 43a of the first element bonding conductor layer 43. Additionally, five first switching elements Tr1 are spaced at intervals side by side in the X direction between a side on the +Y direction side of the first part 43a of the first element bonding conductor layer 43 and the five first diode elements Di1. Additionally, still other five first diode elements Di1 are spaced at intervals side by side in the X direction between a side on the −Y direction side of the first part 43a of the first element bonding conductor layer 43 and the five first diode elements Di1.

If needed, five first diode elements Di1 disposed on the side near the five first switching elements Tr1 will be referred to as "five first diode elements Di1 on the +Y direction side," and five first diode elements Di1 disposed on the side far from the five first switching elements Tr1 will be referred to as "five first diode elements Di1 on the −Y direction side." The five first switching elements Tr1 positionally coincide with the five first diode elements Di1 on the +Y direction side with respect to the Y direction. Additionally, the five first diode elements Di1 on the +Y direction side positionally coincide with the five first diode elements Di1 on the −Y direction side with respect to the Y direction.

A pair of first switching elements Tr1 on both sides among the five first switching elements Tr1, a pair of first diode elements Di1 on both sides among the five first diode elements Di1 on the +Y direction side, and a pair of first diode elements Di1 on both sides among the five first diode elements Di1 on the −Y direction side face both ends of a long side on the +Y direction side of the first part 44a of the first source conductor layer 44, respectively.

The first switching element Tr1 and the two first diode elements Di1 positionally coinciding with each other in the Y direction are connected to the first part 44a of the first source conductor layer 44 by means of two wires 51 extending substantially in the Y direction when viewed planarly. More specifically, one end of each wire 51 is bonded to the source electrode of the first switching element Tr1, and the other end of each wire 51 is bonded to the surface of the first part 44a of the first source conductor layer 44, and an intermediate part of each wire 51 is bonded to the anode electrodes of the two first diode elements Di1. In other words, the components are connected together by stitch bonding in which either one of the source electrode of the first switching element Tr1 and the first source conductor layer 44 is used as a start point, and the other one is used as an end point, and the anode electrodes of the two first diode elements Di1 are used as two relay points. In the present embodiment, the source electrode of the first switching element Tr1 is used as a start point, and the first source conductor layer 44 is used as an end point.

The arrangement width as the whole of the plurality of wires 51 (i.e., width in the X direction, which is hereinafter referred to as the "entire arrangement width") covers substantially the entire width of the long side of the first part 44a of the first source conductor layer 44 (i.e., long side on the +Y direction side). Therefore, inductance caused by the wires 51 can be reduced because the entire arrangement width of the wires 51 can be enlarged. As a result, the self-inductance of the semiconductor module 1 can be reduced.

The source electrode of each first switching element Tr1 is connected also to the first source terminal conductor layer 46 by means of a wire 53. The first source terminal conductor layer 46 is connected to the first part 32a of the first source terminal S1 by means of a wire 54. The gate electrode of each first switching element Tr1 is connected to the first gate terminal conductor layer 47 by means of a wire 55. The first gate terminal conductor layer 47 is connected to the first part 33a of the first gate terminal G1 by means of a wire 56.

The first element bonding conductor layer 43 is connected to the internal wiring connection portion 21a of the first power supply terminal P by means of a plurality of wires 52 extending substantially in the X direction when viewed planarly. More specifically, one end of each wire 52 is bonded to the second part 43b and to a surface therenear in the first element bonding conductor layer 43, and an opposite end of each wire 52 is bonded to the surface of the internal wiring connection portion 21a of the first power supply terminal P. These wires 52 are disposed in parallel with each other when viewed planarly. Additionally, the adjoining wires 52 differ from each other in length. Corresponding ends of the adjoining wires 52 are disposed at positions mutually deviated in the length direction of those wires 52 when viewed from the width direction of the whole of the wires 52. As a result, bonded parts of the adjoining wires 52 to the first element bonding conductor layer 43 or to the first power supply terminal P do not easily overlap with each other, and therefore the interval between the adjoining wires 52 can be narrowed, and it becomes easy to make an inspection (inspection by use of images) of the bonded parts of the wires 52.

The N terminal conductor layer 45 is connected to the internal wiring connection portion 22a of the second power supply terminal N by means of a plurality of wires 57. More specifically, one end of each wire 57 is bonded to the +X direction-side end of the surface of the N terminal conductor layer 45, and an opposite end of each wire 57 is bonded to the surface of the internal wiring connection portion 22a of the second power supply terminal N.

The second assembly 60 includes a second insulating substrate 61, a plurality of second switching elements Tr2, and a plurality of second diode elements Di2.

The second insulating substrate 61 is formed substantially in a rectangle when viewed planarly, and is bonded to the surface of the heat dissipation plate 2 in a posture in which the four sides of the second insulating substrate 61 are parallel to the four sides of the heat dissipation plate 2, respectively. A second bonding conductor layer (second conductor layer) 62 is formed on a surface (−Z direction-side surface (second plane)) 61B on the heat-dissipation-plate side (2) of the second insulating substrate 61. This second bonding conductor layer 62 is bonded to the heat dissipation plate 2 through a solder layer 87. A second element bonding conductor layer (first conductor layer) 63 for bonding elements, a second source conductor layer (third conductor layer) 64 for sources, a second source terminal conductor layer 66 for source terminals, and a second gate terminal conductor layer 67 for gate terminals are formed on a surface (+Z direction-side surface (first plane)) 61A on the side opposite to the heat dissipation plate 2 of the second insulating substrate 61.

In the present embodiment, the second insulating substrate 61 is made of AlN. For example, a substrate (DBC) in which a copper foil is bonded directly to both sides of ceramics can be used as the second insulating substrate 61. If a DBC substrate is used as the second insulating substrate 61, each of the conductor layers 62 to 64, 66, and 67 can be made of its copper foil.

The second element bonding conductor layer 63 has a first part (element bonding area) 63a that is formed in a rectangular shape longer in the X direction when viewed planarly and with which an intermediate part in the Y direction in the surface of the second insulating substrate 61 is covered, a second part 63b that extends toward the −Y direction side from the −X direction-side end of the first part 63a, and a third part 63c that extends toward the +Y direction side from the −X direction-side end of the first part 63a.

The second source conductor layer 64 is formed in a rectangular shape longer in the X direction when viewed planarly, and is disposed between a side on the −Y direction side of the first part 63a of the second element bonding conductor layer 63 and a side on the −Y direction side of the second insulating substrate 61. In other words, the second source conductor layer 64 is disposed along a long side on the −Y direction side of the first part 63a of the second element bonding conductor layer 63, and has a long side that faces the aforementioned long side of the first part 63a of the second element bonding conductor layer 63.

The second gate terminal conductor layer 67 has a first part 67a that is formed in a rectangular shape longer in the X direction when viewed planarly and a second part 67b that protrudes toward the −Y direction side from the +X direction-side end of the first part 67a. The second gate terminal conductor layer 67 is disposed between a side on the +Y direction side of the first part 63a of the second element bonding conductor layer 63 and a side on the +Y direction side of the second insulating substrate 61. The second source terminal conductor layer 66 is formed in a rectangular shape longer in the X direction when viewed planarly, and is disposed between a side on the +Y direction side of the first part 63a of the second element bonding conductor layer 63 and the first part 67a of the second gate terminal conductor layer 67.

Drain electrodes of the second switching elements Tr2 are bonded to the surface of the first part 63a of the second element bonding conductor layer 63 through a solder layer (not shown), and cathode electrodes of the second diode elements Di2 are bonded thereto through a solder layer 88. Each second switching element Tr2 has a source electrode and a gate electrode on a surface opposite to the surface bonded to the second element bonding conductor layer 63. Each second diode element Di2 has an anode electrode on a surface opposite to the surface bonded to the second element bonding conductor layer 63.

Five second diode elements Di2 are spaced at intervals side by side in the X direction near the lengthwise center in the Y direction of the surface of the first part 63a of the second element bonding conductor layer 63. Additionally, five second switching elements Tr2 are spaced at intervals side by side in the X direction between a side on the +Y direction side of the first part 63a of the second element bonding conductor layer 63 and the five second diode elements Di2. Additionally, still other five second diode elements Di2 are spaced at intervals side by side in the X direction between a side on the −Y direction side of the first part 63a of the second element bonding conductor layer 63 and the five second diode elements Di2.

If needed, five second diode elements Di2 disposed on the side near the five second switching elements Tr2 will be referred to as "five second diode elements Di2 on the +Y direction side," and five second diode elements Di2 disposed on the side far from the five second switching elements Tr2 will be referred to as "five second diode elements Di2 on the −Y direction side."

The five second switching elements Tr2 positionally coincide with the five second diode elements Di2 on the +Y direction side with respect to the Y direction. Additionally, the five second diode elements Di2 on the +Y direction side positionally coincide with the five second diode elements Di2 on the −Y direction side with respect to the Y direction.

A pair of second switching elements Tr2 on both sides among the five second switching elements Tr2, a pair of second diode elements Di2 on both sides among the five second diode elements Di2 on the +Y direction side, and a pair of second diode elements Di2 on both sides among the five second diode elements Di2 on the −Y direction side face both ends of a long side on the +Y direction side of the first part 64a of the second source conductor layer 64, respectively.

The second switching element Tr2 and the two second diode elements Di2 positionally coinciding with each other in the Y direction are connected to the second source conductor layer 64 by means of two wires 71 extending substantially in the Y direction when viewed planarly. More specifically, one end of each wire 71 is bonded to the source electrode of the second switching element Tr2, and the other end of each wire 71 is bonded to the +Y direction-side edge of the surface of the second source conductor layer 64, and an intermediate part of each wire 71 is bonded to the anode electrodes of the two second diode elements Di2. In other words, the components are connected together by stitch bonding in which either one of the source electrode of the second switching element Tr2 and the second source conductor layer 64 is used as a start point, and the other one is used as an end point, and the anode electrodes of the two second diode elements Di2 are used as two relay points. In the present embodiment, the source electrode of the second switching element Tr2 is used as a start point, and the second source conductor layer 64 is used as an end point.

The arrangement width as the whole of the plurality of wires 71 (i.e., width in the X direction, which is hereinafter referred to as the "entire arrangement width") covers substantially the entire width of the long side on the +Y direction side of the second source conductor layer 64. Therefore, inductance caused by the wires 71 can be reduced because the entire arrangement width of the wires 71 can be enlarged. As a result, the self-inductance of the semiconductor module 1 can be reduced.

The source electrode of each second switching element Tr2 is connected also to the second source terminal conductor layer 66 by means of a wire 74. The second source terminal conductor layer 66 is connected to the first part 35a of the second source terminal S2 by means of a wire 75. The gate electrode of each second switching element Tr2 is connected to the second gate terminal conductor layer 67 by means of a wire 76. The second gate terminal conductor layer 67 is connected to the first part 36a of the second gate terminal G2 by means of a wire 77.

The second element bonding conductor layer 63 is connected to the internal wiring connection portion 23a of the first output terminal OUT1 by means of a plurality of wires 72 extending in the X direction when viewed planarly. More specifically, one end of each wire 72 is bonded to the surface of the second part 63b of the second element bonding conductor layer 63, and an opposite end of each wire 72 is bonded to the surface of the internal wiring connection portion 23a of the first output terminal OUT1. These wires 72 are disposed in parallel with each other when viewed planarly. Additionally, the adjoining wires 72 differ from each other in length. Corresponding ends of the adjoining wires 72 are disposed at positions mutually deviated in the length direction of those wires 72 when viewed from the width direction (Y direction) of the whole of the wires 72. As a result, bonded parts of the adjoining wires 72 to the second element bonding conductor layer 63 or to the first output terminal OUT1 do not easily overlap with each other, and therefore the interval between the adjoining wires 72 can be narrowed, and it becomes easy to make an inspection (inspection by use of images) of the bonded parts of the wires 72.

Additionally, the second element bonding conductor layer 63 is connected to the internal wiring connection portion 24a of the second output terminal OUT2 by means of a plurality of wires 73 extending in the X direction when viewed planarly. More specifically, one end of each wire 73 is bonded to the surface of the third part 63c of the second element bonding conductor layer 63, and an opposite end of each wire 73 is bonded to the surface of the internal wiring connection portion 24a of the second output terminal OUT2. These wires 73 are disposed in parallel with each other when viewed planarly. Additionally, the adjoining wires 73 differ from each other in length. Corresponding ends of the adjoining wires 73 are disposed at positions mutually deviated in the length direction of those wires 73 when viewed from the width direction (Y direction) of the whole of the wires 73. As a result, bonded parts of the adjoining wires 73 to the second element bonding conductor layer 63 or to the second output terminal OUT2 do not easily overlap with each other, and therefore the interval between the adjoining wires 73 can be narrowed, and it becomes easy to make an inspection (inspection by use of images) of the bonded parts of the wires 73.

The second element bonding conductor layer 63 of the second assembly 60 is connected to the first source conductor layer 44 of the first assembly 40 by means of a plurality of wires 78 extending in the X direction. More specifically, one end of each wire 78 is bonded to the +X direction-side end of the surface of the first part 63a of the second element bonding conductor layer 63, and an opposite end of each wire 78 is bonded to the surface of the second part 44b of the first source conductor layer 44.

Additionally, the second source conductor layer 64 of the second assembly 60 is connected to the N terminal conductor layer 45 of the first assembly 40 by means of a plurality of wires 79 extending substantially in the X direction. More specifically, one end of each wire 79 is bonded to the +X direction-side end of the surface of the second source conductor layer 64, and an opposite end of each wire 79 is bonded to the −X direction-side end of the surface of the N terminal conductor layer 45. Each of the wires 51 to 57 and 71 to 79 is made of a metallic wire such as aluminum.

As shown in FIG. 9, the heat dissipation plate 2 is deformed so as to become convex toward the −Z direction side as a whole when viewed from the Y direction in the same way as in the second embodiment (see FIG. 5). The heat dissipation plate 2 has a deformed portion 2a that is positioned at a lengthwise intermediate part and that is deformed so as to become convex in the −Z direction when viewed from the Y direction and two inverted deformed portions 2b that are positioned on both sides of the deformed portion 2a and that are deformed so as to become convex in the +Z direction. The deformed portion 2a is positioned between the two insulating substrates 41 and 61 when viewed planarly, and is a most protrudent part of the heat dissipation plate 2 toward the −Z direction side. The two inverted deformed portions 2b overlap with the two insulating substrates 41 and 61, respectively, when viewed planarly. Distance H3 in the thickness direction of a surface (for example, −Z direction-side surface) on the same side as the lengthwise both ends and the deformed portion 2a of the heat dissipation plate 2 is greater than 0 μm, and is 100 μm or less. Preferably, the distance H3 is 30 μm to 80 μm.

As shown in FIG. 9, the circuit containing space in the case 3 is filled with a sealing resin 30. The sealing resin 30 is, for example, a transparent silicone resin.

Figure 10:
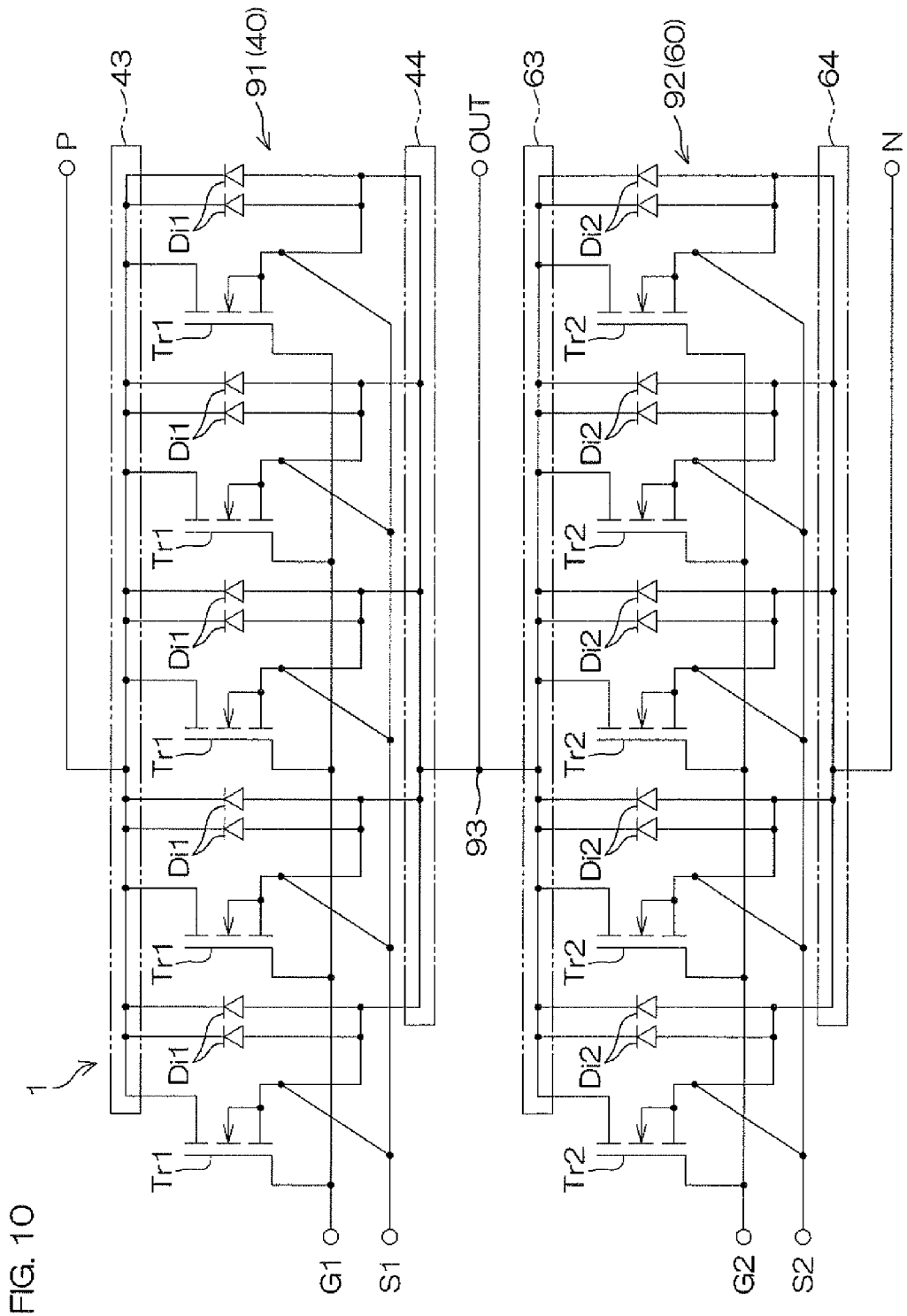
FIG. 10 is an electric circuit diagram to describe an electric arrangement of the semiconductor module shown in FIG. 8.

FIG. 10 is an electric circuit diagram to describe an electric arrangement of the semiconductor module 1. In FIG. 10, the two output terminals OUT1 and OUT2 are shown as a single output terminal OUT.

A plurality of first switching elements Tr1 and a plurality of first diode elements Di1 provided in the first assembly 40 are connected together in parallel between the first element bonding conductor layer 43 and the first source conductor layer 44, and form an upper arm circuit (high-side circuit) 91. Likewise, a plurality of second switching elements Tr2 and a plurality of second diode elements Di2 provided in the second assembly 60 are connected together in parallel between the second element bonding conductor layer 63 and the first source conductor layer 64, and form a lower arm circuit (low-side circuit) 92.

The upper arm circuit 91 and the lower arm circuit 92 are connected together in series between the first power supply terminal P and the second power supply terminal N, and the output terminal OUT is connected to a connection point 93 between the upper arm circuit 91 and the lower arm circuit 92. A half bridge circuit is arranged in this way. This half bridge circuit can be used as a single-phase bridge circuit. A multiphase (e.g., three-phase) bridge circuit can be arranged by connecting a plurality of (e.g., three) half bridge circuits (semiconductor modules 1) to a power source in parallel.

In the present embodiment, the first switching element Tr1 and the second switching element Tr2 are arranged with N channel-type DMOS (Double-Diffused Metal Oxide Semiconductor) field-effect transistors. Particularly in this embodiment, the first switching element Tr1 and the second switching element Tr2 are high-speed switching type MOSFETs (SiC-DMOS) arranged with SiC semiconductor devices.

Additionally, in the present embodiment, the first diode element Di1 and the second diode element Di2 are arranged with Schottky barrier diodes (SBDs). Particularly in this embodiment, the second diode element Di2 is arranged with a SiC semiconductor device (SiC-SBD).

The two first diode elements Di1 are respectively connected to each first switching element Tr1 in parallel. The drain of each first switching element Tr1 and the cathode of each first diode element Di1 are connected to the first element bonding conductor layer 43.

Sources of the plurality of first switching elements Tr1 are connected to the anode of one of the corresponding two first diode elements Di1, and the anode of this one of the first diode elements Di1 is connected to the anode of the other first diode element Di1. The anode of the other first diode element Di1 is connected to the first source conductor layer 44. Gates of the plurality of first switching elements Tr1 are connected to the first gate terminal G1. The sources of the first switching elements Tr1 are connected also to the first source terminal S1. An electric current flowing from the output terminal OUT to the first power supply terminal P passes through the first diode element Di1 in preference to the first switching element Tr1, and therefore the first switching element Tr1 is prevented from being broken by a reverse current.

On the other hand, two second diode elements Di2 are connected to each second switching element Tr2 in parallel. The drain of each second switching element Tr2 and the cathode of each second diode element Di2 are connected to the second element bonding conductor layer 63. Sources of the plurality of second switching elements Tr2 are connected to the anode of one of the corresponding two second diode elements Di2, and the anode of this one of the two second diode elements Di2 is connected to the anode of the other second diode element Di2. The anode of the other second diode element Di2 is connected to the second source conductor layer 64. Gates of the plurality of second switching elements Tr2 are connected to the second gate terminal G2. The sources of the second switching elements Tr2 are connected also to the second source terminal S2. An electric current flowing from the second power supply terminal N to the output terminal OUT passes through the second diode element Di2 in preference to the second switching element Tr2, and therefore the second switching element Tr2 is prevented from being broken by a reverse current.

When the semiconductor module 1 is used for, for example, an H bridge circuit, two semiconductor modules 1 are connected to the power source in parallel. An inductive load, such as that of a motor, is connected between output terminals OUT of the two semiconductor modules 1. One of the two semiconductor modules 1 is referred to as a first semiconductor module, whereas the other semiconductor module 1 is referred to as a second semiconductor module.

In the thus arranged H bridge circuit, for example, the first switching element Tr1 of the first semiconductor module 1 and the second switching element Tr2 of the second semiconductor module 1 are allowed to be in a conductive state. Thereafter, these switching elements Tr1 and Tr2 are allowed to reach a cutoff state. The second switching element Tr2 of the first semiconductor module 1 and the first switching element Tr1 of the second semiconductor module 1 are allowed to be in a conductive state. Thereafter, these switching elements Tr1 and Tr2 are allowed to reach a cutoff state. The first switching element Tr1 of the first semiconductor module 1 and the second switching element Tr2 of the second semiconductor module 1 are allowed to be in a conductive state. This operation is repeatedly performed, and, as a result, the load is alternately driven.

Referring to FIG. 8, in the first semiconductor module 1, an electric current flows from the first power supply terminal P to the output terminal OUT through the first switching element Tr1, and flows from the output terminal OUT to the second power supply terminal N through the second switching element Tr2 during a transition period during which the first switching element Tr1 in the first semiconductor module 1 is switched from a conductive state to a cutoff state and during which the second switching element Tr2 is switched from a cutoff state to a conductive state. Likewise, in the first semiconductor module 1, an electric current flows from the first power supply terminal P to the output terminal OUT through the first switching element Tr1, and flows from the output terminal OUT to the second power supply terminal N through the second switching element Tr2 during a transition period during which the second switching element Tr2 in the first semiconductor module 1 is switched from a conductive state to a cutoff state and during which the first switching element Tr1 is switched from a cutoff state to a conductive state.

During this transition period, an electric current flows substantially in the −X direction through a current path where an electric current flows from the first power supply terminal P of the first semiconductor module 1 to the output terminal OUT. On the other hand, an electric current flows substantially in the +X direction through a current path where an electric current flows from the output terminal OUT to the second power supply terminal N. Therefore, the self-inductance of the current path where an electric current flows from the first power supply terminal P to the output terminal OUT and the self-inductance of the current path where an electric current flows from the output terminal OUT to the second power supply terminal N are canceled at least partially by mutual inductance therebetween. As a result, it is possible to reduce the inductance of the semiconductor module 1.

Figure 11:
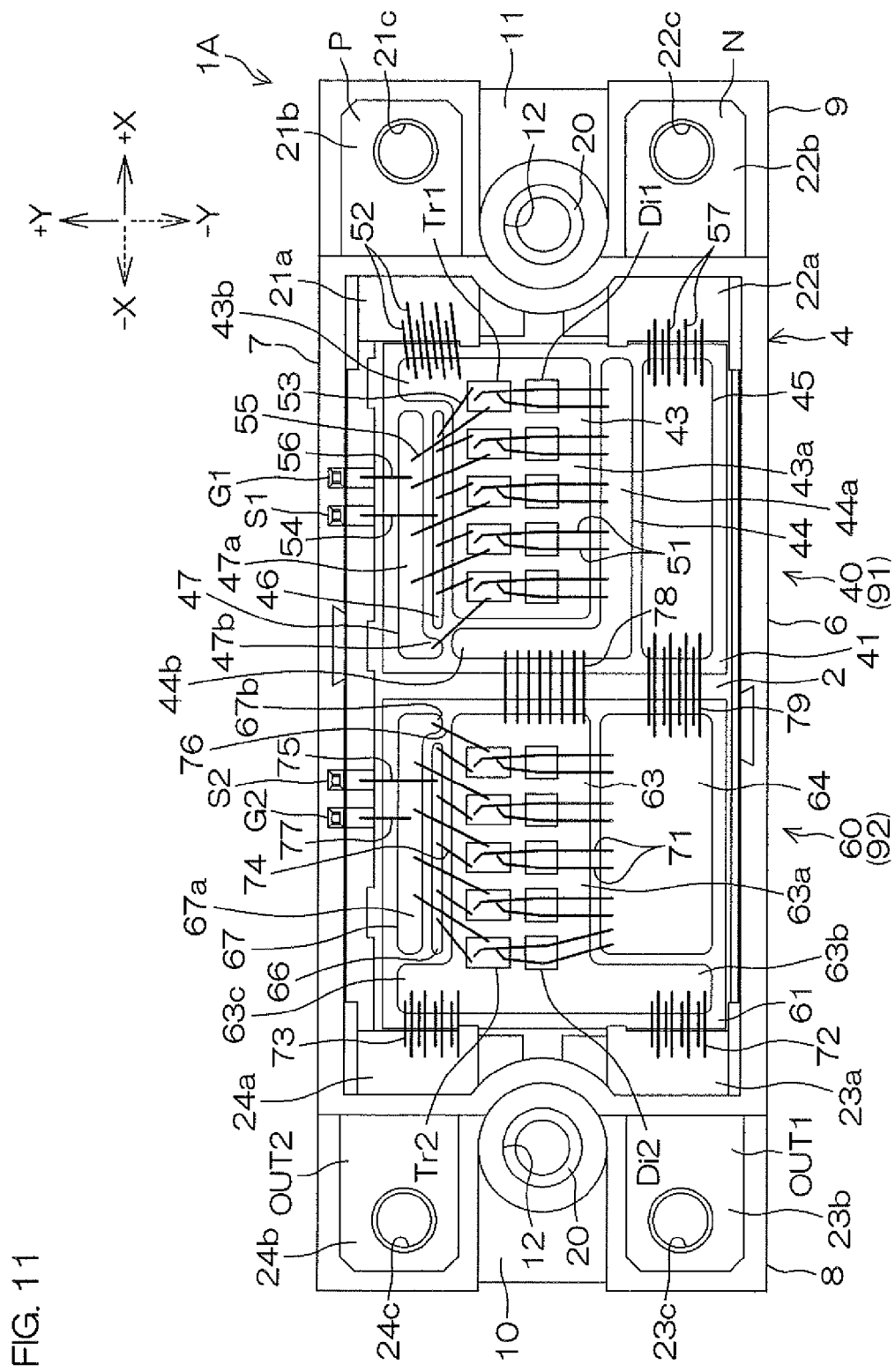
FIG. 11 is a plan view showing a semiconductor module according to a fourth embodiment of the present invention.

FIG. 11 is a plan view showing a semiconductor module according to a fourth embodiment of the present invention, showing a state in which the top plate has been detached. In FIG. 11, the same reference sign as in FIG. 7 to FIG. 9 is given to a component corresponding to each component shown in FIG. 7 to FIG. 9.

This semiconductor module 1A is similar to the semiconductor module 1 (see FIG. 8) according to the third embodiment. Only different points between this semiconductor module 1A and the semiconductor module 1 according to the third embodiment will be described. The semiconductor module 1A does not have the five first diode elements Di1 on the −Y direction side that are included in the first assembly 40 of the semiconductor module 1 according to the third embodiment. Additionally, the semiconductor module 1A does not have the five second diode elements Di2 on the −Y direction side that are included in the second assembly 60 of the semiconductor module 1 according to the third embodiment.

The first element bonding conductor layer 43 has a first part 43a that is formed in a rectangular shape longer in the X direction when viewed planarly and a second part 43b that protrudes in the +Y direction from the +X direction-side end of the first part 43a. Five first switching elements Tr1 arranged side by side in the X direction and five first diode elements Di1 arranged side by side in the X direction on the −Y direction side of the first switching elements Tr1 are disposed on the surface of the first part 43a of the first element bonding conductor layer 43.

The five first switching elements Tr1 positionally coincide with the five first diode elements Di1 with respect to the Y direction. The first switching element Tr1 and the first diode element Di1 positionally coinciding with each other in the Y direction are connected to the first part 44a of the first source conductor layer 44 by means of two wires 51 extending substantially in the Y direction when viewed planarly. More specifically, one end of each wire 51 is bonded to the source electrode of the first switching element Tr1, and the other end of each wire 51 is bonded to the surface of the first part 44a of the first source conductor layer 44, and an intermediate part of each wire 51 is bonded to the anode electrode of the first diode element Di1.

The semiconductor module 1A does not have the five first diode elements Di1 on the −Y direction side shown in the third embodiment, and therefore the width (length in the Y direction) of the first part 43a of the first element bonding conductor layer 43 is made narrower than in the third embodiment. Accordingly, the position at which the first part 44a of the first source conductor layer 44 is disposed shifts closer to the +Y direction side than in the third embodiment. As a result, the interval between the first part 44a of the first source conductor layer 44 and a side on the −Y direction side of the first insulating substrate 41 is widened. Therefore, the N terminal conductor layer 45 is formed in a rectangular shape wider than the width (length of the Y direction) of the first part 45a of the N terminal conductor layer 45 according to the third embodiment.

A plurality of wires 57 by which the N terminal conductor layer 45 and the internal wiring connection portion 22a of the second power supply terminal N are connected together extend in the X direction, and are disposed in parallel with each other when viewed planarly. Additionally, the adjoining wires 57 differ from each other in length. Corresponding ends of the adjoining wires 57 are disposed at positions mutually deviated in the length direction of those wires 57 when viewed from the width direction (Y direction) of the whole of the wires 57. As a result, bonded parts of the adjoining wires 57 to the N terminal conductor layer 45 or to the second power supply terminal N do not easily overlap with each other, and therefore the interval between the adjoining wires 57 can be narrowed, and it becomes easy to make an inspection (inspection by use of images) of the bonded parts of the wires 57.

Five second switching elements Tr2 arranged side by side in the X direction and five second diode elements Di2 arranged side by side in the X direction on the −Y direction side of the second switching elements Tr2 are disposed on the surface of the first part 63a of the second element bonding conductor layer 63.

The five second switching elements Tr2 positionally coincide with the five second diode elements Di2 with respect to the Y direction. The second switching element Tr2 and the second diode element Di2 positionally coinciding with each other in the Y direction are connected to the second source conductor layer 64 by means of two wires 71 extending substantially in the Y direction when viewed planarly. More specifically, one end of each wire 71 is bonded to the source electrode of the second switching element Tr2, and the other end of each wire 71 is bonded to the surface of the second source conductor layer 64, and an intermediate part of each wire 71 is bonded to the anode electrode of the second diode element Di2.

The semiconductor module 1A does not have the five second diode elements Di2 on the −Y direction side shown in the third embodiment, and therefore the width (length in the Y direction) of the first part 63a of the second element bonding conductor layer 63 is made narrower than in the third embodiment. Accordingly, the width (length in the Y direction) of the first source conductor layer 64 is formed greater than in the third embodiment.

A plurality of wires 79 by which the second source conductor layer 64 and the N terminal conductor layer 45 are connected together extend in the X direction, and are disposed in parallel with each other when viewed planarly. Additionally, the adjoining wires 79 differ from each other in length. Corresponding ends of the adjoining wires 79 are disposed at positions mutually deviated in the length direction of those wires 79 when viewed from the width direction (Y direction) of the whole of the wires 79. As a result, bonded parts of the adjoining wires 79 to the second source conductor layer 64 or to the N terminal conductor layer 45 do not easily overlap with each other, and therefore the interval between the adjoining wires 79 can be narrowed, and it becomes easy to make an inspection (inspection by use of images) of the bonded parts of the wires 79.

Figure 12:
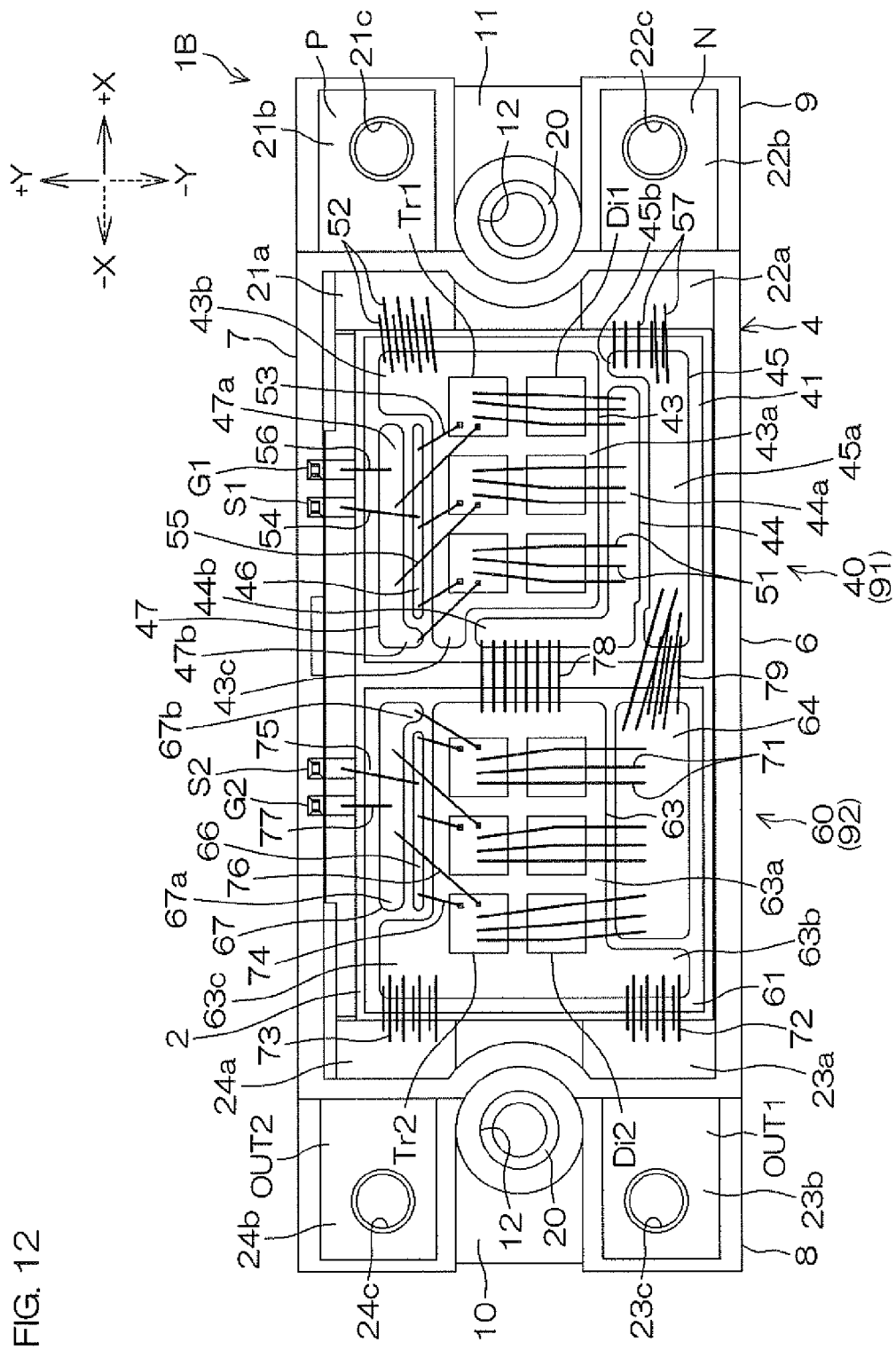
FIG. 12 is a plan view showing a semiconductor module according to a fifth embodiment of the present invention.

FIG. 12 is a plan view showing a semiconductor module according to a fifth embodiment of the present invention, showing a state in which the top plate has been detached. In FIG. 12, the same reference sign as in FIG. 7 to FIG. 9 is given to a component corresponding to each component shown in FIG. 7 to FIG. 9.

This semiconductor module 1B is similar to the semiconductor module 1 (see FIG. 8) according to the third embodiment. Only different points between this semiconductor module 1B and the semiconductor module 1 according to the third embodiment will be described. In the semiconductor module 1B, switching elements for a heavy electric current each of which is large in size are used as the first and second switching elements Tr1 and Tr2. Additionally, in the semiconductor module 1B, diode elements for a heavy electric current each of which is large in size are used as the first and second diode elements Di1 and Di2.

Three first switching elements Tr1 are bonded to the surface of the first part 43a of the first element bonding conductor layer 43, and three first diode elements Di1 are bonded thereto. The three first switching elements Tr1 are spaced at intervals side by side in the X direction at a part near a side on the +Y direction side in the surface of the first part 43a of the first element bonding conductor layer 43. The three first diode elements Di1 are spaced at intervals side by side in the X direction between a side on the −Y direction side of the first part 43a of the first element bonding conductor layer 43 and the three first switching elements Tr1.

The three first switching elements Tr1 positionally coincide with the three first diode elements Di1 with respect to the Y direction. The first switching element Tr1 and the first diode element Di1 positionally coinciding with each other in the Y direction are connected to the first part 44a of the first source conductor layer 44 by means of three wires 51 extending substantially in the Y direction when viewed planarly. More specifically, one end of each wire 51 is bonded to the source electrode of the first switching element Tr1, and the other end of each wire 51 is bonded to the surface of the first part 44a of the first source conductor layer 44, and an intermediate part of each wire 51 is bonded to the anode electrode of the first diode element Di1.

The source electrode of each first switching element Tr1 is connected also to the first source terminal conductor layer 46 by means of a wire 53. The gate electrode of each first switching element Tr1 is connected to the first gate terminal conductor layer 47 by means of a wire 55.

Three second switching elements Tr2 are bonded to the surface of the first part 63a of the second element bonding conductor layer 63, and three second diode elements Di2 are bonded thereto. The three second switching elements Tr2 are spaced at intervals side by side in the X direction at a part near a side on the +Y direction side in the surface of the first part 63a of the second element bonding conductor layer 63. The three second diode elements Di2 are spaced at intervals side by side in the X direction between a side on the −Y direction side of the first part 63a of the second element bonding conductor layer 63 and the three second switching elements Tr2.

The three second switching elements Tr2 positionally coincide with the three second diode elements Di2 with respect to the Y direction. The second switching element Tr2 and the second diode element Di1 positionally coinciding with each other in the Y direction are connected to the second source conductor layer 64 by means of three wires 71 extending substantially in the Y direction when viewed planarly. More specifically, one end of each wire 71 is bonded to the source electrode of the second switching element Tr2, and the other end of each wire 71 is bonded to the surface of the second source conductor layer 64, and an intermediate part of each wire 71 is bonded to the anode electrode of the second diode element Di2.

The source electrode of each second switching element Tr2 is connected also to the second source terminal conductor layer 66 by means of a wire 74. The gate electrode of each second switching element Tr2 is connected to the second gate terminal conductor layer 67 by means of a wire 76.

Figure 13:
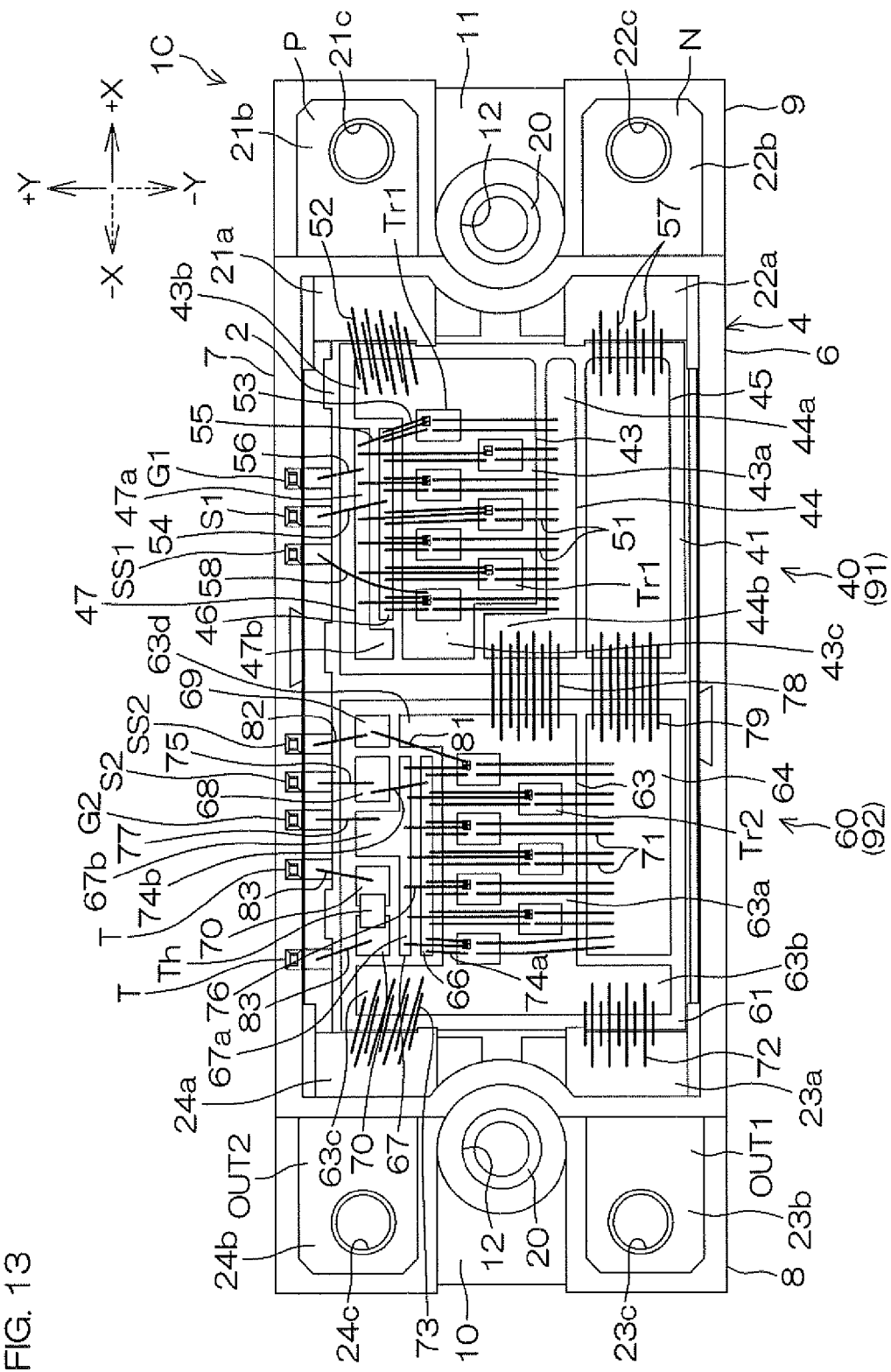
FIG. 13 is a plan view showing a semiconductor module according to a sixth embodiment of the present invention.

FIG. 13 is a plan view showing a semiconductor module according to a sixth embodiment of the present invention, showing a state in which the top plate has been detached. In FIG. 13, the same reference sign as in FIG. 7 to FIG. 9 is given to a component corresponding to each component shown in FIG. 7 to FIG. 9.

This semiconductor module 1C is similar to the semiconductor module 1A (see FIG. 11) according to the fourth embodiment. Only different points between this semiconductor module 1C and the semiconductor module 1A according to the fourth embodiment will be described.

First and second source sense terminals SS1 and SS2 and a pair of thermistor terminals T for thermistors, in addition to the first and second source terminals S1 and S2 and the first and second gate terminals G1 and G2, are attached to one side wall 7 of the frame portion 4. The first source sense terminal SS1 is disposed on the side opposite to the first gate terminal G1 with respect to the first source terminal S1. The second source sense terminal SS2 is disposed on the side opposite to the second gate terminal G2 with respect to the second source terminal S2. The pair of thermistor terminals T are spaced in the X direction on the side opposite to the second source terminal S2 with respect to the second gate terminal G2. The first and second source sense terminals SS1 and SS2 and the pair of thermistor terminals T are the same in shape and in structure for attaching these components to the side wall 7 as the first source terminal S1, and therefore a description of these respects is omitted.

The first element bonding conductor layer 43, the first source conductor layer 44, the N terminal conductor layer 45, the first source terminal conductor layer 46, and the first gate terminal conductor layer 47 are disposed on the surface (+Z direction-side surface) of the first insulating substrate 41. These conductor layers 43 to 47 are substantially the same in shape and in arrangement position as in the semiconductor module 1A according to the fourth embodiment (see FIG. 11). However, in the same way as in the third embodiment shown in FIG. 8, the first element bonding conductor layer 43 has the first part 43a formed in a rectangular shape longer in the X direction when viewed planarly, the second part 43b protruding toward the +Y direction side from the +X direction-side end of the first part 43a, and the third part 43c protruding toward the −X direction side from the lateral part on the +Y direction side of the first part 43a.

Only the first switching elements Tr1 are bonded to the first element bonding conductor layer 43. In other words, diode elements are not bonded to the first element bonding conductor layer 43. Four first switching elements Tr1 are spaced at intervals side by side in the X direction at a part near a side on the +Y direction side in the surface of the first part 43a and the third part 43c of the first element bonding conductor layer 43. Additionally, still other three first switching elements Tr1 are spaced at intervals side by side in the X direction at a part near a side on the −Y direction side in the surface of the first part 43a of the first element bonding conductor layer 43. The three first switching elements Tr1 on the −Y direction side are positioned between adjoining elements of the four first switching elements Tr1 on the +Y direction side when viewed from the Y direction.

Each first switching element Tr1 is connected to the first part 44a of the first source conductor layer 44 by means of two wires 51 extending substantially in the Y direction when viewed planarly. More specifically, one end of each wire 51 is bonded to the source electrode of the first switching element Tr1, and the other end of each wire 51 is bonded to the surface of the first part 44a of the first source conductor layer 44.

The source electrode of each first switching element Tr1 is connected also to the first source terminal conductor layer 46 by means of a wire 53. The first source terminal conductor layer 46 is connected to the first source terminal S1 by means of a wire 54. The gate electrode of each first switching element Tr1 is connected to the first gate terminal conductor layer 47 by means of a wire 55. The first gate terminal conductor layer 47 is connected to the first gate terminal G1 by means of a wire 56. The source electrode of the single first switching element Tr1 disposed at the −X direction-side end among the four first switching elements Tr1 on the +Y direction side is connected to the first source sense terminal SS1 by means of a wire 58.

A second element bonding conductor layer 63, a second source conductor layer 64, a second source terminal conductor layer 66, a second gate terminal conductor layer 67, a source relay conductor layer 68, a source sense terminal conductor layer 69, and a pair of thermistor bonding conductor layers 70 are formed on the surface of the second insulating substrate 61.

The second element bonding conductor layer 63 has a first part 63a that is formed in a rectangular shape longer in the X direction when viewed planarly and with which an intermediate part in the Y direction in the surface of the second insulating substrate 61 is covered, a second part 63b that extends toward the −Y direction side from the −X direction-side end of the first part 63a, a third part 63c that extends toward the +Y direction side from the −X direction-side end of the first part 63a, and a fourth part 63d that extends toward the +Y direction side from the +X direction-side end of the first part 63a.

The second source conductor layer 64 is formed in a rectangular shape longer in the X direction when viewed planarly, and is disposed between a side on the −Y direction side of the first part 63a of the second element bonding conductor layer 63 and a side on the −Y direction side of the second insulating substrate 61.

The second source terminal conductor layer 66 is formed in a rectangular shape longer in the X direction when viewed planarly, and is disposed between the third part 63c and the fourth part 63d of the second element bonding conductor layer 63 on the side opposite to the second source conductor layer 64 with respect to the second element bonding conductor layer 63. The second gate terminal conductor layer 67 has a first part 67a that is formed in a rectangular shape longer in the X direction when viewed planarly and a second part 67b that protrudes in the +Y direction from a lengthwise intermediate part closer to its +Y direction-side end. The second gate terminal conductor layer 67 is disposed between the third part 63c and the fourth part 63d of the second element bonding conductor layer 63 on the side opposite to the first part 63a of the second element bonding conductor layer 63 with respect to the second source terminal conductor layer 66.

The source sense terminal conductor layer 69 is formed substantially in a rectangle when viewed planarly, and is disposed between the fourth part 63d of the second element bonding conductor layer 63 and a side on the +Y direction side of the second insulating substrate 61. The source relay conductor layer 68 is formed substantially in a rectangle when viewed planarly, and is disposed between the source sense terminal conductor layer 69 and the second part 67b of the second gate terminal conductor layer 67. The pair of thermistor bonding conductor layers 70 are spaced in the X direction between the second part 67b of the second gate terminal conductor layer 67 and the third part 63c of the second element bonding conductor layer 63.

Only the second switching elements Tr2 are bonded to the second element bonding conductor layer 63. In other words, diode elements are not bonded to the second element bonding conductor layer 63. Four second switching elements Tr2 are spaced at intervals side by side in the X direction at a part near a side on the +Y direction side in the surface of the first part 63a of the second element bonding conductor layer 63. Additionally, still other three second switching elements Tr2 are spaced at intervals side by side in the X direction at a part near a side on the −Y direction side in the surface of the first part 63a of the second element bonding conductor layer 63. The three second switching elements Tr2 on the −Y direction side are positioned between adjoining elements of the four second switching elements Tr2 on the +Y direction side when viewed from the Y direction.

Each second switching element Tr2 is connected to the second source conductor layer 64 by means of two wires 71 extending substantially in the Y direction when viewed planarly. More specifically, one end of each wire 71 is bonded to the source electrode of the second switching element Tr2, and the other end of each wire 71 is bonded to the surface of the second source conductor layer 64.

The source electrode of each second switching element Tr2 is connected also to the second source terminal conductor layer 66 by means of a wire 74a. The second source terminal conductor layer 66 is connected to the source relay conductor layer 68 by means of a wire 74b. The source relay conductor layer 68 is connected to the second source terminal S2 by means of a wire 75. The gate electrode of each second switching element Tr2 is connected to the second gate terminal conductor layer 67 by means of a wire 76. The second gate terminal conductor layer 67 is connected to the second gate terminal G2 by means of a wire 77. The source electrode of the single second switching element Tr2 disposed at the +X direction-side end among the four second switching elements Tr2 on the +Y direction side is connected to the source sense conductor layer 69 by means of a wire 81. The source sense conductor layer 69 is connected to the second source sense terminal SS2 by means of a wire 82.

A thermistor Th is bonded to the pair of thermistor bonding conductor layers 70. More specifically, a first electrode and a second electrode are formed on the −Z direction-side surface of the thermistor Th, and the first electrode is bonded to one of the thermistor bonding conductor layers 70, and the second electrode is bonded to the other thermistor bonding conductor layer 70. The pair of thermistor bonding conductor layers 70 are connected to the pair of thermistor terminals T through wires 83, respectively.

Figure 14:
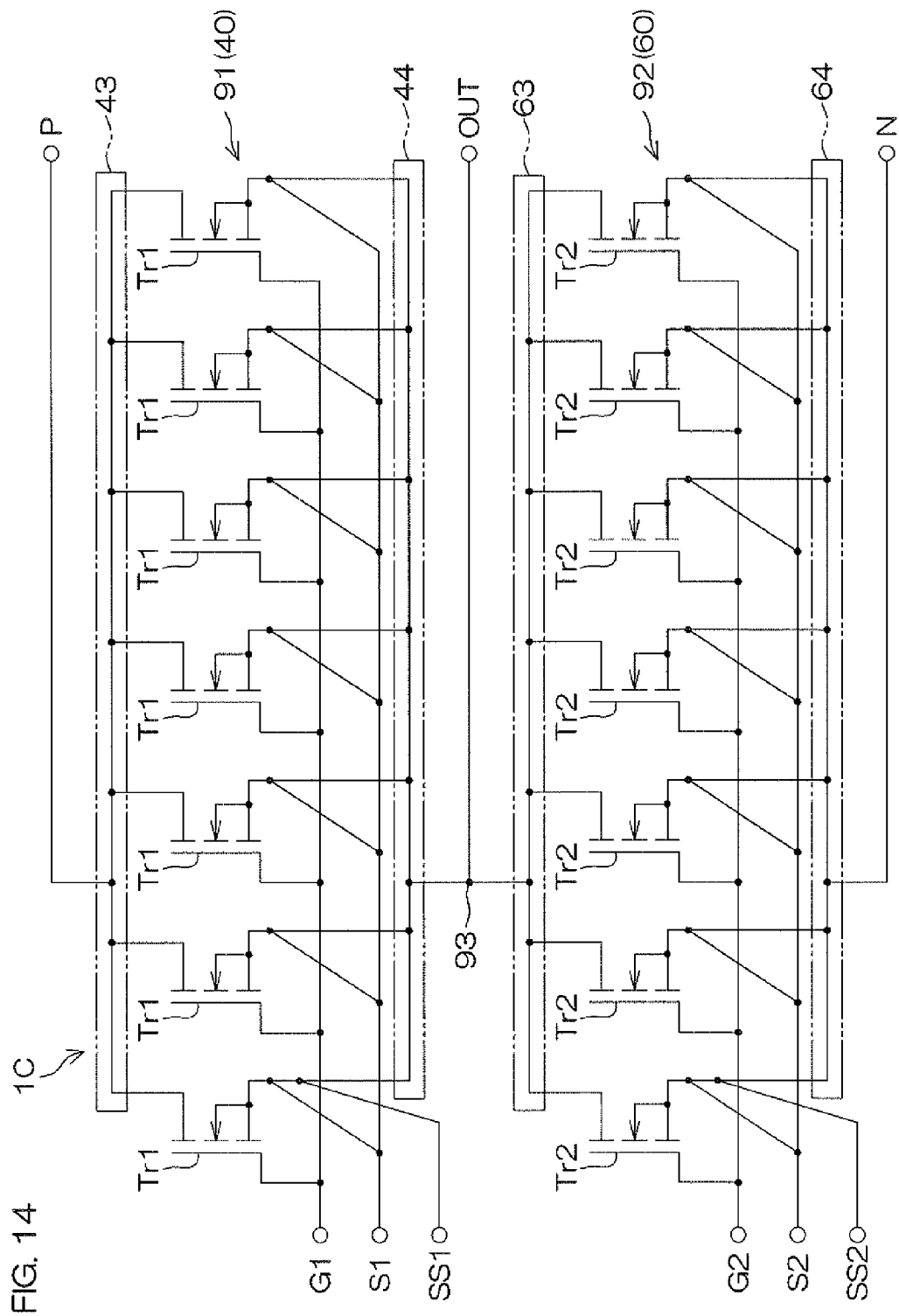
FIG. 14 is an electric circuit diagram to describe an electric arrangement of the semiconductor module shown in FIG. 13.

FIG. 14 is an electric circuit diagram to describe an electric arrangement of the semiconductor module 1C. In FIG. 14, the two output terminals OUT1 and OUT2 are shown as a single output terminal OUT.

A plurality of first switching elements Tr1 provided in the first assembly 40 are connected together in parallel between the first element bonding conductor layer 43 and the first source conductor layer 44, and form an upper arm circuit (high-side circuit) 91. Likewise, a plurality of second switching elements Tr2 provided in the second assembly 60 are connected together in parallel between the second element bonding conductor layer 63 and the first source conductor layer 64, and form a lower arm circuit (low-side circuit) 92. The upper arm circuit 91 and the lower arm circuit 92 are connected together in series between the first power supply terminal P and the second power supply terminal N, and the output terminal OUT is connected to a connection point 93 between the upper arm circuit 91 and the lower arm circuit 92. A half bridge circuit is arranged in this way.

Drains of the first switching elements Tr1 are connected to the first element bonding conductor layer 43. Sources of the first switching elements Tr1 are connected to the first source conductor layer 44. Gates of the first switching elements Tr1 are connected to the first gate terminal G1. The sources of the first switching elements Tr1 are connected also to the first source terminal 51. Additionally, the source of the single first switching element Tr1 is connected to the first source sense terminal SS1. Each first switching element Tr1 has a built-in first PN junction diode (body diode), which is not shown in the drawings. An electric current flowing from the output terminal OUT to the first power supply terminal P passes through the first PN junction diode in preference to the first switching element Tr1, and therefore the first switching element Tr1 is prevented from being broken by a reverse current.

Drains of the second switching elements Tr2 are connected to the second element bonding conductor layer 63. Sources of the second switching elements Tr2 are connected to the second source conductor layer 64. Gates of the second switching elements Tr2 are connected to the second gate terminal G2. The sources of the second switching elements Tr2 are connected also to the second source terminal S2. Additionally, the source of the single second switching element Tr2 is connected also to the second source sense terminal SS2. Each second switching element Tr2 has a built-in second PN junction diode (body diode), which is not shown in the drawings. An electric current flowing from the second power supply terminal N to the output terminal OUT passes through the second PN junction diode in preference to the second switching element Tr2, and therefore the second switching element Tr2 is prevented from being broken by a reverse current.

Figure 15:
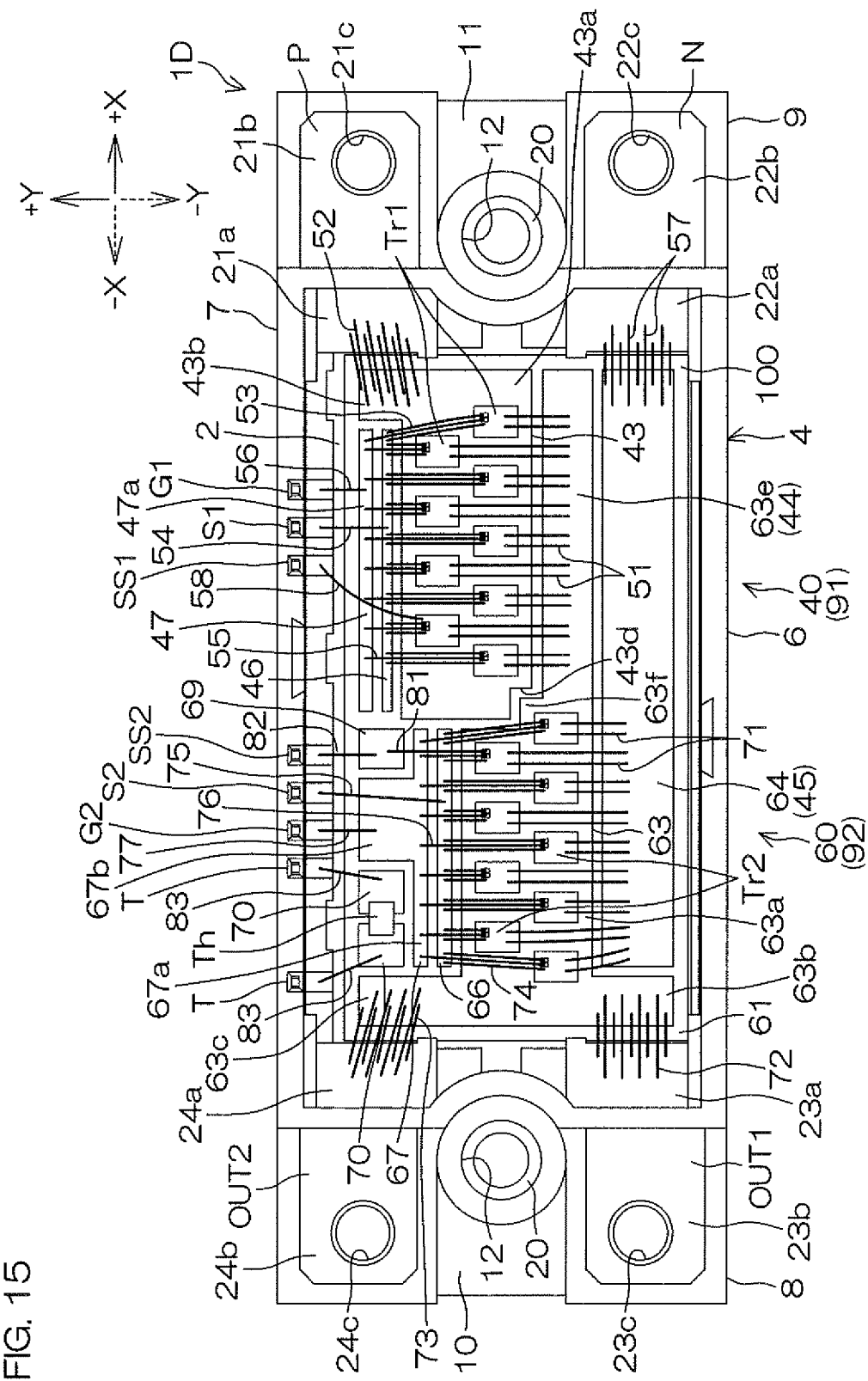
FIG. 15 is a plan view showing a semiconductor module according to a seventh embodiment of the present invention.

FIG. 15 is a plan view showing a semiconductor module according to a seventh embodiment of the present invention, showing a state in which the top plate has been detached. In FIG. 15, the same reference sign as in FIG. 7 to FIG. 9 is given to a component corresponding to each component shown in FIG. 7 to FIG. 9.

This semiconductor module 1D is similar to the semiconductor module 1C (see FIG. 13) according to the sixth embodiment. Only different points between this semiconductor module 1D and the semiconductor module 1C according to the sixth embodiment will be described.

In the semiconductor module 1D, only one insulating substrate 100 is bonded onto the heat dissipation plate 2 in the same way as the semiconductor module 101 of the first embodiment. The insulating substrate 100 is formed in a rectangular shape longer in the X direction when viewed planarly, and is bonded to the surface of the heat dissipation plate 2 in a posture in which the four sides of the insulating substrate 100 are parallel to the four sides of the heat dissipation plate 2, respectively. A bonding conductor layer (not shown) is formed on a surface (−Z direction-side surface (second plane)) on the heat-dissipation-plate side (2) of the insulating substrate 100, and this bonding conductor layer is bonded to the heat dissipation plate 2 through a solder layer (not shown). The heat dissipation plate 2 is deformed so as to become convex in the −Z direction when viewed from the Y direction in the same way as in the first embodiment, which is not shown in the drawings. In other words, the heat dissipation plate 2 is deformed so that its lengthwise central part protrudes in the −Z direction when viewed from the Y direction.

A first assembly 40 that forms an upper arm (high side) circuit 91 and a second assembly 60 that forms a lower arm (low side) circuit 92 are arranged side by side in the X direction on the surface (+Z direction-side surface (first plane)) of the insulating substrate 100.

The first assembly 40 includes a plurality of conductor layers formed on the surface (+Z direction-side surface) of the insulating substrate 100 and a plurality of first switching elements Tr1. The conductor layers include a first element bonding conductor layer 43, a first source conductor layer 44, an N terminal conductor layer 45, a first source terminal conductor layer 46, and a first gate terminal conductor layer 47.

The second assembly 60 includes a plurality of conductor layers formed on the surface (+Z direction-side surface) of the insulating substrate 100 and a plurality of second switching elements Tr2. The conductor layers include a second element bonding conductor layer 63, a second source conductor layer 64, a second source terminal conductor layer 66, a second gate terminal conductor layer 67, a source sense terminal conductor layer 69, and a pair of thermistor bonding conductor layers 70. As described later, the second element bonding conductor layer 63 and the first source conductor layer 44 are formed integrally with each other. Additionally, the second source conductor layer 64 and the N terminal conductor layer 45 are formed integrally with each other.

The first element bonding conductor layer 43 has a first part 43a that is formed in a rectangular shape longer in the X direction when viewed planarly and with which an intermediate part in the Y direction of substantially half the surface on the +X direction side of the insulating substrate 100 is covered and a second part 43b that protrudes toward the +Y direction side from the +X direction-side end of the first part 43a. An excision portion 43d is formed at a corner part on the −Y direction side of the −X direction-side end of the first part 43a.

The first source terminal conductor layer 46 is formed in a rectangular shape longer in the X direction when viewed planarly, and is disposed adjacently to the first element bonding conductor layer 43 between a side on the +Y direction side of the first part 43a of the first element bonding conductor layer 43 and a side on the +Y direction side of the insulating substrate 100. The first gate terminal conductor layer 47 is formed in a rectangular shape longer in the X direction when viewed planarly, and is disposed adjacently to the first source terminal conductor layer 46 on the side opposite to the first part 43a of the first element bonding conductor layer 43 with respect to the first source terminal conductor layer 46.

The second element bonding conductor layer 63 has a first part 63a that is formed in a rectangular shape longer in the X direction when viewed planarly and with which an intermediate part in the Y direction in substantially half the surface on the −X direction side of the insulating substrate 100 is covered. The second element bonding conductor layer 63 additionally has a second part 63b that extends toward the −Y direction side from the −X direction-side end of the first part 63a, a third part 63c that extends toward the +Y direction side from the −X direction-side end of the first part 63a, and a fourth part 63e that extends toward the +X direction side from a lateral part on the −Y direction side of the first part 63a. The fourth part 63e is disposed along a side on the −Y direction side of the first element bonding conductor layer 43, and its +X direction-side end extends to the vicinity of a side on the +X direction side of the insulating substrate 100. An overhang portion 63f disposed in the excision portion 43d of the first element bonding conductor layer 43 is formed near a connection between the first part 63a and the fourth part 63e. The first source conductor layer 44 is formed of the fourth part 63e.

The second source conductor layer 64 is formed in a rectangular shape longer in the X direction when viewed planarly, and is disposed between sides on the −Y direction side of the first and fourth parts 63a and 63e of the second element bonding conductor layer 63 and a side on the −Y direction side of the insulating substrate 100. The N terminal conductor layer 45 is formed of substantially half the second source conductor layer 64 on the +Y direction side.

The second source terminal conductor layer 66 is formed in a rectangular shape longer in the X direction when viewed planarly, and is disposed adjacently to the first part 63a of the second element bonding conductor layer 63 on the side opposite to the second source conductor layer 64 with respect to the first part 63a of the second element bonding conductor layer 63. The second gate terminal conductor layer 67 has a first part 67a that is formed in a rectangular shape longer in the X direction when viewed planarly and a second part 67b that protrudes in the +Y direction from a lengthwise intermediate part closer to its +Y direction-side end. The second gate terminal conductor layer 67 is disposed adjacently to the second source terminal conductor layer 66 on the side opposite to the first part 63a of the second element bonding conductor layer 63 with respect to the second source terminal conductor layer 66.

The source sense terminal conductor layer 69 is formed substantially in a rectangle when viewed planarly, and is disposed between a +X direction-side end of the first part 67a of the second gate terminal conductor layer 67 and a side on the +Y direction side of the insulating substrate 100. The pair of thermistor bonding conductor layers 70 are spaced in the X direction between the second part 67b of the second gate terminal conductor layer 67 and the third part 63c of the second element bonding conductor layer 63.

The first switching elements Tr1 are bonded to the first element bonding conductor layer 43. Four first switching elements Tr1 are spaced at intervals side by side in the X direction at a part near a side on the +Y direction side in the surface of the first part 43a of the first element bonding conductor layer 43. Still other five first switching elements Tr1 are spaced at intervals side by side in the X direction at a part near a side on the −Y direction side in the surface of the first part 43a of the first element bonding conductor layer 43. The four first switching elements Tr1 on the +Y direction side are positioned between adjoining elements of the five first switching elements Tr1 on the −Y direction side when viewed from the Y direction.

Each first switching element Tr1 is connected to the fourth part 63e (first source conductor layer 44) of the second element bonding conductor layer 63 by means of two wires 51 extending substantially in the Y direction when viewed planarly. More specifically, one end of each wire 51 is bonded to the source electrode of the first switching element Tr1, and the other end of each wire 51 is bonded to the surface of the fourth part 63e of the second element bonding conductor layer 63.

The source electrode of each first switching element Tr1 is connected also to the first source terminal conductor layer 46 by means of a wire 53. The first source terminal conductor layer 46 is connected to the first source terminal 51 by means of a wire 54. The gate electrode of each first switching element Tr1 is connected to the first gate terminal conductor layer 47 by means of a wire 55. The first gate terminal conductor layer 47 is connected to the first gate terminal G1 by means of a wire 56. The source electrode of the single first switching element Tr1 disposed at the −X direction-side end among the four first switching elements Tr1 on the +Y direction side is connected to the first source sense terminal SS1 by means of a wire 58.

The first element bonding conductor layer 43 is connected to the internal wiring connection portion 21a of the first power supply terminal P by means of a plurality of wires 52 extending substantially in the X direction when viewed planarly. More specifically, one end of each wire 52 is bonded to the second part 43b and to a surface therenear in the first element bonding conductor layer 43, and an opposite end of each wire 52 is bonded to the surface of the internal wiring connection portion 21a of the first power supply terminal P.

The second switching elements Tr2 are bonded to the second element bonding conductor layer 63. Four second switching elements Tr2 are spaced at intervals side by side in the X direction at a part near a side on the +Y direction side in the surface of the first part 63a of the second element bonding conductor layer 63. Still other five second switching elements Tr2 are spaced at intervals side by side in the X direction at a part near a side on the −Y direction side in the surface of the first part 63a of the second element bonding conductor layer 63. The four second switching elements Tr2 on the +Y direction side are positioned between adjoining elements of the five second switching elements Tr2 on the −Y direction side when viewed from the Y direction.

Each second switching element Tr2 is connected to the second source conductor layer 64 (N terminal conductor layer 45) by means of two wires 71 extending substantially in the Y direction when viewed planarly. More specifically, one end of each wire 71 is bonded to the source electrode of the second switching element Tr2, and the other end of each wire 71 is bonded to the surface of the second source conductor layer 64.

The source electrode of each second switching element Tr2 is connected also to the second source terminal conductor layer 66 by means of a wire 74. The second source terminal conductor layer 66 is connected to the second source terminal S2 by means of a wire 75. The gate electrode of each second switching element Tr2 is connected to the second gate terminal conductor layer 67 by means of a wire 76. The second gate terminal conductor layer 67 is connected to the second gate terminal G2 by means of a wire 77. The source electrode of the single second switching element Tr2 disposed at the +X direction-side end among the four second switching elements Tr2 on the +Y direction side is connected to the source sense conductor layer 69 by means of a wire 81. The source sense conductor layer 69 is connected to the second source sense terminal SS2 by means of a wire 82.

The second element bonding conductor layer 63 is connected to the internal wiring connection portion 23a of the first output terminal OUT1 by means of a plurality of wires 72 extending in the X direction when viewed planarly. More specifically, one end of each wire 72 is bonded to the surface of the second part 63b of the second element bonding conductor layer 63, and an opposite end of each wire 72 is bonded to the surface of the internal wiring connection portion 23a of the first output terminal OUT1.

Additionally, the second element bonding conductor layer 63 is connected to the internal wiring connection portion 24a of the second output terminal OUT2 by means of a plurality of wires 73 extending substantially in the X direction when viewed planarly. More specifically, one end of each wire 73 is bonded to the surface of the third part 63c of the second element bonding conductor layer 63, and an opposite end of each wire 73 is bonded to the surface of the internal wiring connection portion 24a of the second output terminal OUT2.

The second source conductor layer 64 (N terminal conductor layer 45) is connected to the internal wiring connection portion 22a of the second power supply terminal N by means of a plurality of wires 57. More specifically, one end of each wire 57 is bonded to the +X direction-side end of the surface of the second source conductor layer 64, and an opposite end of each wire 57 is bonded to the surface of the internal wiring connection portion 22a of the second power supply terminal N.

A thermistor Th is bonded to the pair of thermistor bonding conductor layers 70. More specifically, a first electrode and a second electrode are formed on the −Z direction-side surface of the thermistor Th, and the first electrode is bonded to one of the thermistor bonding conductor layers 70, and the second electrode is bonded to the other thermistor bonding conductor layer 70. The pair of thermistor bonding conductor layers 70 are connected to the pair of thermistor terminals T through wires 83, respectively.

Figure 16:
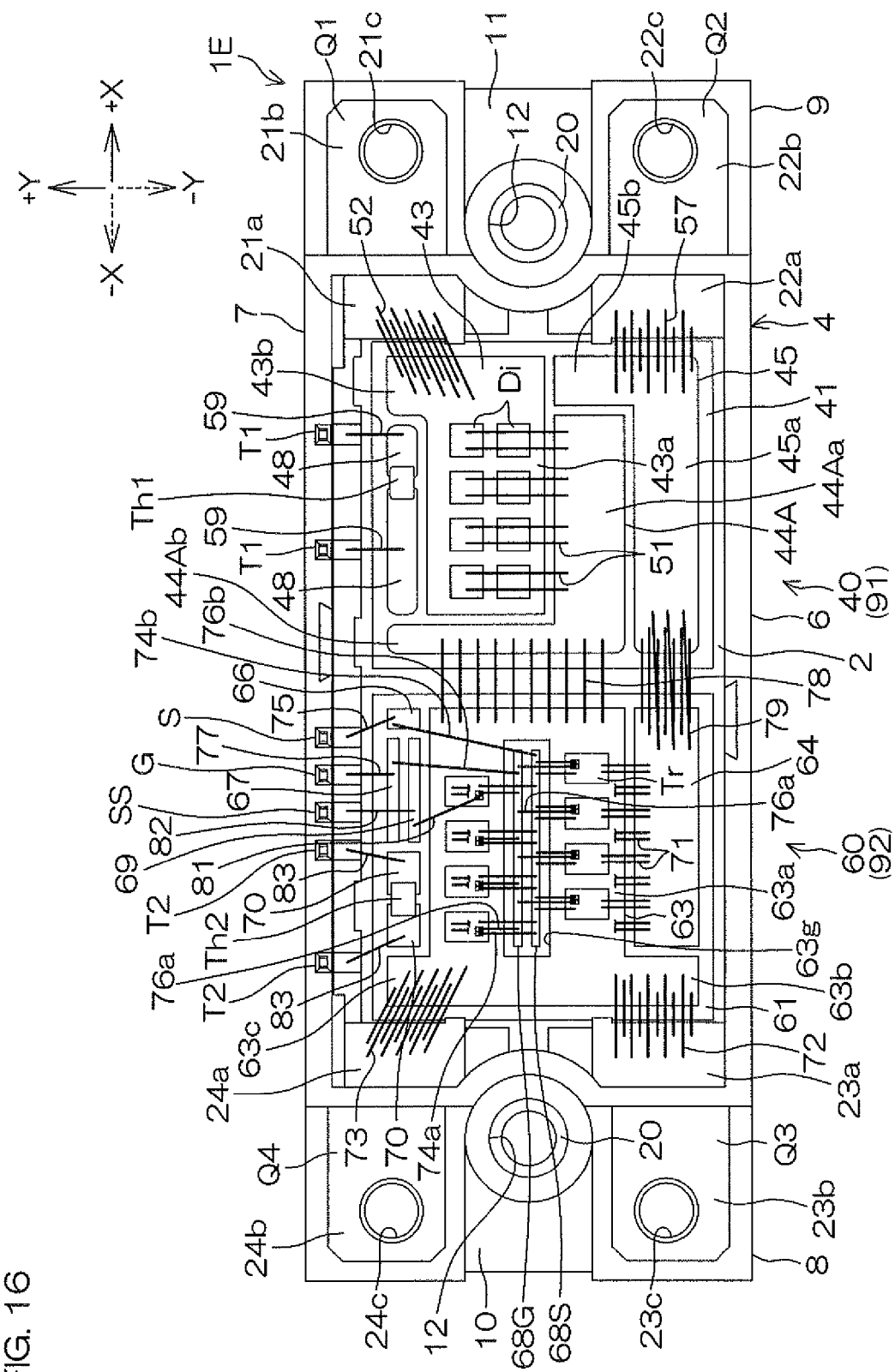
FIG. 16 is a plan view showing a semiconductor module according to an eighth embodiment of the present invention.

FIG. 16 is a plan view showing a semiconductor module according to an eighth embodiment of the present invention, showing a state in which the top plate has been detached. In FIG. 16, the same reference sign as in FIG. 7 to FIG. 9 is given to a component corresponding to each component shown in FIG. 7 to FIG. 9.

This semiconductor module 1E is a semiconductor module for use in a DC-DC converter. This semiconductor module 1E is similar to the semiconductor module 1C (see FIG. 13) according to the sixth embodiment. Only different points between this semiconductor module 1E and the semiconductor module 1C according to the sixth embodiment will be described.

In the semiconductor module 1E, the terminals P, N, OUT1, and OUT2 of the semiconductor module 1C according to the sixth embodiment correspond to terminals Q1, Q2, Q3, and Q4, respectively. Additionally, the first source terminal S1, the second gate terminal G1, and the first source sense terminal SS1, which are provided in the sixth embodiment (see FIG. 13), are not disposed between the lengthwise center of one of the side walls 7 of the frame portion 4 and the +X direction-side end, and, instead of these components, a pair of first thermistor terminals T1 for thermistors are provided. A pair of second thermistor terminals T2, a source sense terminal SS, a gate terminal G, and a source terminal S are disposed between the lengthwise center of the side wall 7 and the −X direction-side end.

The first assembly 40 includes a first insulating substrate 41 and a plurality of diode elements Di. A first element bonding conductor layer 43, an anode conductor layer 44A for anodes, a Q2 terminal conductor layer 45 for Q2 terminals, and a pair of first thermistor bonding conductor layers 48 are formed on the +Z direction-side surface of the first insulating substrate 41.

The first element bonding conductor layer 43 has a first part 43a that is formed in a rectangular shape longer in the X direction when viewed planarly and with which substantially half the surface of the first insulating substrate 41 on the +Y direction side is covered and a second part 43b that protrudes toward the +Y direction side from the +X direction-side end of the first part 43a.

The Q2 terminal conductor layer 45 has a first part 45a that is formed in a rectangular shape longer in the X direction when viewed planarly and a second part 45b that protrudes toward the +Y direction side from the +X direction-side end of the first part 45a. The Q2 terminal conductor layer 45 is disposed between a side on the −Y direction side of the first part 43a of the first element bonding conductor layer 43 and a side on the −Y direction side of the first insulating substrate 41.

The anode conductor layer 44A is formed of a first part (element connecting area) 44Aa that is formed in a rectangular shape longer in the X direction when viewed planarly and a second part 44Ab that extends toward the +Y direction side from the −X direction-side end of the first part 44Aa and that is formed in a rectangular shape longer in the Y direction when viewed planarly. The first part 44Aa is disposed between a long side on the −Y direction side of the first part 43a of the first element bonding conductor layer 43 and the first part 45a of the Q2 terminal conductor layer 45. The second part 44Ab is disposed between a side on the −X direction side of the first part 43a of the first element bonding conductor layer 43 and a side on the −X direction side of the first insulating substrate 41.

The pair of first thermistor bonding conductor layers 48 are spaced in the X direction on the side opposite to the first part 44Aa of the anode conductor layer 44A with respect to the first part 43a of the first element bonding conductor layer 43.

Cathode electrodes of the diode elements Di are bonded to the surface of the first part 43a of the first element bonding conductor layer 43 through a solder layer (not shown). Each diode element Di has an anode electrode on a surface opposite to the surface bonded to the first element bonding conductor layer 43.

Four diode elements Di are spaced at intervals side by side in the X direction between the widthwise center (center in the Y direction) of the surface of the first part 43a of the first element bonding conductor layer 43 and a side on the +Y direction side thereof. Still other four diode elements Di are spaced at intervals side by side in the X direction between the aforementioned four diode elements Di and a side on the −Y direction side of the first part 43a of the first element bonding conductor layer 43.

The four first diode elements Di on the +Y direction side positionally coincide with the four first diode elements Di on the −Y direction side. The two diode elements Di positionally coinciding with each other in the Y direction are connected to the first part 44Aa of the anode conductor layer 44A by means of two wires 51 extending substantially in the Y direction when viewed planarly. More specifically, one end of each wire 51 is bonded to the anode electrode of the diode element Di on the +Y direction side, and the other end of each wire 51 is bonded to the surface of the first part 44Aa of the anode conductor layer 44A, and an intermediate part of each wire 51 is bonded to the anode electrode of the diode element Di on the −Y direction side.

The first element bonding conductor layer 43 is connected to the internal wiring connection portion 21a of the terminal Q1 by means of a plurality of wires 52 extending substantially in the X direction when viewed planarly. More specifically, one end of each wire 52 is bonded to the second part 43b and to a surface therenear in the first element bonding conductor layer 43, and an opposite end of each wire 52 is bonded to the surface of the internal wiring connection portion 21a of the terminal Q1.

The Q2 terminal conductor layer 45 is connected to the internal wiring connection portion 22a of the terminal Q2 by means of a plurality of wires 57. More specifically, one end of each wire 57 is bonded to the +X direction-side end of the surface of the Q2 terminal conductor layer 45, and an opposite end of each wire 57 is bonded to the surface of the internal wiring connection portion 22a of the terminal Q2.

A first thermistor Th1 is bonded to the pair of first thermistor bonding conductor layers 48. More specifically, a first electrode and a second electrode are formed on the −Z direction-side surface of the first thermistor Th1, and the first electrode is bonded to one of the first thermistor bonding conductor layers 48, and the second electrode is bonded to the other first thermistor bonding conductor layer 48. The pair of first thermistor bonding conductor layers 48 are connected to the pair of first thermistor terminals T1 through a wire 59.

The second assembly 60 includes a second insulating substrate 61 and a plurality of second switching elements Tr. A second element bonding conductor layer 63, a source conductor layer 64, a source terminal conductor layer 66, a gate terminal conductor layer 67, a source relay conductor layer 68S, a gate relay conductor layer 68G, a source sense terminal conductor layer 69, and a pair of thermistor bonding conductor layers 70 are formed on the surface of the second insulating substrate 61.

The second element bonding conductor layer 63 has a first part 63a that is formed in a rectangular shape longer in the X direction when viewed planarly and with which an intermediate part in the Y direction in the surface of the second insulating substrate 61 is covered, a second part 63b that extends toward the −Y direction side from the −X direction-side end of the first part 63a, and a third part 63c that extends toward the +Y direction side from the −X direction-side end of the first part 63a. A rectangular hole 63g longer in the X direction when viewed planarly is formed at the widthwise center part of the first part 63a.

The source relay conductor layer 68S and the gate relay conductor layer 68G are each formed in a rectangular shape longer in the X direction, and are spaced in the Y direction in the hole 63g of the second element bonding conductor layer 63. The source relay conductor layer 68S is disposed on the −Y direction side with respect to the gate relay conductor layer 68G.

The source conductor layer 64 is formed in a rectangular shape longer in the X direction when viewed planarly, and is disposed between a side on the −Y direction side of the first part 63a of the second element bonding conductor layer 63 and a side on the −Y direction side of the second insulating substrate 61.

The source sense terminal conductor layer 69 is formed in a rectangular shape longer in the X direction when viewed planarly, and is disposed adjacently to the intermediate part in the X direction of the first part 63a of the second element bonding conductor layer 63 on the side opposite to the second source conductor layer 64 with respect to the first part 63a of the second element bonding conductor layer 63. The gate terminal conductor layer 67 is formed in a rectangular shape longer in the X direction when viewed planarly, and is disposed adjacently to the source sense terminal conductor layer 69 on the side opposite to the first part 63a of the second element bonding conductor layer 63 with respect to the source sense terminal conductor layer 69.

The source terminal conductor layer 66 is formed substantially in a rectangle when viewed planarly, and is disposed between +X direction-side ends of the source sense terminal conductor layer 69 and of the gate terminal conductor layer 67 and a side on the +X direction side of the second insulating substrate 61. The pair of thermistor bonding conductor layers 70 are spaced in the X direction between −X direction-side ends of the source sense terminal conductor layer 69 and of the gate terminal conductor layer 67 and the third part 63c of the second element bonding conductor layer 63.

A plurality of switching elements Tr are bonded to the second element bonding conductor layer 63. Four switching elements Tr are spaced at intervals side by side in the X direction between a side on the +Y direction side in the surface of the first part 63a of the second element bonding conductor layer 63 and the hole 63g. Still other four switching elements Tr are spaced at intervals side by side in the X direction between a side on the −Y direction side in the surface of the first part 63a of the second element bonding conductor layer 63 and the hole 63g. The four switching elements Tr on the +Y direction side and the four switching elements Tr on the −Y direction side are arranged side by side alternately in the X direction when viewed from the Y direction.

Each switching element Tr is connected to the source conductor layer 64 by means of two wires 71 extending substantially in the Y direction when viewed planarly. More specifically, one end of each wire 71 is bonded to the source electrode of the switching element Tr, and the other end of each wire 71 is bonded to the surface of the second source conductor layer 64. In FIG. 16, for clarification, the wire 71 by which the switching element Tr and the source conductor layer 64 on the +Y direction side are connected together is shown by omitting its halfway part.

The source electrode of each switching element Tr is connected also to the source relay conductor layer 68S by means of a wire 74a. The source relay conductor layer 68S is connected to the source terminal conductor layer 66 by means of a wire 74b. The source terminal conductor layer 66 is connected to the source terminal S by means of a wire 75.

The gate electrode of each switching element Tr is connected to the gate relay conductor layer 68G by means of a wire 76a. The gate relay conductor layer 68G is connected to the gate terminal conductor layer 67 by means of a wire 76b. The gate terminal conductor layer 67 is connected to the gate terminal G by means of a wire 77. The source electrode of the single first switching element Tr disposed at the +X direction-side end among the four switching elements Tr on the +Y direction side is connected to the source sense conductor layer 69 by means of a wire 81. The source sense conductor layer 69 is connected to the source sense terminal SS by means of a wire 82.

A second thermistor Th2 is bonded to the pair of second thermistor bonding conductor layers 70. More specifically, a first electrode and a second electrode are formed on the −Z direction-side surface of the second thermistor Th2, and the first electrode is bonded to one of the second thermistor bonding conductor layers 70, and the second electrode is bonded to the other second thermistor bonding conductor layer 70. The pair of second thermistor bonding conductor layers 70 are connected to the pair of second thermistor terminals T2 through a wire 83.

The second element bonding conductor layer 63 is connected to the internal wiring connection portion 23a of the terminal Q3 by means of a plurality of wires 72 extending in the X direction when viewed planarly. More specifically, one end of each wire 72 is bonded to the surface of the second part 63b of the second element bonding conductor layer 63, and an opposite end of each wire 72 is bonded to the surface of the internal wiring connection portion 23a of the terminal Q3.

Additionally, the second element bonding conductor layer 63 is connected to the internal wiring connection portion 24a of the terminal Q4 by means of a plurality of wires 73 extending substantially in the X direction when viewed planarly. More specifically, one end of each wire 73 is bonded to the surface of the third part 63c of the second element bonding conductor layer 63, and an opposite end of each wire 73 is bonded to the surface of the internal wiring connection portion 24a of the terminal Q4.

The second element bonding conductor layer 63 of the second assembly 60 is connected to the anode conductor layer 44A of the first assembly 40 by means of a plurality of wires 78 extending in the X direction. More specifically, one end of each wire 78 is bonded to the +X direction-side end of the surface of the first part 63a of the second element bonding conductor layer 63, and an opposite end of each wire 78 is bonded to the surface of the second part 44Ab of the anode conductor layer 44A.

Additionally, the source conductor layer 64 of the second assembly 60 is connected to the Q2 terminal conductor layer 45 of the first assembly 40 by means of a plurality of wires 79 extending substantially in the X direction. More specifically, one end of each wire 79 is bonded to the +X direction-side end of the surface of the source conductor layer 64, and an opposite end of each wire 79 is bonded to the −X direction-side end of the surface of the first part 45a of the Q2 terminal conductor layer 45.

Figure 17:
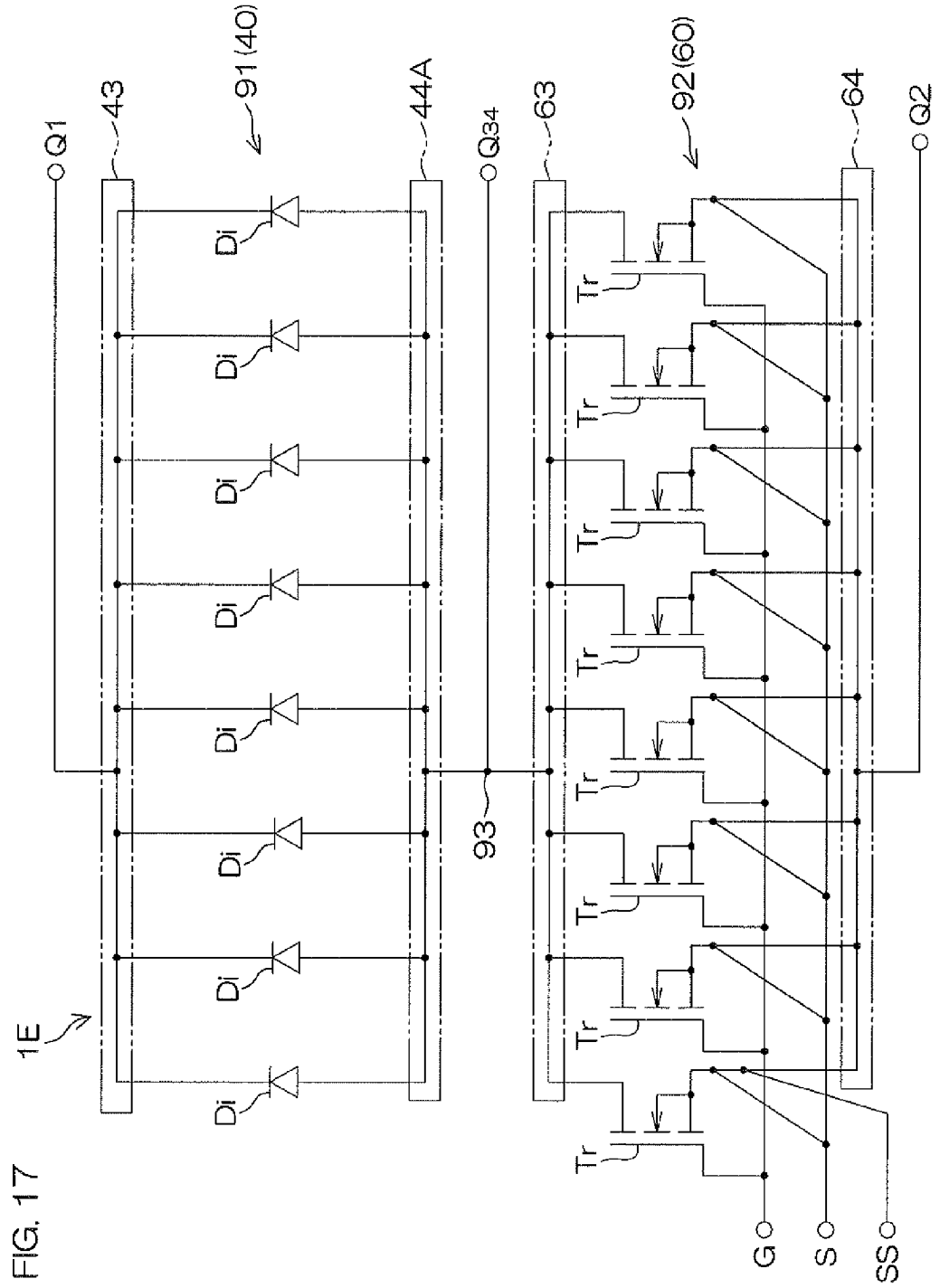
FIG. 17 is an electric circuit diagram to describe an electric arrangement of the semiconductor module shown in FIG. 16.

FIG. 17 is an electric circuit diagram to describe an electric arrangement of the semiconductor module 1E. In FIG. 17, the two terminals Q3 and Q4 are shown as a single terminal Q34.

A plurality of diode elements Di provided in the first assembly 40 are connected together in parallel between the first element bonding conductor layer 43 and the anode conductor layer 44A, and form an upper arm circuit (high-side circuit) 91. More specifically, cathodes of the diode elements Di are connected to the first element bonding conductor layer 43. Anodes of the diodes Di are connected to the anode conductor layer 44A.

A plurality of switching elements Tr provided in the second assembly 60 are connected together in parallel between the second element bonding conductor layer 63 and the source conductor layer 64, and form a lower arm circuit (low-side circuit) 92. More specifically, drains of the switching elements Tr are connected to the second element bonding conductor layer 63. Sources of the switching elements Tr are connected to the second source conductor layer 64. Gates of the switching elements Tr are connected to the gate terminal G. Additionally, the sources of the switching elements Tr are connected also to the source terminal S. Still additionally, the source of the single switching element Tr is connected also to the source sense terminal SS.

The upper arm circuit 91 and the lower arm circuit 92 are connected together in series between the terminal Q1 and the terminal Q2, and the terminal Q34 is connected to a connection point 93 between the upper arm circuit 91 and the lower arm circuit 92.

Figure 18:
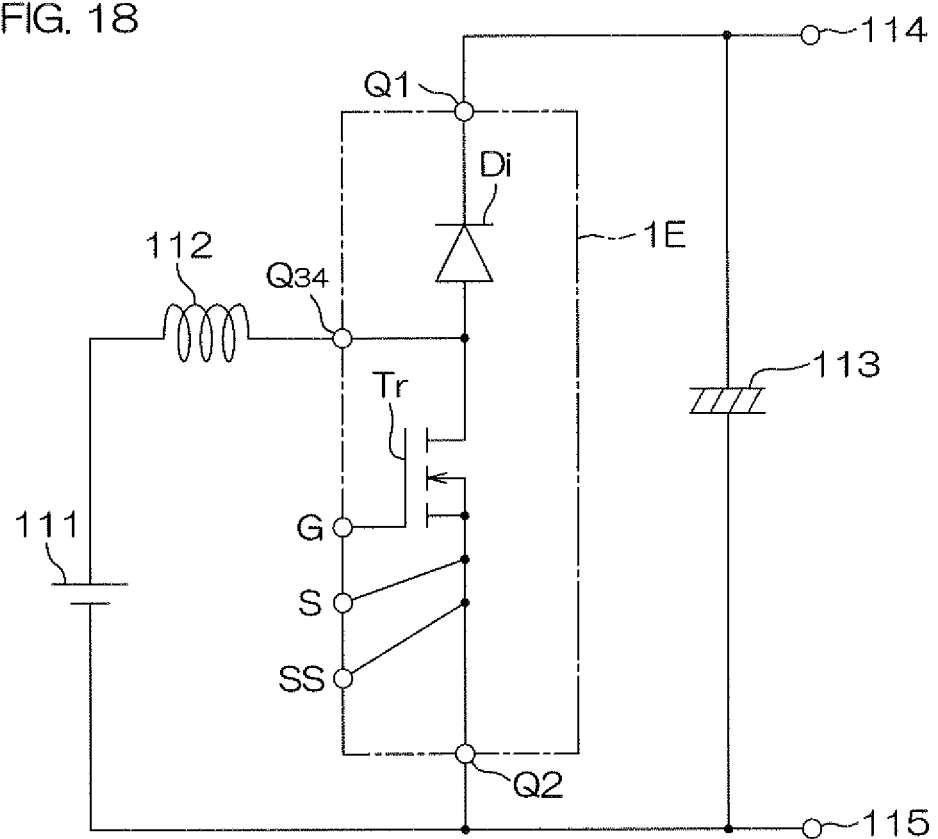
FIG. 18 is an electric circuit diagram when the semiconductor module shown in FIG. 16 is used for a boosting circuit.

FIG. 18 is an electric circuit diagram when the semiconductor module 1E of FIG. 16 is used for a boosting circuit. In this boosting circuit, the terminal $Q_{34}$ of the semiconductor module 1E is connected to a positive terminal of a power source 111 through a coil 112. The terminal Q1 of the semiconductor module 1E is connected to a first output terminal 114 of the boosting circuit. The terminal Q2 of the semiconductor module 1E is connected to a second output terminal 115 of the boosting circuit, and is connected to a negative terminal of the power source 111. A capacitor 113 is connected between a connection point between the terminal Q1 and the first output terminal 114 and a connection point between the terminal Q2 and the second output terminal 115.

When the switching element Tr is turned on, an electric current flows through the coil 112, and energy is stored in the coil 112. When the switching element Tr is turned off, the coil 112 works to hold an immediately previous current value, and hence supplies electric power so as to replenish the first output terminal 114 with a voltage. In other words, a boosting operation is performed. Afterward, the boosting operation is repeatedly performed by turning the switching element Tr on and off.

Figure 19:
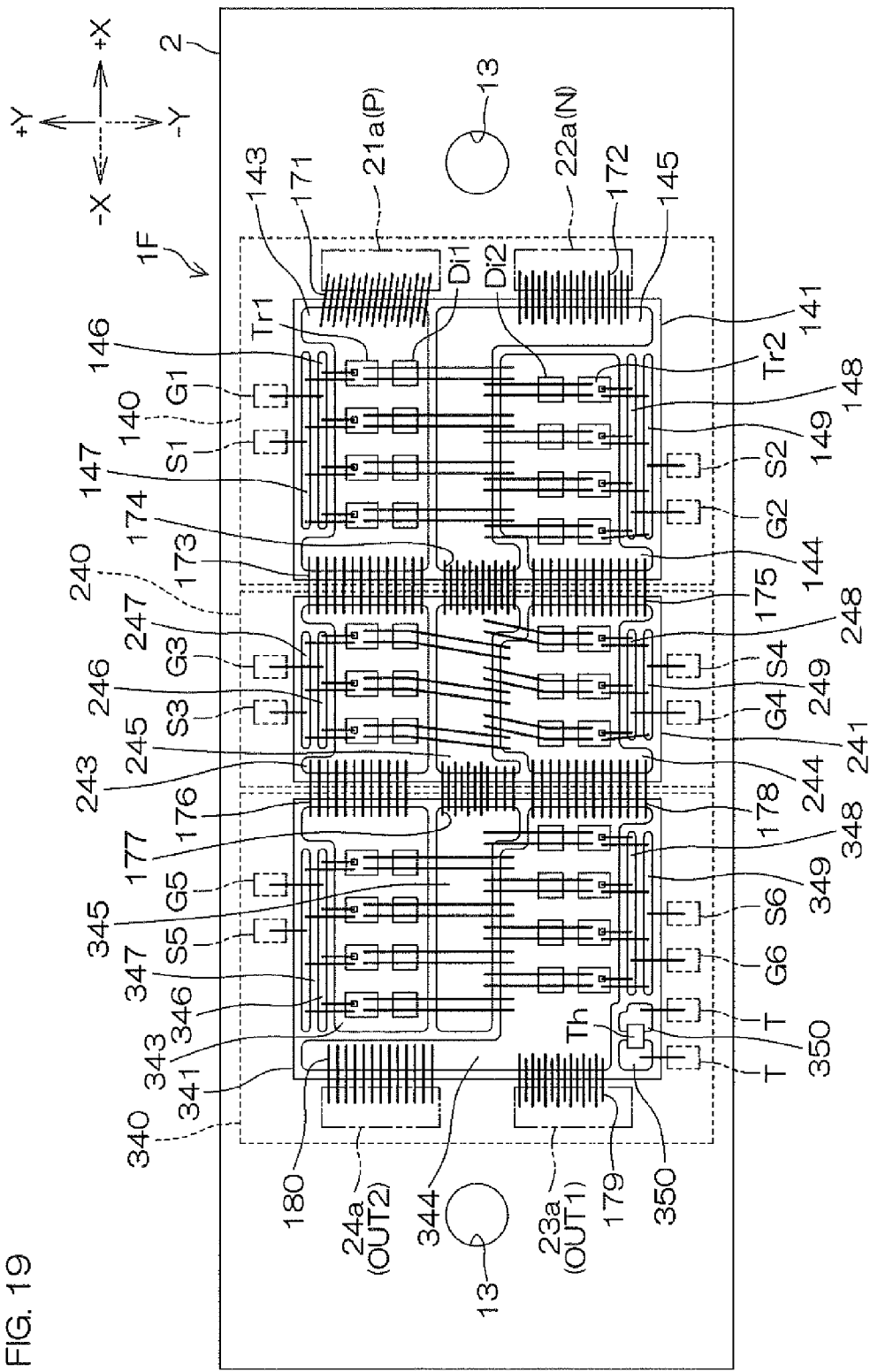
FIG. 19 is a plan view showing a semiconductor module according to a ninth embodiment of the present invention.
Figure 20:
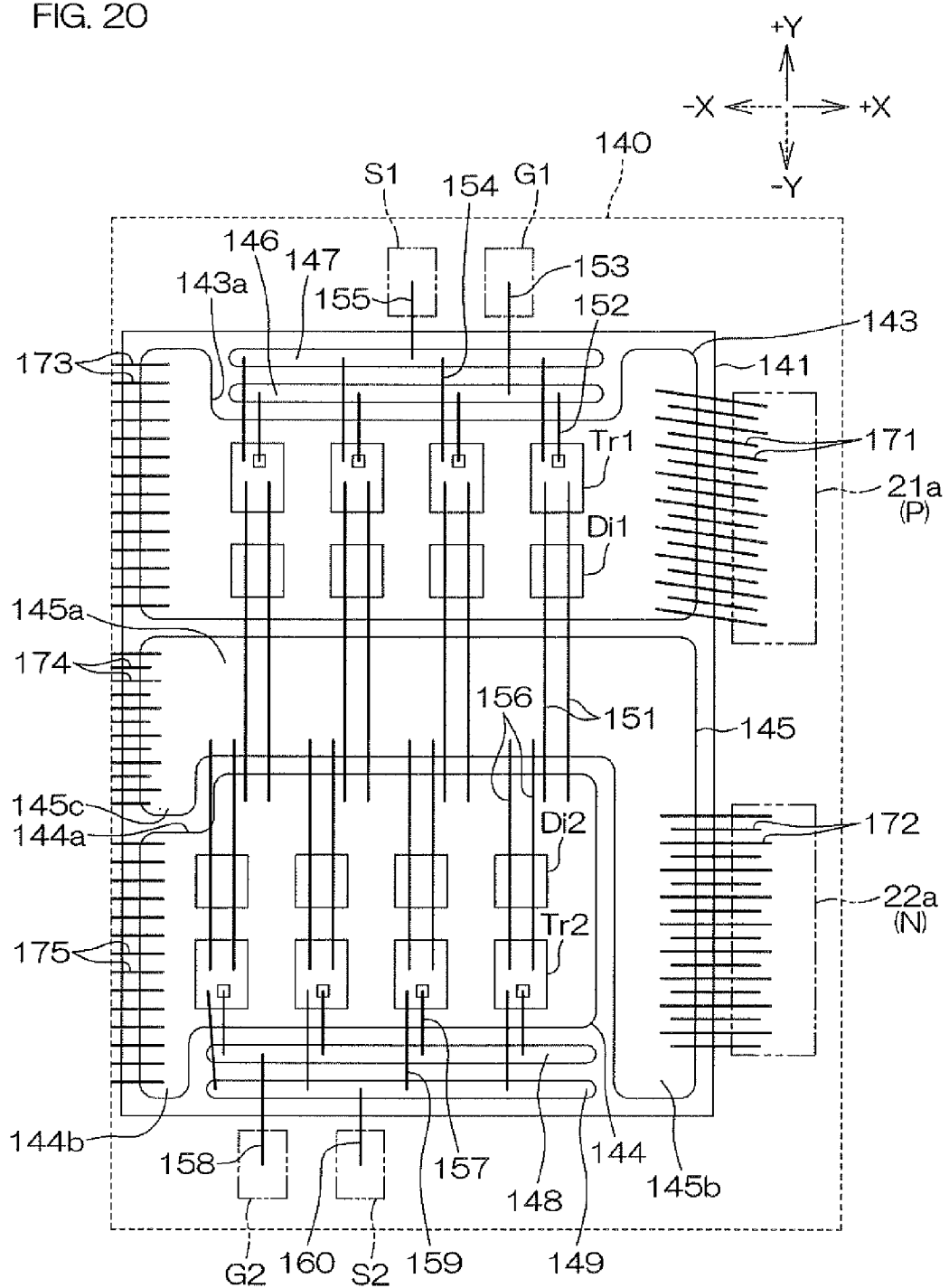
FIG. 20 is a partially enlarged plan view showing a first substrate assembly of the semiconductor module shown in FIG. 19.
Figure 21:
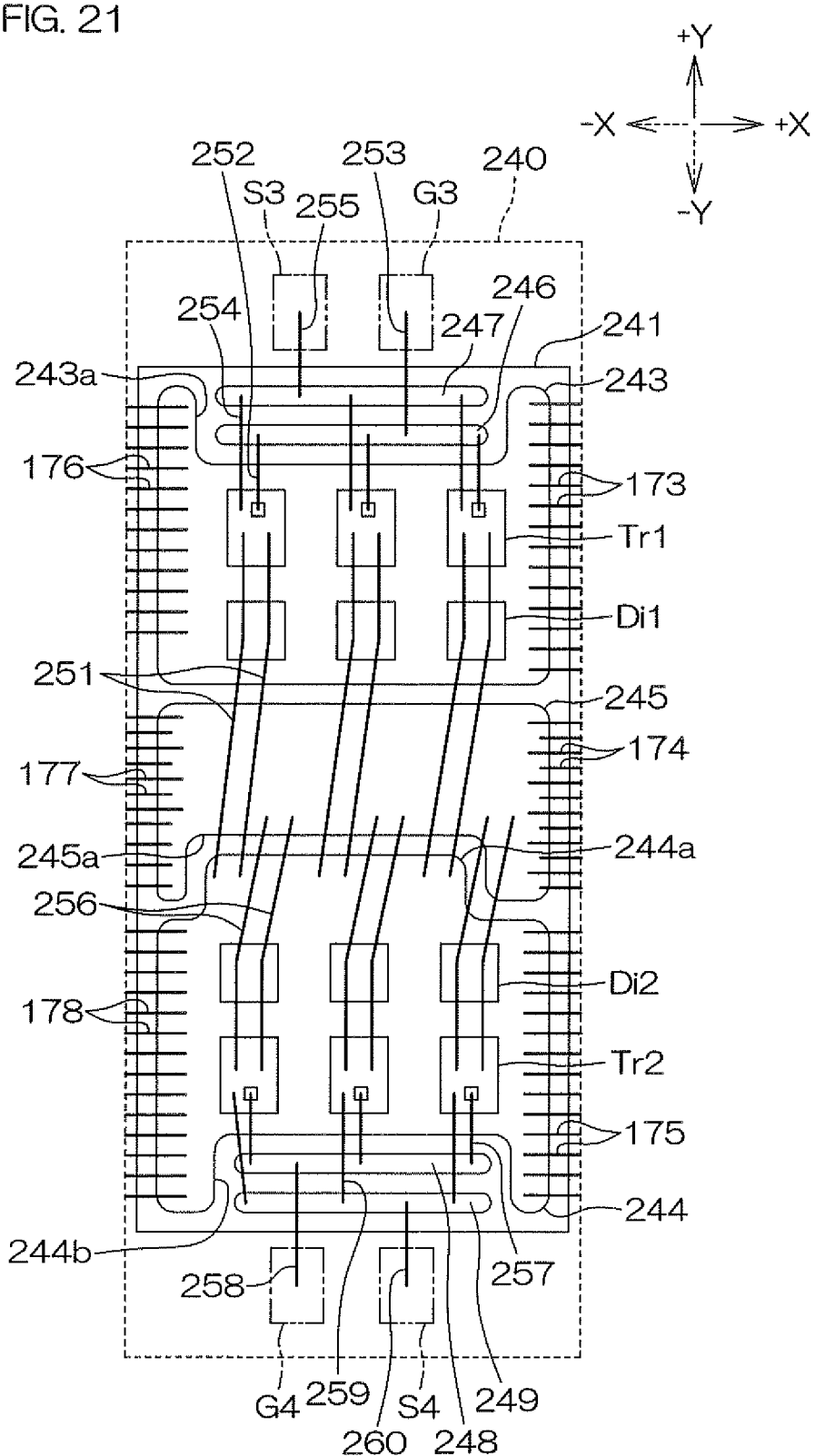
FIG. 21 is a partially enlarged plan view showing a second substrate assembly of the semiconductor module shown in FIG. 19.
Figure 22:
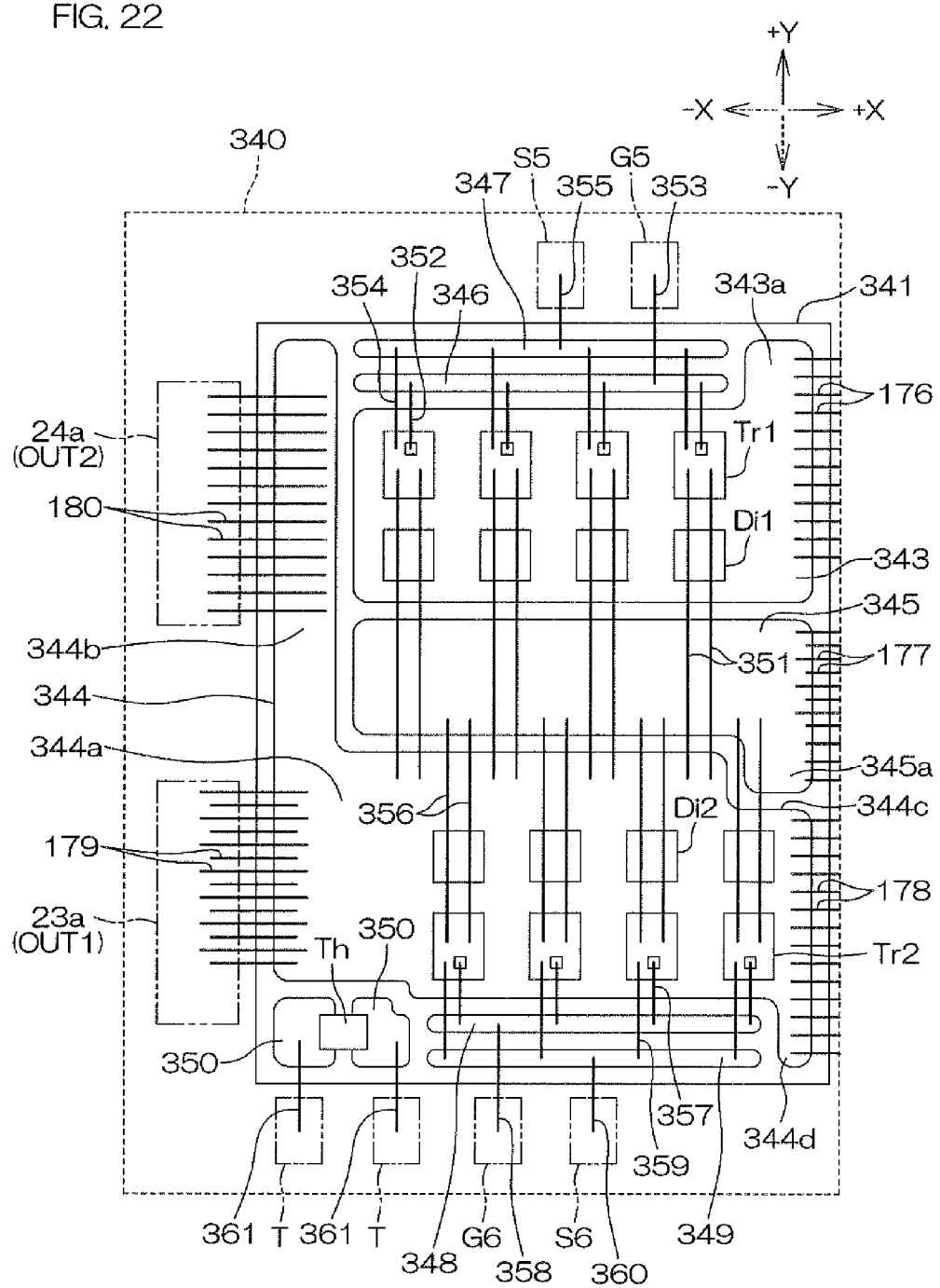
FIG. 22 is a partially enlarged plan view showing a third substrate assembly of the semiconductor module shown in FIG. 19.

FIG. 19 is a plan view showing a semiconductor module according to a ninth embodiment of the present invention. FIG. 20 to FIG. 22 are partially-enlarged plan views of FIG. 19, respectively. The case of this semiconductor module 1F has a structure similar to that of the case 3 of the semiconductor module according to the third embodiment shown in FIG. 7 to FIG. 9 although the case is omitted in FIG. 19 to FIG. 22. However, the case of the semiconductor module 1F differs from the case 3 of the third embodiment in the number and positions of gate terminals and the number and positions of source terminals, and differs therefrom in the fact that the semiconductor module 1F is provided with a pair of thermistor terminals.

In FIG. 19, internal wiring connection portions 21a, 22a, 23a, and 24a of a first power supply terminal P, a second power supply terminal N, a first output terminal OUT1 and a second output terminal OUT2 which are provided in the case, are shown by chain lines. Additionally, in FIG. 19 to FIG. 22, exposed parts in the case of six source terminals S1 to S6, six gate terminals G1 to G6 and a pair of thermistor terminals T which are provided in the case, are shown by chain lines.

A first substrate assembly 140, a second substrate assembly 240, and a third substrate assembly 340 are arranged side by side in the X direction in an area surrounded by a frame portion (not shown) of the case in the surface of the heat dissipation plate 2. A surface on which the substrate assemblies 140, 240, and 340 are disposed, which is one of the two principal planes of the heat dissipation plate 2, is defined as a first plane, and the direction that the first plane faces is defined as a +Z direction. Additionally, a surface that is one of the two principal planes of the heat dissipation plate 2 and that is opposite to the first plane is defined as a second plane, and the direction that the second plane faces is defined as a −Z direction.

The second substrate assembly 240 is disposed at a widthwise center part of the surface of the heat dissipation plate 2. The first substrate assembly 140 is disposed on the +X direction side (on the side closer to the electrode terminals P and N) of the second substrate assembly 240. The third substrate assembly 340 is disposed on the −X direction side (on the side closer to the output terminals OUT1 and OUT2) of the second substrate assembly 240.

Referring to FIG. 19 and FIG. 20, the first substrate assembly 140 includes a first insulating substrate 141, a plurality of first switching elements Tr1, a plurality of first diode elements Di1, a plurality of second switching elements Tr2, and a plurality of second diode elements Di2.

The first insulating substrate 141 is formed substantially in a rectangle when viewed planarly, and is bonded to the surface of the heat dissipation plate 2 in a posture in which the four sides of the first insulating substrate 141 are parallel to the four sides of the heat dissipation plate 2, respectively. A bonding conductor layer (not shown) is formed on a surface (−Z direction-side surface) on the heat-dissipation-plate side (2) of the first insulating substrate 141. This bonding conductor layer is bonded to the heat dissipation plate 2 through a solder layer (not shown). A first element bonding conductor layer 143, a second element bonding conductor layer 144, a first N terminal conductor layer 145, a first gate terminal conductor layer 146, a first source terminal conductor layer 147, a second gate terminal conductor layer 148, and a second source terminal conductor layer 149 are formed on the surface (+Z direction-side surface) opposite to the heat dissipation plate 2 of the first insulating substrate 141.

In the present embodiment, the first insulating substrate 141 is made of AlN. For example, a substrate (DBC: Direct Bonding Copper) in which a copper foil is bonded directly to both sides of ceramics can be used as the first insulating substrate 141. If a DBC substrate is used as the first insulating substrate 141, each of the conductor layers 143 to 149 can be made of its copper foil.

The first N terminal conductor layer 145 has a first part 145a that is formed in a rectangular shape longer in the X direction when viewed planarly and with which a middle in the Y direction in the surface of the first insulating substrate 141 is covered and a second part 145b that extends in the −Y direction from the +X direction-side end of the first part 145a. A projection 145c that protrudes in the −Y direction is formed at the −X direction-side end of the first part 145a. A forward end of the second part 145b extends close to a side on the −Y direction side of the first insulating substrate 141.

The first element bonding conductor layer 143 is disposed between a side on the +Y direction side of the first insulating substrate 141 and the first part 145a of the first N terminal conductor layer 145, and is formed in a rectangular shape longer in the X direction when viewed planarly. The first element bonding conductor layer 143 has a rectangular cutout 143a longer in the X direction at its +Y direction-side edge. This cutout 143a is formed so as to be concave inwardly (in the −Y direction) from an intermediate part between both ends of a side in the +Y direction of the first element bonding conductor layer 143.

The second element bonding conductor layer 144 is disposed between the side on the −Y direction side of the first insulating substrate 141 and the first part 145a of the first N terminal conductor layer 145, and is formed in a rectangular shape longer in the X direction when viewed planarly. The second element bonding conductor layer 144 has a cutout 144a formed so as to be concave inwardly at a +Y direction-side end in the −X direction-side end. The projection 145c of the first N terminal conductor layer 145 enters the inside of the cutout 144a. Additionally, a projection 144b that protrudes in the −Y direction is formed at the −X direction-side end of the second element bonding conductor layer 144.

The first gate terminal conductor layer 146 is formed in a rectangle slender in the X direction when viewed planarly, and is disposed in the cutout 143a of the first element bonding conductor layer 143. The first source terminal conductor layer 147 is formed in a rectangle slender in the X direction when viewed planarly, and is disposed between the first gate terminal conductor layer 146 and the side on the +Y direction side of the first insulating substrate 141.

The second gate terminal conductor layer 148 is formed in a rectangle slender in the X direction when viewed planarly, and is disposed between the projection 144b of the second element bonding conductor layer 144 and the forward end of the second part 145b of the first N terminal conductor layer 145. The second source terminal conductor layer 149 is formed in a rectangle slender in the X direction when viewed planarly, and is disposed between the second gate terminal conductor layer 148 and the side on the −Y direction side of the first insulating substrate 141.

Drain electrodes of the first switching elements Tr1 are bonded to the surface of the first element bonding conductor layer 143 through a solder layer (not shown), and cathode electrodes of the first diode elements Di1 are bonded thereto through a solder layer (not shown). Each first switching element Tr1 has a source electrode and a gate electrode on a surface opposite to the surface bonded to the first element bonding conductor layer 143. Each first diode element Di1 has an anode electrode on the surface opposite to the surface bonded to the first element bonding conductor layer 143.

Four first diode elements Di1 are spaced at intervals side by side in the X direction in an area closer to a side on the −Y direction side of the surface of the first element bonding conductor layer 143. Additionally, four first switching elements Tr1 are spaced at intervals side by side in the X direction between a side on the +Y direction side of the first element bonding conductor layer 143 and the four first diode elements Di1. The four first switching elements Tr1 positionally coincide with the four first diode elements Di1 with respect to the Y direction.

A pair of first switching elements Tr1 on both sides among the four first switching elements Tr1 and a pair of first diode elements Di1 on both sides among the four first diode elements Di1 face both ends of a long side on the +Y direction side of the second element bonding conductor layer 144, respectively.

The first switching element Tr1 and the first diode element Di1 positionally coinciding with each other in the Y direction are connected to the +Y direction-side edge of the surface of the second element bonding conductor layer 144 by means of two wires 151 extending substantially in the Y direction when viewed planarly. More specifically, one end of each wire 151 is bonded to the source electrode of the first switching element Tr1, and the other end of each wire 151 is bonded to the surface of the second element bonding conductor layer 144, and an intermediate part of each wire 151 is bonded to the anode electrode of the first diode element Di1. In other words, the components are connected together by stitch bonding in which either one of the source electrode of the first switching element Tr1 and the second element bonding conductor layer 144 is used as a start point, and the other one is used as an end point, and the anode electrode of the first diode element Di1 is used as a relay point. In the present embodiment, the source electrode of the first switching element Tr1 is used as a start point, and the second element bonding conductor layer 144 is used as an end point.

The arrangement width as the whole of the plurality of wires 151 (i.e., width in the X direction, which is hereinafter referred to as the "entire arrangement width") covers substantially the entire width of a long side of the second element bonding conductor layer 144 (long side on the +Y direction side). Therefore, inductance caused by the wires 151 can be reduced because the entire arrangement width of the wires 151 can be enlarged. As a result, the self-inductance of the semiconductor module 1F can be reduced.

The gate electrode of each first switching element Tr1 is connected to the first gate terminal conductor layer 146 by means of a wire 152. The first gate terminal conductor layer 146 is connected to the first gate terminal G1 by means of a wire 153. The source electrode of each first switching element Tr1 is connected to the first source terminal conductor layer 147 by means of a wire 154. The first source terminal conductor layer 147 is connected to the first source terminal S1 by means of a wire 155.

Drain electrodes of the second switching elements Tr2 are bonded to the surface of the second element bonding conductor layer 144 through a solder layer (not shown), and cathode electrodes of the second diode elements Di2 are bonded thereto through a solder layer (not shown). Each second switching element Tr2 has a source electrode and a gate electrode on a surface opposite to the surface bonded to the second element bonding conductor layer 144. Each second diode element Di2 has an anode electrode on the surface opposite to the surface bonded to the second element bonding conductor layer 144.

Four second switching elements Tr2 are spaced at intervals side by side in the X direction in an area closer to a side on the −Y direction side of the surface of the second element bonding conductor layer 144. Additionally, four second diode elements Di2 are spaced at intervals side by side in the X direction between a side on the +Y direction side of the second element bonding conductor layer 144 and the four second switching elements Tr2. The four second diode elements Di2 positionally coincide with the four second switching elements Tr2 with respect to the Y direction. The four second switching elements Tr2 are disposed at positions deviated in the −X direction with respect to the four first switching elements Tr1, respectively.

A pair of second switching elements Tr2 on both sides among the four second switching elements Tr2 and a pair of second diode elements Di2 on both sides among the four second diode elements Di2 face both ends of a long side on the −Y direction side of the first part 145a of the first N terminal conductor layer 145, respectively.

The second switching element Tr2 and the second diode element Di2 positionally coinciding with each other in the Y direction are connected to the −Y direction-side edge of the surface of the first part 145a of the first N terminal conductor layer 145 by means of two wires 156 extending substantially in the Y direction when viewed planarly. More specifically, one end of each wire 156 is bonded to the source electrode of the second switching element Tr2, and the other end of each wire 156 is bonded to the surface of the first N terminal conductor layer 145, and an intermediate part of each wire 156 is bonded to the anode electrode of the second diode element Di2. In other words, the components are connected together by stitch bonding in which either one of the source electrode of the second switching element Tr2 and the first N terminal conductor layer 145 is used as a start point, and the other one is used as an end point, and the anode electrode of the second diode element Di2 is used as a relay point. In the present embodiment, the source electrode of the second switching element Tr2 is used as a start point, and the first N terminal conductor layer 145 is used as an end point.

The entire arrangement width as the whole of the plurality of wires 156 covers substantially the entire width of a long side of the first part 145a of the first N terminal conductor layer 145 (long side on the −Y direction side). Therefore, inductance caused by the wires 156 can be reduced because the entire arrangement width of the wires 156 can be enlarged. As a result, the self-inductance of the semiconductor module 1F can be reduced.

The gate electrode of each second switching element Tr2 is connected to the second gate terminal conductor layer 148 by means of a wire 157. The second gate terminal conductor layer 148 is connected to the second gate terminal G2 by means of a wire 158. The source electrode of each second switching element Tr2 is connected to the second source terminal conductor layer 149 by means of a wire 159. The second source terminal conductor layer 149 is connected to the second source terminal S2 by means of a wire 160.

The first element bonding conductor layer 143 is connected to the internal wiring connection portion 21a of the first power supply terminal P by means of a plurality of wires 171 extending substantially in the X direction when viewed planarly. More specifically, one end of each wire 171 is bonded to the +X direction-side edge of the surface of the first element bonding conductor layer 143, and an opposite end of each wire 171 is bonded to the surface of the internal wiring connection portion 21a of the first power supply terminal P. These wires 171 are disposed in parallel with each other when viewed planarly. Additionally, the adjoining wires 171 differ from each other in length. Corresponding ends of the adjoining wires 171 are disposed at positions mutually deviated in the length direction of those wires 171 when viewed from the width direction of the whole of the wires 171. As a result, bonded parts of the adjoining wires 171 to the first element bonding conductor layer 143 or to the first power supply terminal P do not easily overlap with each other, and therefore the interval between the adjoining wires 171 can be narrowed, and it becomes easy to make an inspection (inspection by use of images) of the bonded parts of the wires 171.

The first N terminal conductor layer 145 is connected to the internal wiring connection portion 22a of the second power supply terminal N by means of a plurality of wires 172 extending in the X direction when viewed planarly. More specifically, one end of each wire 172 is bonded to the +X direction-side edge of the surface of the second part 145b of the first N terminal conductor layer 145, and an opposite end of each wire 172 is bonded to the surface of the internal wiring connection portion 22a of the second power supply terminal N. These wires 172 are disposed in parallel with each other when viewed planarly. Additionally, the adjoining wires 172 differ from each other in length. Corresponding ends of the adjoining wires 172 are disposed at positions mutually deviated in the length direction of those wires 172 when viewed from the width direction of the whole of the wires 172.

Referring to FIG. 19 and FIG. 21, the second substrate assembly 240 includes a second insulating substrate 241, a plurality of first switching elements Tr1, a plurality of first diode elements Di1, a plurality of second switching elements Tr2, and a plurality of second diode elements Di2.

The second insulating substrate 241 is formed substantially in a rectangle when viewed planarly, and is bonded to the surface of the heat dissipation plate 2 in a posture in which the four sides of the second insulating substrate 241 are parallel to the four sides of the heat dissipation plate 2, respectively. The length in the Y direction of the second insulating substrate 241 is substantially equal to the length in the Y direction of the first insulating substrate 141. On the other hand, the length in the X direction of the second insulating substrate 241 is smaller than the length in the X direction of the first insulating substrate 141. For example, the length in the X direction of the second insulating substrate 241 is about ⅔ of the length in the X direction of the first insulating substrate 141.

A bonding conductor layer (not shown) is formed on a surface (−Z direction-side surface) on the heat-dissipation-plate side (2) of the second insulating substrate 241. This bonding conductor layer is bonded to the heat dissipation plate 2 through a solder layer (not shown). A third element bonding conductor layer 243, a fourth element bonding conductor layer 244, a second N terminal conductor layer 245, a third gate terminal conductor layer 246, a third source terminal conductor layer 247, a fourth gate terminal conductor layer 248, and a fourth source terminal conductor layer 249 are formed on the surface (+Z direction-side surface) opposite to the heat dissipation plate 2 of the second insulating substrate 241.

In the present embodiment, the second insulating substrate 241 is made of AlN. For example, a substrate (DBC substrate) in which a copper foil is bonded directly to both sides of ceramics can be used as the second insulating substrate 241. If a DBC substrate is used as the second insulating substrate 241, each of the conductor layers 243 to 249 can be made of its copper foil.

The second N terminal conductor layer 245 is formed in a rectangular shape longer in the X direction when viewed planarly, and covers a part around the middle in the Y direction in the surface of the second insulating substrate 241. The second N terminal conductor layer 245 has a rectangular cutout 245a longer in the X direction at its −Y direction-side edge. This cutout 245a is formed so as to be concave inwardly (in the +Y direction) from an intermediate part between both ends of a side in the −Y direction of the second N terminal conductor layer 245.

The third element bonding conductor layer 243 is disposed between a side on the +Y direction side of the second insulating substrate 241 and the second N terminal conductor layer 245, and is formed in a rectangular shape longer in the X direction when viewed planarly. The third element bonding conductor layer 243 has a cutout 243a formed in a rectangle longer in the X direction at a +Y direction-side edge. This cutout 243a is formed so as to be concave inwardly (in the −Y direction) from an intermediate part between both ends of a side in the +Y direction of the third element bonding conductor layer 243.

The fourth element bonding conductor layer 244 is disposed between a side on the −Y direction side of the second insulating substrate 241 and the second N terminal conductor layer 245, and is formed substantially in a rectangle when viewed planarly. The fourth element bonding conductor layer 244 has a projection 244a that protrudes in the +Y direction at a lengthwise intermediate part of a +Y direction-side edge. The projection 244a enters the inside of the cutout 245a of the second N terminal conductor layer 245. The fourth element bonding conductor layer 244 additionally has a cutout 244b formed in a rectangle longer in the X direction at a −Y direction-side edge. This cutout 244b is formed so as to be concave inwardly (in the +Y direction) from an intermediate part between both ends of a side in the −Y direction of the fourth element bonding conductor layer 244.

The third gate terminal conductor layer 246 is formed in a rectangle slender in the X direction when viewed planarly, and is disposed in the cutout 243a of the third element bonding conductor layer 243. The third source terminal conductor layer 247 is formed in a rectangle slender in the X direction when viewed planarly, and is disposed between the third gate terminal conductor layer 246 and the side on the +Y direction side of the second insulating substrate 241.

The fourth gate terminal conductor layer 248 is formed in a rectangle slender in the X direction when viewed planarly, and is disposed in the cutout 244b of the fourth element bonding conductor layer 244. The fourth source terminal conductor layer 249 is formed in a rectangle slender in the X direction when viewed planarly, and is disposed between the fourth gate terminal conductor layer 248 and the side on the −Y direction side of the second insulating substrate 241.

Drain electrodes of the first switching elements Tr1 are bonded to the surface of the third element bonding conductor layer 243 through a solder layer (not shown), and cathode electrodes of the first diode elements Di1 are bonded thereto through a solder layer (not shown). Each first switching element Tr1 has a source electrode and a gate electrode on a surface opposite to the surface bonded to the third element bonding conductor layer 243. Each first diode element Di1 has an anode electrode on the surface opposite to the surface bonded to the third element bonding conductor layer 243.

Three first diode elements Di1 are spaced at intervals side by side in the X direction in an area closer to a side on the −Y direction side of the surface of the third element bonding conductor layer 243. Additionally, three first switching elements Tr1 are spaced at intervals side by side in the X direction between a side on the +Y direction side of the third element bonding conductor layer 243 and the three first diode elements Di1. The three first switching elements Tr1 positionally coincide with the three first diode elements Di1 with respect to the Y direction.

A pair of first switching elements Tr1 on both sides among the three first switching elements Tr1 and a pair of first diode elements Di1 on both sides among the three first diode elements Di1 face both ends of the +Y direction-side edge (projection 244a) of the fourth element bonding conductor layer 244, respectively.

The first switching element Tr1 and the first diode element Di1 positionally coinciding with each other in the Y direction are connected to the +Y direction-side edge of the surface of the fourth element bonding conductor layer 244 by means of two wires 251 extending substantially in the Y direction when viewed planarly. More specifically, one end of each wire 251 is bonded to the source electrode of the first switching element Tr1, and the other end of each wire 251 is bonded to the surface of the fourth element bonding conductor layer 244, and an intermediate part of each wire 251 is bonded to the anode electrode of the first diode element Di1. In other words, the components are connected together by stitch bonding in which either one of the source electrode of the first switching element Tr1 and the fourth element bonding conductor layer 244 is used as a start point, and the other one is used as an end point, and the anode electrode of the first diode element Di1 is used as a relay point. In the present embodiment, the source electrode of the first switching element Tr1 is used as a start point, and the fourth element bonding conductor layer 244 is used as an end point.

The entire arrangement width as the whole of the plurality of wires 251 covers substantially the entire width of a long side of the fourth element bonding conductor layer 244 (long side on the +Y direction side). Therefore, inductance caused by the wires 251 can be reduced because the entire arrangement width of the wires 251 can be enlarged. As a result, the self-inductance of the semiconductor module 1F can be reduced.

The gate electrode of each first switching element Tr1 is connected to the third gate terminal conductor layer 246 by means of a wire 252. The third gate terminal conductor layer 246 is connected to the third gate terminal G3 by means of a wire 253. The source electrode of each first switching element Tr1 is connected to the third source terminal conductor layer 247 by means of a wire 254. The third source terminal conductor layer 247 is connected to the third source terminal S3 by means of a wire 255.

Drain electrodes of the second switching elements Tr2 are bonded to the surface of the fourth element bonding conductor layer 244 through a solder layer (not shown), and cathode electrodes of the second diode elements Di2 are bonded thereto through a solder layer (not shown). Each second switching element Tr2 has a source electrode and a gate electrode on a surface opposite to the surface bonded to the fourth element bonding conductor layer 244. Each second diode element Di2 has an anode electrode on the surface opposite to the surface bonded to the fourth element bonding conductor layer 244.

Three second switching elements Tr2 are spaced at intervals side by side in the X direction in an area closer to a side on the −Y direction side of the surface of the fourth element bonding conductor layer 244. Additionally, three second diode elements Di2 are spaced at intervals side by side in the X direction between a side on the +Y direction side of the fourth element bonding conductor layer 244 and the three second switching elements Tr2. The three second diode elements Di2 positionally coincide with the three second switching elements Tr2 with respect to the Y direction. The three second switching elements Tr2 positionally coincide with the three first switching elements Tr1 with respect to the Y direction.

A pair of second switching elements Tr2 on both sides among the three second switching elements Tr2 and a pair of second diode elements Di2 on both sides among the three second diode elements Di2 face both ends of the −Y direction-side edge of the second N terminal conductor layer 245, respectively.

The second switching element Tr2 and the second diode element Di2 positionally coinciding with each other in the Y direction are connected to the −Y direction-side edge of the surface of the second N terminal conductor layer 245 by means of two wires 256 extending substantially in the Y direction when viewed planarly. More specifically, one end of each wire 256 is bonded to the source electrode of the second switching element Tr2, and the other end of each wire 256 is bonded to the surface of the second N terminal conductor layer 245, and an intermediate part of each wire 256 is bonded to the anode electrode of the second diode element Di2. In other words, the components are connected together by stitch bonding in which either one of the source electrode of the second switching element Tr2 and the second N terminal conductor layer 245 is used as a start point, and the other one is used as an end point, and the anode electrode of the second diode element Di2 is used as a relay point. In the present embodiment, the source electrode of the second switching element Tr2 is used as a start point, and the second N terminal conductor layer 245 is used as an end point.

The entire arrangement width as the whole of the plurality of wires 256 covers substantially the entire width of the −Y direction-side edge of the second N terminal conductor layer 245. Therefore, inductance caused by the wires 256 can be reduced because the entire arrangement width of the wires 256 can be enlarged. As a result, the self-inductance of the semiconductor module 1F can be reduced.

The gate electrode of each second switching element Tr2 is connected to the fourth gate terminal conductor layer 248 by means of a wire 257. The fourth gate terminal conductor layer 248 is connected to the fourth gate terminal G4 by means of a wire 258. The source electrode of each second switching element Tr2 is connected to the fourth source terminal conductor layer 249 by means of a wire 259. The fourth source terminal conductor layer 249 is connected to the fourth source terminal S4 by means of a wire 260.

The third element bonding conductor layer 243 is connected to the first element bonding conductor layer 143 of the first substrate assembly 140 by means of a plurality of wires 173 extending in the X direction when viewed planarly. More specifically, one end of each wire 173 is bonded to the +X direction-side edge of the surface of the third element bonding conductor layer 243, and an opposite end of each wire 173 is bonded to the −X direction-side edge of the surface of the first element bonding conductor layer 143. These wires 173 are disposed in parallel with each other when viewed planarly.

The second N terminal conductor layer 245 is connected to the first N terminal conductor layer 145 of the first substrate assembly 140 by means of a plurality of wires 174 extending in the X direction when viewed planarly. More specifically, one end of each wire 174 is bonded to the +X direction-side edge of the surface of the second N terminal conductor layer 245, and an opposite end of each wire 174 is bonded to the −X direction-side edge of the surface of the first part 145a of the first N terminal conductor layer 145. These wires 174 are disposed in parallel with each other when viewed planarly. Additionally, the adjoining wires 174 differ from each other in length. Corresponding ends of the adjoining wires 174 are disposed at positions mutually deviated in the length direction of those wires 174 when viewed from the width direction of the whole of the wires 174.

The fourth element bonding conductor layer 244 is connected to the second element bonding conductor layer 144 of the first substrate assembly 140 by means of a plurality of wires 175 extending in the X direction when viewed planarly. More specifically, one end of each wire 175 is bonded to the +X direction-side edge of the surface of the fourth element bonding conductor layer 244, and an opposite end of each wire 175 is bonded to the −X direction-side edge of the surface of the second element bonding conductor layer 144. These wires 175 are disposed in parallel with each other when viewed planarly.

Referring to FIG. 19 and FIG. 22, the third substrate assembly 340 includes a third insulating substrate 341, a plurality of first switching elements Tr1, a plurality of first diode elements Di1, a plurality of second switching elements Tr2, and a plurality of second diode elements Di2.

The third insulating substrate 341 is formed substantially in a rectangle that is substantially equal in shape and in size to the first insulating substrate 141 when viewed planarly, and is bonded to the surface of the heat dissipation plate 2 in a posture in which the four sides of the third insulating substrate 341 are parallel to the four sides of the heat dissipation plate 2, respectively. A bonding conductor layer (not shown) is formed on a surface (−Z direction-side surface) on the heat-dissipation-plate side (2) of the third insulating substrate 341. This bonding conductor layer is bonded to the heat dissipation plate 2 through a solder layer (not shown). A fifth element bonding conductor layer 343, a sixth element bonding conductor layer 344, a third N terminal conductor layer 345, a fifth gate terminal conductor layer 346, a fifth source terminal conductor layer 347, a sixth gate terminal conductor layer 348, a sixth source terminal conductor layer 349, and a pair of thermistor bonding conductor layers 350 are formed on the surface (+Z direction-side surface) opposite to the heat dissipation plate 2 of the third insulating substrate 341.

In the present embodiment, the third insulating substrate 341 is made of AlN. For example, a substrate (DBC substrate) in which a copper foil is bonded directly to both sides of ceramics can be used as the third insulating substrate 341. If a DBC substrate is used as the third insulating substrate 341, each of the conductor layers 343 to 350 can be made of its copper foil.

The third N terminal conductor layer 345 is formed in a rectangular shape longer in the X direction when viewed planarly, and covers a part around the middle in the Y direction of the surface of the third insulating substrate 341. A projection 345a that protrudes in the −Y direction is formed at the X direction-side end of the third N terminal conductor layer 345.

The fifth element bonding conductor layer 343 is disposed between a side on the +Y direction side of the third insulating substrate 341 and the third N terminal conductor layer 345, and is formed in a rectangular shape longer in the X direction when viewed planarly. The fifth element bonding conductor layer 343 has a projection 343a that protrudes in the +Y direction at the +X direction-side end.

The sixth element bonding conductor layer 344 is disposed between a side on the −Y direction side of the third insulating substrate 341 and the third N terminal conductor layer 345, and has a first part 344a that is formed in a rectangular shape longer in the X direction when viewed planarly and a second part 344b that extends in the +Y direction from the −X direction-side end of the first part 344a. The second part 344b passes through the space between a side on the −X direction side of the third insulating substrate 341 and the third N terminal conductor layer 345 and the fifth element bonding conductor layer 343, and extends close to the side on the +Y direction side of the third insulating substrate 341. A cutout 344c is formed so as to be concave inwardly at the +Y direction-side end in the +X direction-side end of the first part 344a. The projection 345a of the third N terminal conductor layer 345 enters the inside of the cutout 344c. Additionally, a projection 344d that protrudes in the −Y direction is formed at the +X direction-side end of the first part 344a.

The fifth gate terminal conductor layer 346 is formed in a rectangle slender in the X direction when viewed planarly, and is disposed between the projection 343a of the fifth element bonding conductor layer 343 and the forward end of the second part 344b of the sixth element bonding conductor layer 344. The fifth source terminal conductor layer 347 is formed in a rectangle slender in the X direction when viewed planarly, and is disposed between the fifth gate terminal conductor layer 346 and the side on the +Y direction side of the third insulating substrate 341.

The pair of thermistor bonding conductor layers 350 are spaced in the X direction near the side on the −X direction side of the third insulating substrate 341 between the side on the −Y direction side of the third insulating substrate 341 and a side on the −Y direction side of the first part 344a of the sixth element bonding conductor layer 344.

The sixth gate terminal conductor layer 348 is formed in a rectangle slender in the X direction when viewed planarly, and is disposed between the projection 344d of the sixth element bonding conductor layer 344 and the thermistor bonding conductor layer 350. The sixth source terminal conductor layer 349 is formed in a rectangle slender in the X direction when viewed planarly, and is disposed between the sixth gate terminal conductor layer 348 and the side on the −Y direction side of the third insulating substrate 341.

Drain electrodes of the first switching elements Tr1 are bonded to the surface of the fifth element bonding conductor layer 343 through a solder layer (not shown), and cathode electrodes of the first diode elements Di1 are bonded thereto through a solder layer (not shown). Each first switching element Tr1 has a source electrode and a gate electrode on a surface opposite to the surface bonded to the fifth element bonding conductor layer 343. Each first diode element Di1 has an anode electrode on the surface opposite to the surface bonded to the fifth element bonding conductor layer 343.

Four first diode elements Di1 are spaced at intervals side by side in the X direction in an area closer to a side on the −Y direction side of the surface of the fifth element bonding conductor layer 343. Additionally, four first switching elements Tr1 are spaced at intervals side by side in the X direction between a side on the +Y direction side of the fifth element bonding conductor layer 343 and the four first diode elements Di1. The four first switching elements Tr1 positionally coincide with the four first diode elements Di1 with respect to the Y direction.

A pair of first switching elements Tr1 on both sides among the four first switching elements Tr1 and a pair of first diode elements Di1 on both sides among the four first diode elements Di1 face both ends of a long side on the +Y direction side of the first part 344a of the sixth element bonding conductor layer 344, respectively.

The first switching element Tr1 and the first diode element Di1 positionally coinciding with each other in the Y direction are connected to the +Y direction-side edge of the surface of the first part 344a of the sixth element bonding conductor layer 344 by means of two wires 351 extending substantially in the Y direction when viewed planarly. More specifically, one end of each wire 351 is bonded to the source electrode of the first switching element Tr1, and the other end of each wire 351 is bonded to the surface of the sixth element bonding conductor layer 344, and an intermediate part of each wire 351 is bonded to the anode electrode of the first diode element Di1. In other words, the components are connected together by stitch bonding in which either one of the source electrode of the first switching element Tr1 and the sixth element bonding conductor layer 344 is used as a start point, and the other one is used as an end point, and the anode electrode of the first diode element Di1 is used as a relay point. In the present embodiment, the source electrode of the first switching element Tr1 is used as a start point, and the sixth element bonding conductor layer 344 is used as an end point.

The entire arrangement width as the whole of the plurality of wires 351 covers substantially the entire width of a long side of the first part 344a of the sixth element bonding conductor layer 344 (long side on the +Y direction side). Therefore, inductance caused by the wires 351 can be reduced because the entire arrangement width of the wires 351 can be enlarged. As a result, the self-inductance of the semiconductor module 1F can be reduced.

The gate electrode of each first switching element Tr1 is connected to the fifth gate terminal conductor layer 346 by means of a wire 352. The fifth gate terminal conductor layer 346 is connected to the fifth gate terminal G5 by means of a wire 353. The source electrode of each first switching element Tr1 is connected to the fifth source terminal conductor layer 347 by means of a wire 354. The fifth source terminal conductor layer 347 is connected to the fifth source terminal S5 by means of a wire 355.

Drain electrodes of the second switching elements Tr2 are bonded to the surface of the first part 344a of the sixth element bonding conductor layer 344 through a solder layer (not shown), and cathode electrodes of the second diode elements Di2 are bonded thereto through a solder layer (not shown). Each second switching element Tr2 has a source electrode and a gate electrode on a surface opposite to the surface bonded to the sixth element bonding conductor layer 344. Each second diode element Di2 has an anode electrode on the surface opposite to the surface bonded to the sixth element bonding conductor layer 344.

Four second switching elements Tr2 are spaced at intervals side by side in the X direction in an area closer to a side on the −Y direction side of the surface of the first part 344a of the sixth element bonding conductor layer 344. Additionally, four second diode elements Di2 are spaced at intervals side by side in the X direction between a side on the +Y direction side of the first part 344a of the sixth element bonding conductor layer 344 and the four second switching elements Tr2. The four second diode elements Di2 positionally coincide with the four second switching elements Tr2 with respect to the Y direction. The four second switching elements Tr2 are disposed at positions deviated in the +X direction with respect to the four first switching elements Tr1, respectively.

A pair of second switching elements Tr2 on both sides among the four second switching elements Tr2 and a pair of second diode elements Di2 on both sides among the four second diode elements Di2 face both ends of a long side on the −Y direction side of the third N terminal conductor layer 345, respectively.

The second switching element Tr2 and the second diode element Di2 positionally coinciding with each other in the Y direction are connected to the −Y direction-side edge of the surface of the third N terminal conductor layer 345 by means of two wires 356 extending substantially in the Y direction when viewed planarly. More specifically, one end of each wire 356 is bonded to the source electrode of the second switching element Tr2, and the other end of each wire 356 is bonded to the surface of the third N terminal conductor layer 345, and an intermediate part of each wire 356 is bonded to the anode electrode of the second diode element Di2. In other words, the components are connected together by stitch bonding in which either one of the source electrode of the second switching element Tr2 and the third N terminal conductor layer 345 is used as a start point, and the other one is used as an end point, and the anode electrode of the second diode element Di2 is used as a relay point. In the present embodiment, the source electrode of the second switching element Tr2 is used as a start point, and the third N terminal conductor layer 345 is used as an end point.

The entire arrangement width as the whole of the plurality of wires 356 covers substantially the entire width of a long side of the third N terminal conductor layer 345 (long side on the −Y direction side). Therefore, inductance caused by the wires 356 can be reduced because the entire arrangement width of the wires 356 can be enlarged. As a result, the self-inductance of the semiconductor module 1F can be reduced.

The gate electrode of each second switching element Tr2 is connected to the sixth gate terminal conductor layer 348 by means of a wire 357. The sixth gate terminal conductor layer 348 is connected to the sixth gate terminal G6 by means of a wire 358. The source electrode of each second switching element Tr2 is connected to the sixth source terminal conductor layer 349 by means of a wire 359. The sixth source terminal conductor layer 349 is connected to the sixth source terminal S6 by means of a wire 360.

A thermistor Th is bonded to the pair of thermistor bonding conductor layers 350. More specifically, a first electrode and a second electrode are formed on the −Z direction-side surface of the thermistor Th, and the first electrode is bonded to one of the thermistor bonding conductor layers 350, and the second electrode is bonded to the other thermistor bonding conductor layer 350. The pair of thermistor bonding conductor layers 350 are connected to the pair of thermistor terminals T through a wire 361, respectively.

The fifth element bonding conductor layer 343 is connected to the third element bonding conductor layer 243 of the second substrate assembly 240 by means of a plurality of wires 176 extending in the X direction when viewed planarly. More specifically, one end of each wire 176 is bonded to the +X direction-side edge of the surface of the fifth element bonding conductor layer 343, and an opposite end of each wire 176 is bonded to the −X direction-side edge of the surface of the third element bonding conductor layer 243. These wires 176 are disposed in parallel with each other when viewed planarly.

The third N terminal conductor layer 345 is connected to the second N terminal conductor layer 245 of the second substrate assembly 240 by means of a plurality of wires 177 extending in the X direction when viewed planarly. More specifically, one end of each wire 177 is bonded to the +X direction-side edge of the surface of the third N terminal conductor layer 345, and an opposite end of each wire 177 is bonded to the −X direction-side edge of the surface of the second N terminal conductor layer 245. These wires 177 are disposed in parallel with each other when viewed planarly.

The sixth element bonding conductor layer 344 is connected to the fourth element bonding conductor layer 244 of the second substrate assembly 240 by means of a plurality of wires 178 extending in the X direction when viewed planarly. More specifically, one end of each wire 178 is bonded to the +X direction-side edge of the surface of the sixth element bonding conductor layer 344, and an opposite end of each wire 178 is bonded to the −X direction-side edge of the surface of the fourth element bonding conductor layer 244. These wires 178 are disposed in parallel with each other when viewed planarly.

Additionally, the sixth element bonding conductor layer 344 is connected to the internal wiring connection portion 23a of the first output terminal OUT1 by means of a plurality of wires 179 extending in the X direction when viewed planarly. More specifically, one end of each wire 179 is bonded to the −X direction-side edge of the surface of the first part 344a of the sixth element bonding conductor layer 344, and an opposite end of each wire 179 is bonded to the internal wiring connection portion 23a of the first output terminal OUT1. These wires 179 are disposed in parallel with each other when viewed planarly. Additionally, the adjoining wires 179 differ from each other in length. Corresponding ends of the adjoining wires 179 are disposed at positions mutually deviated in the length direction of those wires 179 when viewed from the width direction of the whole of the wires 179.

Additionally, the sixth element bonding conductor layer 344 is connected to the internal wiring connection portion 24a of the second output terminal OUT2 by means of a plurality of wires 180 extending in the X direction when viewed planarly. More specifically, one end of each wire 180 is bonded to the surface of the second part 344b of the sixth element bonding conductor layer 344, and an opposite end of each wire 180 is bonded to the internal wiring connection portion 24a of the second output terminal OUT2. These wires 180 are disposed in parallel with each other when viewed planarly.

The heat dissipation plate 2 is deformed so as to become convex toward the −Z direction side as a whole when viewed from the Y direction in the same way as in the first embodiment (see FIG. 2) described above, which is not shown in the drawings.

The first gate terminal G1, the third gate terminal G3, and the fifth gate terminal G5 may be connected together in the case. Likewise, the second gate terminal G2, the fourth gate terminal G4, and the sixth gate terminal G6 may be connected together in the case. If so, only two gate terminals consisting of a single gate terminal representing the first gate terminal G1, the third gate terminal G3, and the fifth gate terminal G5 and a single gate terminal representing the second gate terminal G2, the fourth gate terminal G4, and the sixth gate terminal G6 may be exposed outwardly from the case.

The first source terminal S1, the third source terminal S3, and the fifth source terminal S5 may be connected together in the case. Likewise, the second source terminal S2, the fourth source terminal S4, and the sixth source terminal S6 may be connected together in the case. If so, only two source terminals consisting of a single source terminal representing the first source terminal S1, the third source terminal S3, and the fifth source terminal S5 and a single source terminal representing the second source terminal S2, the fourth source terminal S4, and the sixth source terminal S6 may be exposed outwardly from the case.

Figure 23:
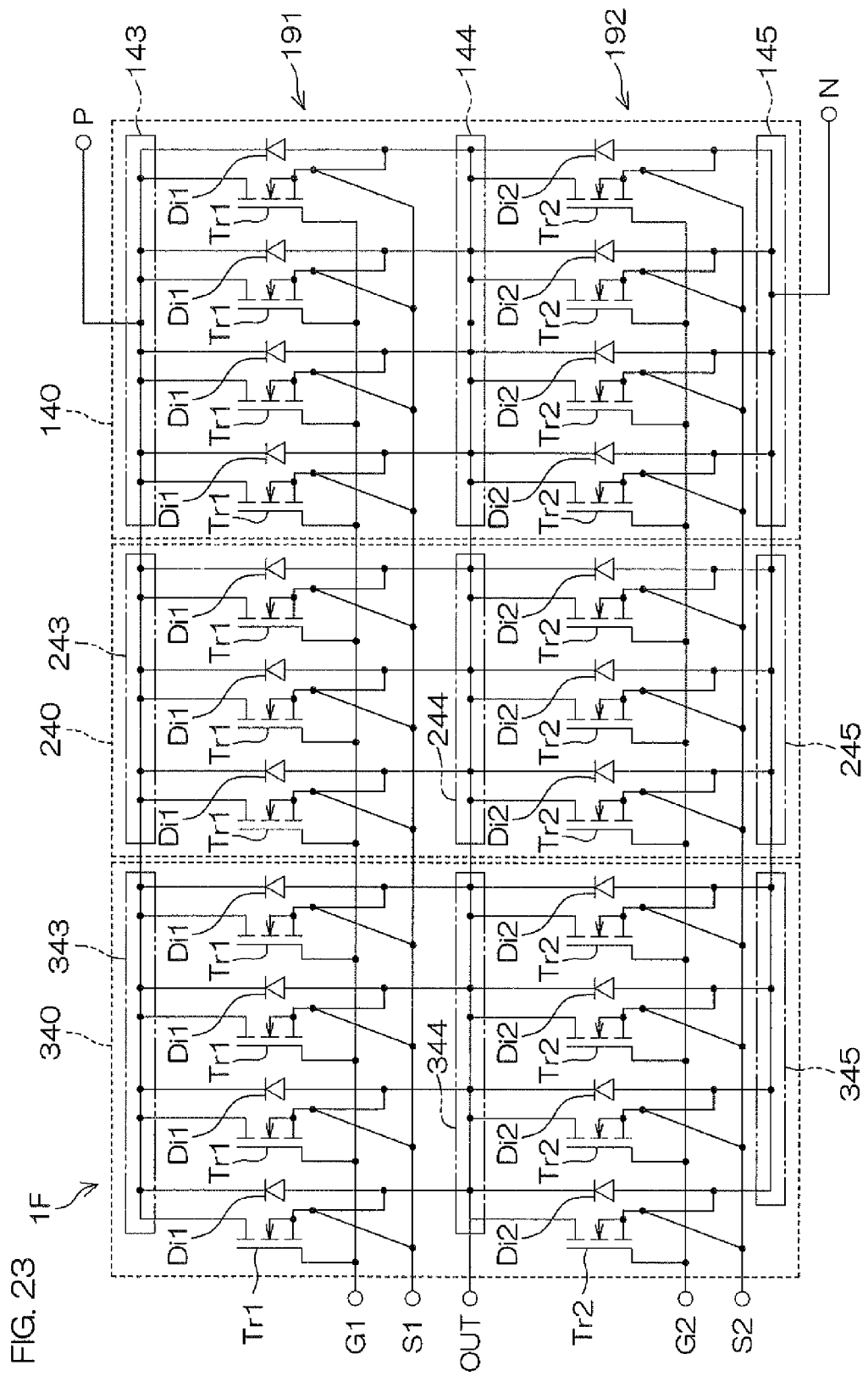
FIG. 23 is an electric circuit diagram to describe an electric arrangement of the semiconductor module shown in FIG. 19.

FIG. 23 is an electric circuit diagram to describe an electric arrangement of the semiconductor module 1F. In FIG. 23, the two output terminals OUT1 and OUT2 are shown as a single output terminal OUT. Additionally, let it be supposed that the first, third, and fifth gate terminals G1, G3, and G5 are connected together in the case, and only the first gate terminal G1 among these gate terminals is exposed outwardly from the case. Additionally, let it be supposed that the second, fourth, and sixth gate terminals G2, G4, and G6 are connected together in the case, and only the second gate terminal G2 among these gate terminals is exposed outwardly from the case.

Additionally, let it be supposed that the first, third, and fifth source terminals S1, S3, and S5 are connected together in the case, and only the first source terminal S1 among these source terminals is exposed outwardly from the case. Additionally, let it be supposed that the second, fourth, and sixth source terminals S2, S4, and S6 are connected together in the case, and only the second source terminal S2 among these source terminals is exposed outwardly from the case.

Four first switching elements Tr1 and four first diode elements Di1 provided in the first substrate assembly 140 are connected together in parallel between the first element bonding conductor layer 143 and the second element bonding conductor layer 144. These parallel circuits will be referred to as a first parallel circuit. The first parallel circuit forms a part of an upper arm circuit (high-side circuit) 191. Four second switching elements Tr2 and four second diode elements Di2 provided in the first substrate assembly 140 are connected together in parallel between the second element bonding conductor layer 144 and the first N terminal conductor layer 145. These parallel circuits will be referred to as a second parallel circuit. The second parallel circuit forms a part of a lower arm circuit (low-side circuit) 192. The first parallel circuit and the second parallel circuit are connected together in series through the second element bonding conductor layer 144.

Three first switching elements Tr1 and three first diode elements Di1 provided in the second substrate assembly 240 are connected together in parallel between the third element bonding conductor layer 243 and the fourth element bonding conductor layer 244. These parallel circuits will be referred to as a third parallel circuit. The third parallel circuit forms a part of the upper arm circuit (high-side circuit) 191. Three second switching elements Tr2 and three second diode elements Di2 provided in the second substrate assembly 240 are connected together in parallel between the fourth element bonding conductor layer 244 and the second N terminal conductor layer 245. These parallel circuits will be referred to as a fourth parallel circuit. The fourth parallel circuit forms a part of the lower arm circuit (low-side circuit) 192. The third parallel circuit and the fourth parallel circuit are connected together in series through the fourth element bonding conductor layer 244.

Four first switching elements Tr1 and four first diode elements Di1 provided in the third substrate assembly 340 are connected together in parallel between the fifth element bonding conductor layer 343 and the sixth element bonding conductor layer 344. These parallel circuits will be referred to as a fifth parallel circuit. The fifth parallel circuit forms a part of the upper arm circuit (high-side circuit) 191. Four second switching elements Tr2 and four second diode elements Di2 provided in the third substrate assembly 340 are connected together in parallel between the sixth element bonding conductor layer 344 and the third N terminal conductor layer 345. These parallel circuits will be referred to as a sixth parallel circuit. The sixth parallel circuit forms a part of the lower arm circuit (low-side circuit) 192. The fifth parallel circuit and the sixth parallel circuit are connected together in series through the sixth element bonding conductor layer 344.

The fifth element bonding conductor layer 343 is connected to the third element bonding conductor layer 243, and the third element bonding conductor layer 243 is connected to the first element bonding conductor layer 143. The first element bonding conductor layer 143 is connected to the first power supply terminal P. The second element bonding conductor layer 144 is connected to the fourth element bonding conductor layer 244, and the fourth element bonding conductor layer 244 is connected to the sixth element bonding conductor layer 344. The sixth element bonding conductor layer 344 is connected to the output terminal OUT. Therefore, the first parallel circuit, the third parallel circuit, and the fifth parallel circuit are connected together in parallel between the first power supply terminal P and the output terminal OUT. In other words, the upper arm circuit (high-side circuit) 191 is formed of the first parallel circuit, the third parallel circuit, and the fifth parallel circuit.

The third N terminal conductor layer 345 is connected to the second N terminal conductor layer 245, and the second N terminal conductor layer 245 is connected to the first N terminal conductor layer 145. The first N terminal conductor layer 145 is connected to the second power supply terminal N. Therefore, the second parallel circuit, the fourth parallel circuit, and the sixth parallel circuit are connected together in parallel between the output terminal OUT and the second power supply terminal N. In other words, the lower arm circuit (low-side circuit) 192 is formed of the second parallel circuit, the fourth parallel circuit, and the sixth parallel circuit.

A half bridge circuit is arranged in this way. This half bridge circuit can be used as a single-phase bridge circuit. Additionally, a multi-phase bridge circuit (for example, three-phase bridge circuit) can be arranged by connecting a plurality of (for example, three) half bridge circuits (semiconductor modules 1), each of which is the aforementioned one, to a power source in parallel.

Figure 24:
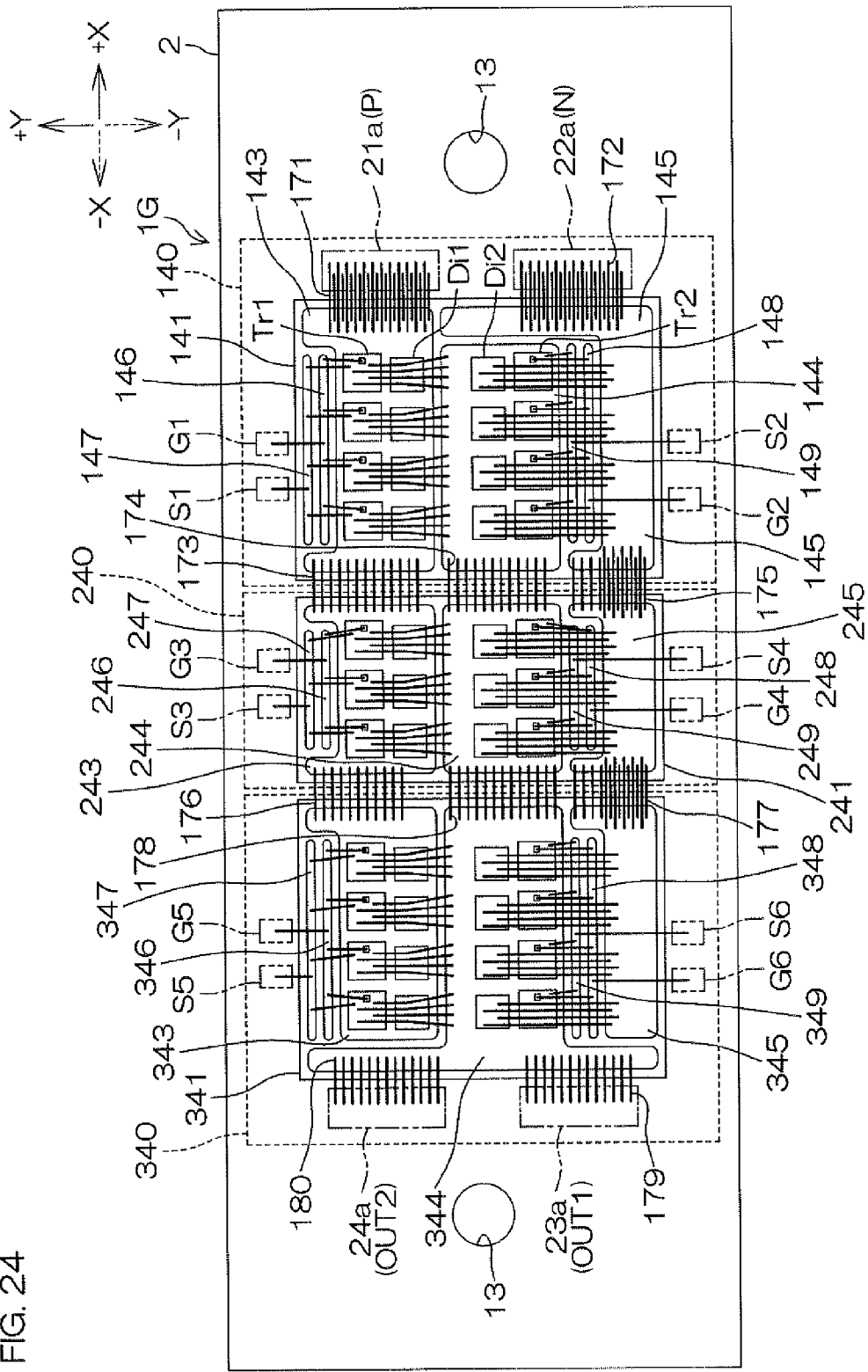
FIG. 24 is a plan view showing a semiconductor module according to a tenth embodiment of the present invention.
Figure 25:
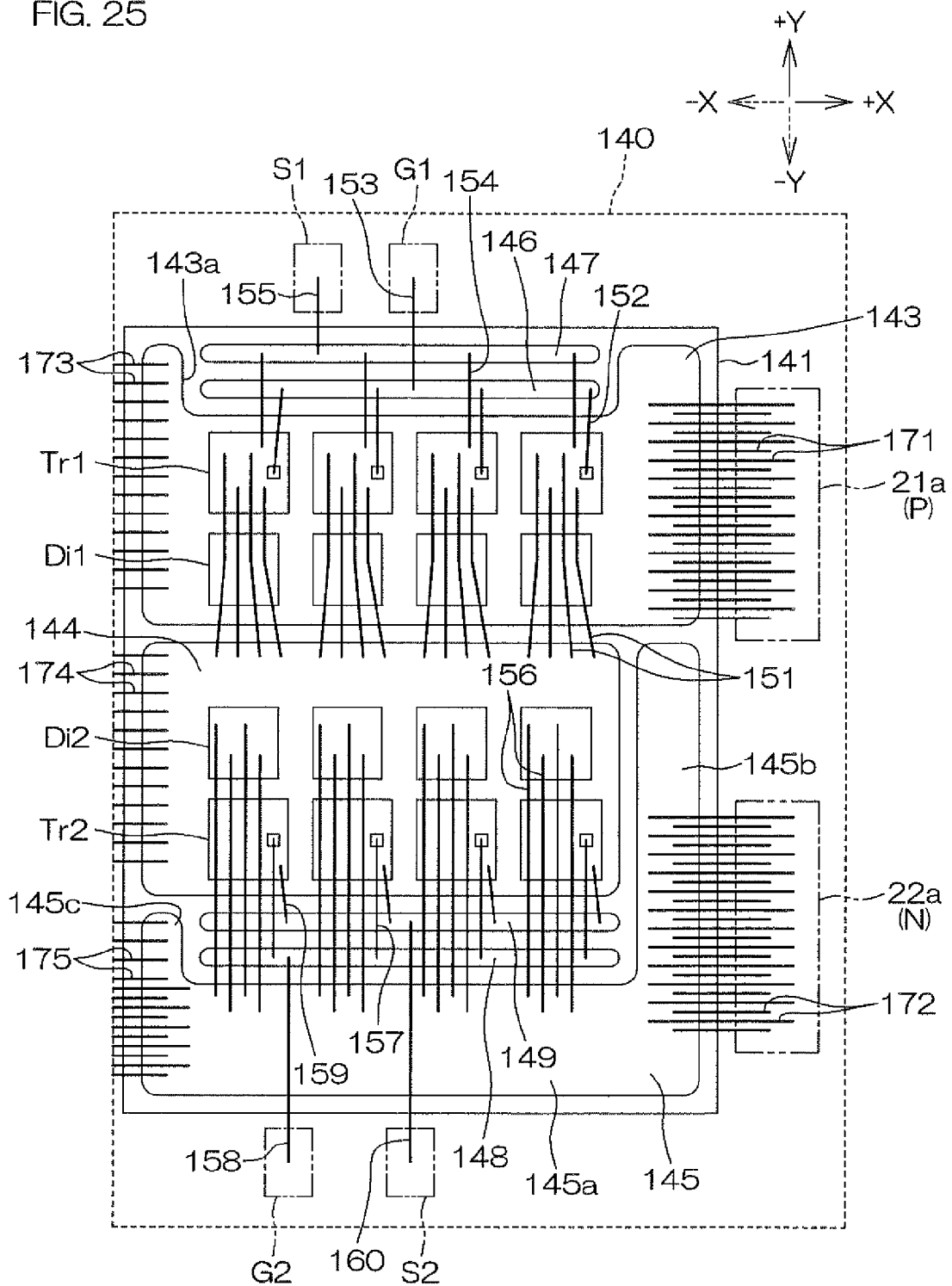
FIG. 25 is a partially enlarged plan view showing a first substrate assembly of the semiconductor module shown in FIG. 24.
Figure 26:
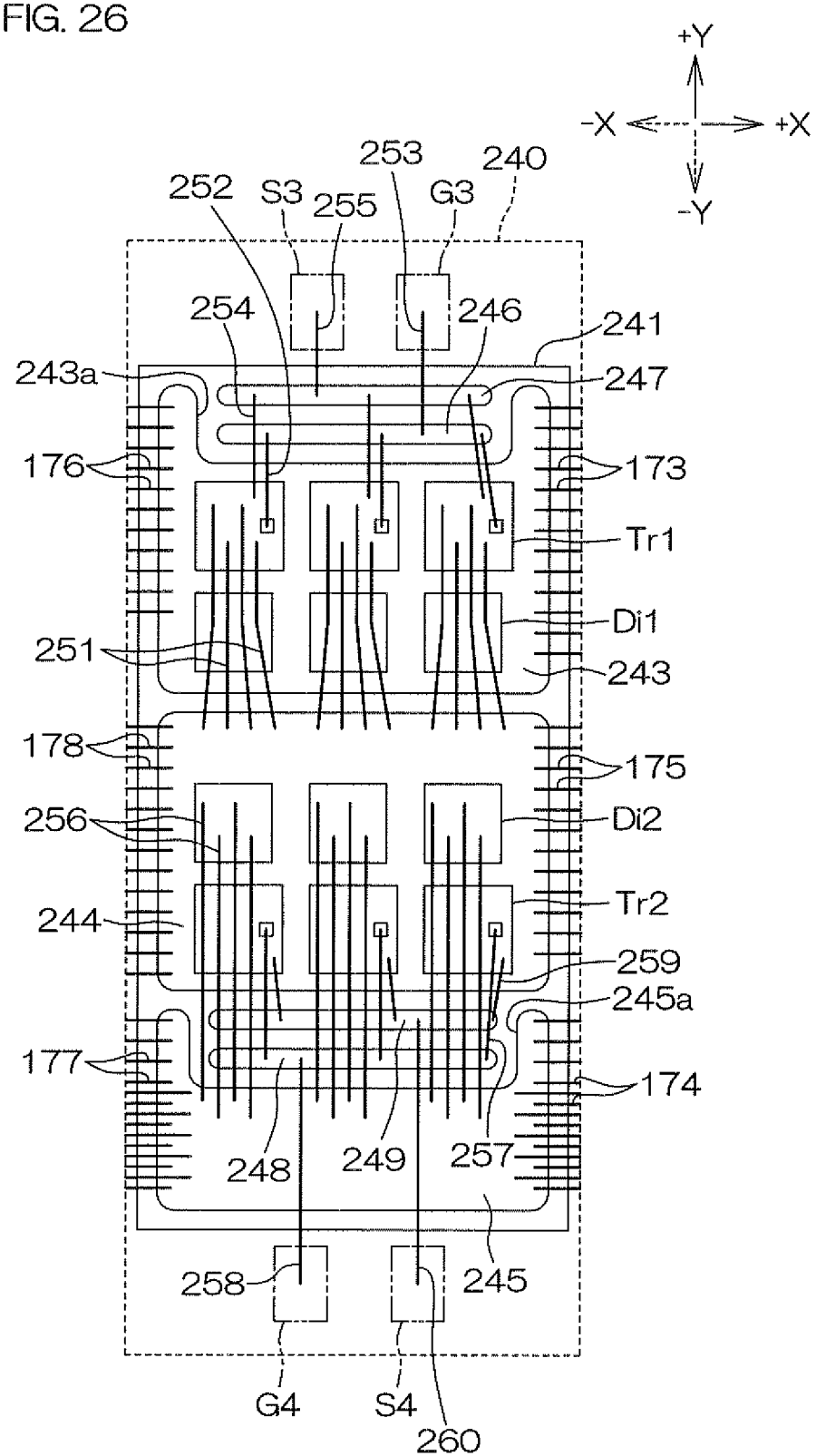
FIG. 26 is a partially enlarged plan view showing a second substrate assembly of the semiconductor module shown in FIG. 24.
Figure 27:
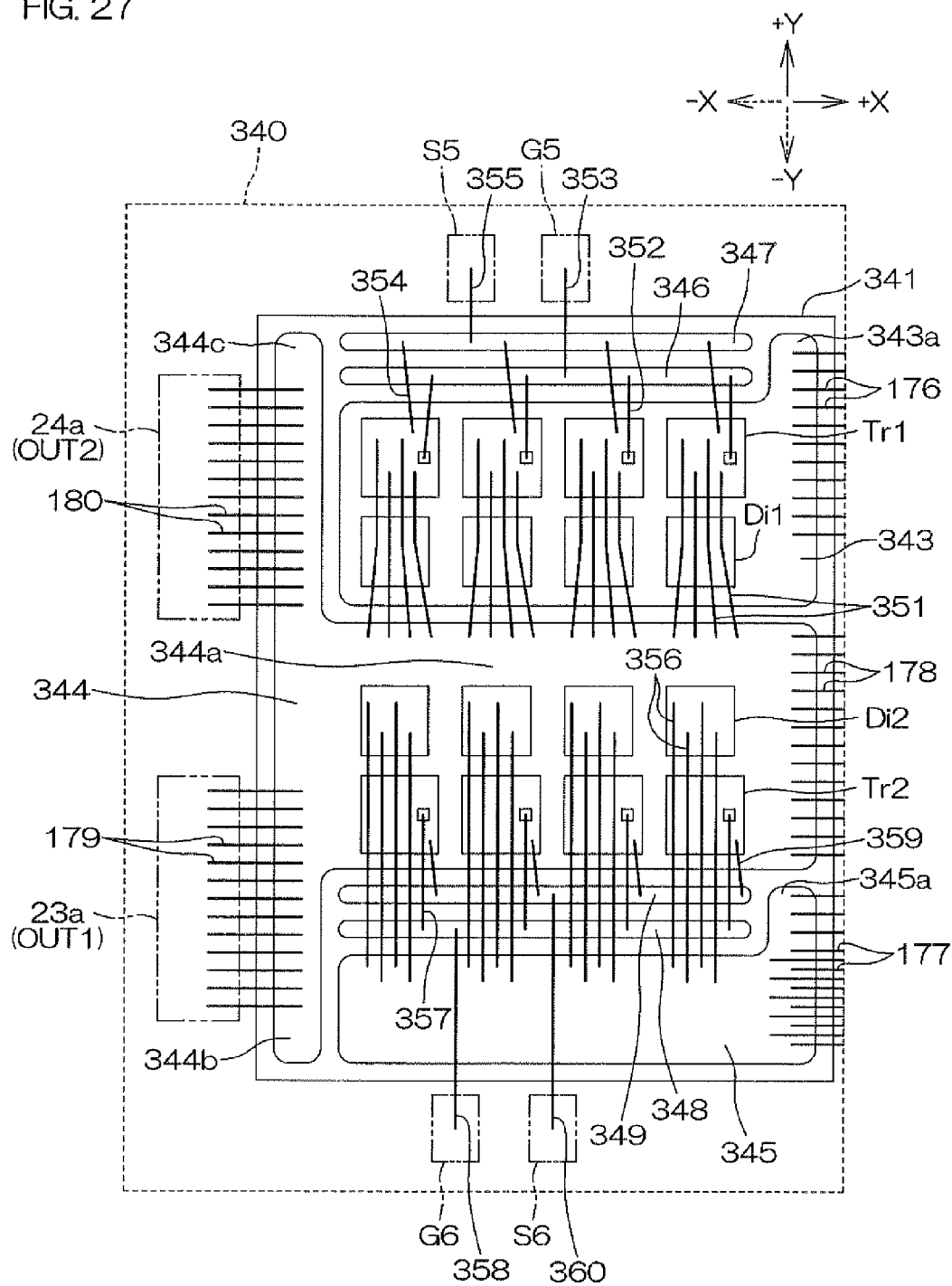
FIG. 27 is a partially enlarged plan view showing a third substrate assembly of the semiconductor module shown in FIG. 24.
Figure 28:
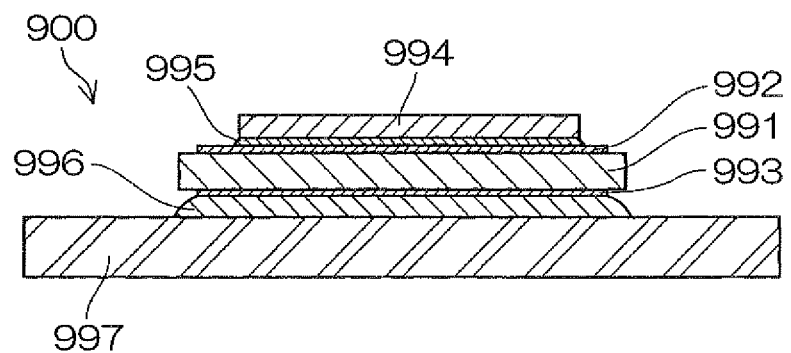
FIG. 28 is a sectional view showing an example of a conventional semiconductor module.

FIG. 24 is a plan view showing a semiconductor module according to a tenth embodiment of the present invention. FIG. 25 to FIG. 27 are partially-enlarged plan views of FIG. 24, respectively. The case of the semiconductor module 1G is similar in structure to the case 3 of the semiconductor module according to the third embodiment shown in FIG. 7 to FIG. 9 although the case is omitted in FIG. 24 to FIG. 27. However, the case of the semiconductor module 1G differs from the case 3 of the third embodiment in number and in position of gate terminals and source terminals.

The semiconductor module 1G is similar to the semiconductor module 1F according to the ninth embodiment. In FIG. 24 to FIG. 27, the same reference sign as in FIG. 19 to FIG. 22 is given to a component corresponding to each component shown in FIG. 19 to FIG. 22.

A first substrate assembly 140, a second substrate assembly 240, and a third substrate assembly 340 are arranged side by side in the X direction in an area surrounded by a frame portion (not shown) of the case in the surface of the heat dissipation plate 2. A surface on which the substrate assemblies 140, 240, and 340 are disposed, which is one of the two principal planes of the heat dissipation plate 2, is defined as a first plane, and the direction that the first plane faces is defined as a +Z direction. Additionally, a surface that is one of the two principal planes of the heat dissipation plate 2 and that is opposite to the first plane is defined as a second plane, and the direction that the second plane faces is defined as a −Z direction.

The second substrate assembly 240 is disposed at a widthwise center part of the surface of the heat dissipation plate 2. The first substrate assembly 140 is disposed on the +X direction side (on the side closer to the electrode terminals P and N) of the second substrate assembly 240. The third substrate assembly 340 is disposed on the −X direction side (on the side closer to the output terminals OUT1 and OUT2) of the second substrate assembly 240.

Referring to FIG. 24 and FIG. 25, the first substrate assembly 140 includes a first insulating substrate 141, a plurality of first switching elements Tr1, a plurality of first diode elements Di1, a plurality of second switching elements Tr2, and a plurality of second diode elements Di2.

The first insulating substrate 141 is formed substantially in a rectangle when viewed planarly, and is bonded to the surface of the heat dissipation plate 2 in a posture in which the four sides of the first insulating substrate 141 are parallel to the four sides of the heat dissipation plate 2, respectively. A bonding conductor layer (not shown) is formed on a surface (−Z direction-side surface) on the heat-dissipation-plate side (2) of the first insulating substrate 141. This bonding conductor layer is bonded to the heat dissipation plate 2 through a solder layer (not shown). A first element bonding conductor layer 143, a second element bonding conductor layer 144, a first N terminal conductor layer 145, a first gate terminal conductor layer 146, a first source terminal conductor layer 147, a second gate terminal conductor layer 148, and a second source terminal conductor layer 149 are formed on the surface (+Z direction-side surface) opposite to the heat dissipation plate 2 of the first insulating substrate 141.

In the present embodiment, the first insulating substrate 141 is made of AlN. For example, a substrate (DBC substrate) in which a copper foil is bonded directly to both sides of ceramics can be used as the first insulating substrate 141. If a DBC substrate is used as the first insulating substrate 141, each of the conductor layers 143 to 149 can be made of its copper foil.

In the tenth embodiment, the second element bonding conductor layer 144 is disposed at an intermediate part in the Y direction of the surface of the first insulating substrate 141. Additionally, the first element bonding conductor layer 143 is disposed on the +Y direction side with respect to the second element bonding conductor layer 144, and the first N terminal conductor layer 145 is disposed on the −Y direction side with respect to the second element bonding conductor layer 144.

The second element bonding conductor layer 144 is formed in a rectangular shape longer in the X direction when viewed planarly, and covers an intermediate part in the Y direction of the surface of the first insulating substrate 141.

The first element bonding conductor layer 143 is disposed between a side on the +Y direction side of the first insulating substrate 141 and the second element bonding conductor layer 144, and is formed in a rectangular shape longer in the X direction when viewed planarly. The length in the X direction of the first element bonding conductor layer 143 is greater than the length in the X direction of the second element bonding conductor layer 144, and a side on the +Y direction side of the first element bonding conductor layer 143 is positioned closer to the side on the +Y direction side of the first insulating substrate 141 than a side on the +Y direction side of the second element bonding conductor layer 144. The first element bonding conductor layer 143 has a cutout 143a formed in a rectangle longer in the X direction at a +Y direction-side edge. This cutout 143a is formed so as to be concave inwardly (in the −Y direction) from an intermediate part between both ends of the side in the +Y direction of the first element bonding conductor layer 143.

The first N terminal conductor layer 145 is formed substantially in the shape of the letter L when viewed planarly, and has a first part 145a along a side on the −Y direction side of the first insulating substrate 141 and a second part 145b that extends in the +Y direction from a +X direction-side end of the first part 145a and that is along a side on the +X direction side of the first insulating substrate 141. The second part 145b passes through the space between the side on the +X direction side of the first insulating substrate 141 and the second element bonding conductor layer 144, and extends close to a side on the −Y direction side of the first element bonding conductor layer 143. A projection 145c that protrudes toward the +Y direction side is formed at an end on the −X direction side of the first part 145a.

The first gate terminal conductor layer 146 is formed in a rectangle slender in the X direction when viewed planarly, and is disposed in the cutout 143a of the first element bonding conductor layer 143. The first source terminal conductor layer 147 is formed in a rectangle slender in the X direction when viewed planarly, and is disposed between the first gate terminal conductor layer 146 and the side on the +Y direction side of the first insulating substrate 141.

The second gate terminal conductor layer 148 is formed in a rectangle slender in the X direction when viewed planarly, and is disposed between the second element bonding conductor layer 144 and the first part 145a of the first N terminal conductor layer 145. The second source terminal conductor layer 149 is formed in a rectangle slender in the X direction when viewed planarly, and is disposed between the second gate terminal conductor layer 148 and the second element bonding conductor layer 144.

Drain electrodes of the first switching elements Tr1 are bonded to the surface of the first element bonding conductor layer 143 through a solder layer (not shown), and cathode electrodes of the first diode elements Di1 are bonded thereto through a solder layer (not shown). Each first switching element Tr1 has a source electrode and a gate electrode on a surface opposite to the surface bonded to the first element bonding conductor layer 143. Each first diode element Di1 has an anode electrode on the surface opposite to the surface bonded to the first element bonding conductor layer 143.

Four first diode elements Di1 are spaced at intervals side by side in the X direction in an area closer to a side on the −Y direction side of the surface of the first element bonding conductor layer 143. Additionally, four first switching elements Tr1 are spaced at intervals side by side in the X direction between the side on the +Y direction side of the first element bonding conductor layer 143 and the four first diode elements Di1. The four first switching elements Tr1 positionally coincide with the four first diode elements Di1 with respect to the Y direction.

A pair of first switching elements Tr1 on both sides among the four first switching elements Tr1 and a pair of first diode elements Di1 on both sides among the four first diode elements Di1 face both ends of a long side on the +Y direction side of the second element bonding conductor layer 144, respectively.

The first switching element Tr1 and the first diode element Di1 positionally coinciding with each other in the Y direction are connected to the +Y direction-side edge of the surface of the second element bonding conductor layer 144 by means of four wires 151 extending substantially in the Y direction when viewed planarly. More specifically, one end of each wire 151 is bonded to the source electrode of the first switching element Tr1, and the other end of each wire 151 is bonded to the surface of the second element bonding conductor layer 144, and an intermediate part of each wire 151 is bonded to the anode electrode of the first diode element Di1. In other words, the components are connected together by stitch bonding in which either one of the source electrode of the first switching element Tr1 and the second element bonding conductor layer 144 is used as a start point, and the other one is used as an end point, and the anode electrode of the first diode element Di1 is used as a relay point. In the present embodiment, the source electrode of the first switching element Tr1 is used as a start point, and the second element bonding conductor layer 144 is used as an end point.

The entire arrangement width as the whole of the plurality of wires 151 covers substantially the entire width of a long side of the second element bonding conductor layer 144 (long side on the +Y direction side). Therefore, inductance caused by the wires 151 can be reduced because the entire arrangement width of the wires 151 can be enlarged. As a result, the self-inductance of the semiconductor module 1G can be reduced.

The gate electrode of each first switching element Tr1 is connected to the first gate terminal conductor layer 146 by means of a wire 152. The first gate terminal conductor layer 146 is connected to the first gate terminal G1 by means of a wire 153. The source electrode of each first switching element Tr1 is connected to the first source terminal conductor layer 147 by means of a wire 154. The first source terminal conductor layer 147 is connected to the first source terminal S1 by means of a wire 155.

Drain electrodes of the second switching elements Tr2 are bonded to the surface of the second element bonding conductor layer 144 through a solder layer (not shown), and cathode electrodes of the second diode elements Di2 are bonded thereto through a solder layer (not shown). Each second switching element Tr2 has a source electrode and a gate electrode on a surface opposite to the surface bonded to the second element bonding conductor layer 144. Each second diode element Di2 has an anode electrode on the surface opposite to the surface bonded to the second element bonding conductor layer 144.

Four second switching elements Tr2 are spaced at intervals side by side in the X direction in an area closer to a side on the −Y direction side of the surface of the second element bonding conductor layer 144. Additionally, four second diode elements Di2 are spaced at intervals side by side in the X direction between the side on the +Y direction side of the second element bonding conductor layer 144 and the four second switching elements Tr2. The four second diode elements Di2 positionally coincide with the four second switching elements Tr2 with respect to the Y direction. The four second switching elements Tr2 positionally coincide with the four first switching elements Tr1 with respect to the Y direction.

A pair of second switching elements Tr2 on both sides among the four second switching elements Tr2 and a pair of second diode elements Di2 on both sides among the four second diode elements Di2 face both ends of a long side on the +Y direction side of the first part 145*a* of the first N terminal conductor layer 145, respectively.

The second switching element Tr2 and the second diode element Di2 positionally coinciding with each other in the Y direction are connected to the +Y direction-side edge of the surface of the first part 145*a* of the first N terminal conductor layer 145 by means of two wires 156 extending substantially in the Y direction when viewed planarly. More specifically, one end of each wire 156 is bonded to the anode electrode of the second diode element Di2, and the other end of each wire 156 is bonded to the surface of the first N terminal conductor layer 145, and an intermediate part of each wire 156 is bonded to the source electrode of the second switching element Tr2. In other words, the components are connected together by stitch bonding in which either one of the anode electrode of the second diode element Di2 and the first N terminal conductor layer 145 is used as a start point, and the other one is used as an end point, and the source electrode of the second switching element Tr2 is used as a relay point. In the present embodiment, the anode electrode of the second diode element Di2 is used as a start point, and the first N terminal conductor layer 145 is used as an end point.

The entire arrangement width as the whole of the plurality of wires 156 covers substantially the entire width of a long side of the first part 145*a* of the first N terminal conductor layer 145 (long side on the −Y direction side). Therefore, inductance caused by the wires 156 can be reduced because the entire arrangement width of the wires 156 can be enlarged. As a result, the self-inductance of the semiconductor module 1G can be reduced.

The gate electrode of each second switching element Tr2 is connected to the second gate terminal conductor layer 148 by means of a wire 157. The second gate terminal conductor layer 148 is connected to the second gate terminal G2 by means of a wire 158. The source electrode of each second switching element Tr2 is connected to the second source terminal conductor layer 149 by means of a wire 159. The second source terminal conductor layer 149 is connected to the second source terminal S2 by means of a wire 160.

The first element bonding conductor layer 143 is connected to the internal wiring connection portion 21*a* of the first power supply terminal P by means of a plurality of wires 171 extending in the X direction when viewed planarly. More specifically, one end of each wire 171 is bonded to the +X direction-side edge of the surface of the first element bonding conductor layer 143, and an opposite end of each wire 171 is bonded to the surface of the internal wiring connection portion 21*a* of the first power supply terminal P. These wires 171 are disposed in parallel with each other when viewed planarly. Additionally, the adjoining wires 171 differ from each other in length. Corresponding ends of the adjoining wires 171 are disposed at positions mutually deviated in the length direction of those wires 171 when viewed from the width direction of the whole of the wires 171.

The first N terminal conductor layer 145 is connected to the internal wiring connection portion 22*a* of the second power supply terminal N by means of a plurality of wires 172 extending in the X direction when viewed planarly. More specifically, one end of each wire 172 is bonded to the +X direction-side edge of the surface of the second part 145*b* of the first N terminal conductor layer 145, and an opposite end of each wire 172 is bonded to the surface of the internal wiring connection portion 22*a* of the second power supply terminal N. These wires 172 are disposed in parallel with each other when viewed planarly. Additionally, the adjoining wires 172 differ from each other in length. Corresponding ends of the adjoining wires 172 are disposed at positions mutually deviated in the length direction of those wires 172 when viewed from the width direction of the whole of the wires 172.

Referring to FIG. 24 and FIG. 26, the second assembly 240 includes a second insulating substrate 241, a plurality of first switching elements Tr1, a plurality of first diode elements Di1, a plurality of second switching elements Tr2, and a plurality of second diode elements Di2.

The second insulating substrate 241 is formed substantially in a rectangle when viewed planarly, and is bonded to the surface of the heat dissipation plate 2 in a posture in which the four sides of the second insulating substrate 241 are parallel to the four sides of the heat dissipation plate 2, respectively. The length in the Y direction of the second insulating substrate 241 is substantially equal to the length in the Y direction of the first insulating substrate 141. On the other hand, the length in the X direction of the second insulating substrate 241 is smaller than the length in the X direction of the first insulating substrate 141. For example, the length in the X direction of the second insulating substrate 241 is about ⅔ of the length in the X direction of the first insulating substrate 141.

A bonding conductor layer (not shown) is formed on a surface (−Z direction-side surface) on the heat-dissipation-plate side (2) of the second insulating substrate 241. This bonding conductor layer is bonded to the heat dissipation plate 2 through a solder layer (not shown). A third element bonding conductor layer 243, a fourth element bonding conductor layer 244, a second N terminal conductor layer 245, a third gate terminal conductor layer 246, a third source terminal conductor layer 247, a fourth gate terminal conductor layer 248, and a fourth source terminal conductor layer 249 are formed on the surface (+Z direction-side surface) opposite to the heat dissipation plate 2 of the second insulating substrate 241.

In the present embodiment, the second insulating substrate 241 is made of AlN. For example, a substrate (DBC substrate) in which a copper foil is bonded directly to both sides of ceramics can be used as the second insulating substrate 241. If a DBC substrate is used as the second insulating substrate 241, each of the conductor layers 243 to 249 can be made of its copper foil.

In the tenth embodiment, the fourth element bonding conductor layer 244 is disposed at an intermediate part in the Y direction of the surface of the second insulating substrate 241. The third element bonding conductor layer 243 is disposed on the +Y direction side with respect to the fourth element bonding conductor layer 244, and the second N terminal conductor layer 245 is disposed on the −Y direction side with respect to the fourth element bonding conductor layer 244.

The fourth element bonding conductor layer 244 is formed in a rectangular shape longer in the X direction when viewed planarly, and covers a middle in the Y direction in the surface of the second insulating substrate 241.

The third element bonding conductor layer 243 is disposed between a side on the +Y direction side of the second insulating substrate 241 and the fourth element bonding conductor layer 244, and is formed in a rectangular shape longer in the X direction when viewed planarly. The third element bonding conductor layer 243 has a rectangular cutout 243a longer in the X direction at its +Y direction-side edge. This cutout 243a is formed so as to be concave inwardly (in the −Y direction) from an intermediate part between both ends of a side in the +Y direction of the third element bonding conductor layer 243.

The second N terminal conductor layer 245 is disposed between a side on the −Y direction side of the second insulating substrate 241 and the fourth element bonding conductor layer 244, and is formed in a rectangular shape longer in the X direction when viewed planarly. The second N terminal conductor layer 245 has a rectangular cutout 245a longer in the X direction at its +Y direction-side edge. This cutout 245a is formed so as to be concave inwardly (in the −Y direction) from an intermediate part between both ends of a side in the +Y direction of the second N terminal conductor layer 245.

The third gate terminal conductor layer 246 is formed in a rectangle slender in the X direction when viewed planarly, and is disposed in the cutout 243a of the third element bonding conductor layer 243. The third source terminal conductor layer 247 is formed in a rectangle slender in the X direction when viewed planarly, and is disposed between the third gate terminal conductor layer 246 and the side on the +Y direction side of the second insulating substrate 241.

The fourth gate terminal conductor layer 248 is formed in a rectangle slender in the X direction when viewed planarly, and is disposed in the cutout 245a of the second N terminal conductor layer 245. The fourth source terminal conductor layer 249 is formed in a rectangle slender in the X direction when viewed planarly, and is disposed between the fourth gate terminal conductor layer 248 and the fourth element bonding conductor layer 244.

Drain electrodes of the first switching elements Tr1 are bonded to the surface of the third element bonding conductor layer 243 through a solder layer (not shown), and cathode electrodes of the first diode elements Di1 are bonded thereto through a solder layer (not shown). Each first switching element Tr1 has a source electrode and a gate electrode on a surface opposite to the surface bonded to the third element bonding conductor layer 243. Each first diode element Di1 has an anode electrode on the surface opposite to the surface bonded to the third element bonding conductor layer 243.

Three first diode elements Di1 are spaced at intervals side by side in the X direction in an area closer to a side on the −Y direction side of the surface of the third element bonding conductor layer 243. Additionally, three first switching elements Tr1 are spaced at intervals side by side in the X direction between a side on the +Y direction side of the third element bonding conductor layer 243 and the three first diode elements Di1. The three first switching elements Tr1 positionally coincide with the three first diode elements Di1 with respect to the Y direction.

A pair of first switching elements Tr1 on both sides among the three first switching elements Tr1 and a pair of first diode elements Di1 on both sides among the three first diode elements Di1 face both ends of the +Y direction-side edge of the fourth element bonding conductor layer 244, respectively.

The first switching element Tr1 and the first diode element Di1 positionally coinciding with each other in the Y direction are connected to the +Y direction-side edge of the surface of the fourth element bonding conductor layer 244 by means of four wires 251 extending substantially in the Y direction when viewed planarly. More specifically, one end of each wire 251 is bonded to the source electrode of the first switching element Tr1, and the other end of each wire 251 is bonded to the surface of the fourth element bonding conductor layer 244, and an intermediate part of each wire 251 is bonded to the anode electrode of the first diode element Di1. In other words, the components are connected together by stitch bonding in which either one of the source electrode of the first switching element Tr1 and the fourth element bonding conductor layer 244 is used as a start point, and the other one is used as an end point, and the anode electrode of the first diode element Di1 is used as a relay point. In the present embodiment, the source electrode of the first switching element Tr1 is used as a start point, and the fourth element bonding conductor layer 244 is used as an end point.

The entire arrangement width as the whole of the plurality of wires 251 covers substantially the entire width of a long side of the fourth element bonding conductor layer 244 (long side on the +Y direction side). Therefore, inductance caused by the wires 251 can be reduced because the entire arrangement width of the wires 251 can be enlarged. As a result, the self-inductance of the semiconductor module 1G can be reduced.

The gate electrode of each first switching element Tr1 is connected to the third gate terminal conductor layer 246 by means of a wire 252. The third gate terminal conductor layer 246 is connected to the third gate terminal G3 by means of a wire 253. The source electrode of each first switching element Tr1 is connected to the third source terminal conductor layer 247 by means of a wire 254. The third source terminal conductor layer 247 is connected to the third source terminal S3 by means of a wire 255.

Drain electrodes of the second switching elements Tr2 are bonded to the surface of the fourth element bonding conductor layer 244 through a solder layer (not shown), and cathode electrodes of the second diode elements Di2 are bonded thereto through a solder layer (not shown). Each second switching element Tr2 has a source electrode and a gate electrode on a surface opposite to the surface bonded to the fourth element bonding conductor layer 244. Each second diode element Di2 has an anode electrode on the surface opposite to the surface bonded to the fourth element bonding conductor layer 244.

Three second switching elements Tr2 are spaced at intervals side by side in the X direction in an area closer to a side on the −Y direction side of the surface of the fourth element bonding conductor layer 244. Additionally, three second diode elements Di2 are spaced at intervals side by side in the X direction between a side on the +Y direction side of the fourth element bonding conductor layer 244 and the three second switching elements Tr2. The three second diode elements Di2 positionally coincide with the three second switching elements Tr2 with respect to the Y direction. The three second switching elements Tr2 positionally coincide with the three first switching elements Tr1 with respect to the Y direction.

A pair of second switching elements Tr2 on both sides among the three second switching elements Tr2 and a pair of second diode elements Di2 on both sides among the three second diode elements Di2 face both ends of the +Y direction-side edge of the second N terminal conductor layer 245, respectively.

The second switching element Tr2 and the second diode element Di2 positionally coinciding with each other in the Y direction are connected to the +Y direction-side edge of the surface of the second N terminal conductor layer 245 by means of four wires 256 extending substantially in the Y direction when viewed planarly. More specifically, one end of each wire 256 is bonded to the anode electrode of the second diode element Di2, and the other end of each wire 256 is bonded to the surface of the second N terminal conductor layer 245, and an intermediate part of each wire 256 is bonded to the source electrode of the second switching element Tr2. In other words, the components are connected together by stitch bonding in which either one of the anode electrode of the second diode element Di2 and the second N terminal conductor layer 245 is used as a start point, and the other one is used as an end point, and the source electrode of the second switching element Tr2 is used as a relay point. In the present embodiment, the anode electrode of the second diode element Di2 is used as a start point, and the second N terminal conductor layer 245 is used as an end point.

The entire arrangement width as the whole of the plurality of wires 256 covers substantially the entire width of the +Y direction-side edge of the second N terminal conductor layer 245. Therefore, inductance caused by the wires 256 can be reduced because the entire arrangement width of the wires 256 can be enlarged. As a result, the self-inductance of the semiconductor module 1G can be reduced.

The gate electrode of each second switching element Tr2 is connected to the fourth gate terminal conductor layer 248 by means of a wire 257. The fourth gate terminal conductor layer 248 is connected to the fourth gate terminal G4 by means of a wire 258. The source electrode of each second switching element Tr2 is connected to the fourth source terminal conductor layer 249 by means of a wire 259. The fourth source terminal conductor layer 249 is connected to the fourth source terminal S4 by means of a wire 260.

The third element bonding conductor layer 243 is connected to the first element bonding conductor layer 143 of the first substrate assembly 140 by means of a plurality of wires 173 extending in the X direction when viewed planarly. More specifically, one end of each wire 173 is bonded to the +X direction-side edge of the surface of the third element bonding conductor layer 243, and an opposite end of each wire 173 is bonded to the −X direction-side edge of the surface of the first element bonding conductor layer 143. These wires 173 are disposed in parallel with each other when viewed planarly.

The fourth element bonding conductor layer 244 is connected to the second element bonding conductor layer 144 of the first substrate assembly 140 by means of a plurality of wires 175 extending in the X direction when viewed planarly. More specifically, one end of each wire 175 is bonded to the +X direction-side edge of the surface of the fourth element bonding conductor layer 244, and an opposite end of each wire 175 is bonded to the −X direction-side edge of the surface of the second element bonding conductor layer 144. These wires 175 are disposed in parallel with each other when viewed planarly.

The second N terminal conductor layer 245 is connected to the first N terminal conductor layer 145 of the first substrate assembly 140 by means of a plurality of wires 174 extending in the X direction when viewed planarly. More specifically, one end of each wire 174 is bonded to the +X direction-side edge of the surface of the second N terminal conductor layer 245, and an opposite end of each wire 174 is bonded to the −X direction-side edge of the surface of the first part 145a of the first N terminal conductor layer 145. These wires 174 are disposed in parallel with each other when viewed planarly.

Referring to FIG. 24 and FIG. 27, the third substrate assembly 340 includes a third insulating substrate 341, a plurality of first switching elements Tr1, a plurality of first diode elements Di1, a plurality of second switching elements Tr2, and a plurality of second diode elements Di2.

The third insulating substrate 341 is formed substantially in a rectangle that is substantially equal in shape and in size to the first insulating substrate 141 when viewed planarly, and is bonded to the surface of the heat dissipation plate 2 in a posture in which the four sides of the third insulating substrate 341 are parallel to the four sides of the heat dissipation plate 2, respectively. A bonding conductor layer (not shown) is formed on a surface (−Z direction-side surface) on the heat-dissipation-plate side (2) of the third insulating substrate 341. This bonding conductor layer is bonded to the heat dissipation plate 2 through a solder layer (not shown). A fifth element bonding conductor layer 343, a sixth element bonding conductor layer 344, a third N terminal conductor layer 345, a fifth gate terminal conductor layer 346, a fifth source terminal conductor layer 347, a sixth gate terminal conductor layer 348, and a sixth source terminal conductor layer 349 are formed on the surface (+Z direction-side surface) opposite to the heat dissipation plate 2 of the third insulating substrate 341.

In the present embodiment, the third insulating substrate 341 is made of AlN. For example, a substrate (DBC substrate) in which a copper foil is bonded directly to both sides of ceramics can be used as the third insulating substrate 341. If a DBC substrate is used as the third insulating substrate 341, each of the conductor layers 343 to 349 can be made of its copper foil.

In the tenth embodiment, the sixth element bonding conductor layer 344 is disposed at the intermediate part in the Y direction of the surface of the third insulating substrate 341. Additionally, the fifth element bonding conductor layer 343 is disposed on the +Y direction side with respect to the sixth element bonding conductor layer 344, and the third N terminal conductor layer 345 is disposed on the −Y direction side with respect to the sixth element bonding conductor layer 344.

The sixth element bonding conductor layer 344 has a first part 344a that is formed in a rectangular shape longer in the X direction when viewed planarly and with which an intermediate part in the Y direction in the surface of the second insulating substrate 241 is covered, a second part 344b that extends in the −Y direction from the −X direction-side end of the first part 344a, and a third part 344c that extends in the +Y direction from the −X direction-side end of the first part 344a.

The fifth element bonding conductor layer 343 is disposed between a side on the +Y direction side of the third insulating substrate 341 and the first part 344a of the sixth element bonding conductor layer 344, and is formed in a rectangular shape longer in the X direction when viewed planarly. A projection 343a that protrudes in the +Y direction is formed at the +X direction-side end of the fifth element bonding conductor layer 343.

The third N terminal conductor layer 345 is disposed between a side on the −Y direction side of the third insulating substrate 341 and the first part 344a of the sixth element bonding conductor layer 344, and is formed in a rectangular shape longer in the X direction when viewed planarly. A projection 345a that protrudes in the +Y direction is formed at the +X direction-side end of the third N terminal conductor layer 345.

The fifth gate terminal conductor layer 346 is formed in a rectangle slender in the X direction when viewed planarly, and is disposed between the projection 343a of the fifth element bonding conductor layer 343 and the forward end of the third part 344c of the sixth element bonding conductor layer 344. The fifth source terminal conductor layer 347 is formed in a rectangle slender in the X direction when viewed planarly, and is disposed between the fifth gate terminal conductor layer 346 and the side on the +Y direction side of the third insulating substrate 341.

The sixth gate terminal conductor layer 348 is formed in a rectangle slender in the X direction when viewed planarly, and is disposed between the basal end of the second part 344b of the sixth element bonding conductor layer 344 and the projection 345a of the third N terminal conductor layer 345. The sixth source terminal conductor layer 349 is formed in a rectangle slender in the X direction when viewed planarly, and is disposed between the sixth gate terminal conductor layer 348 and the first part 344a of the sixth element bonding conductor layer 344.

Drain electrodes of the first switching elements Tr1 are bonded to the surface of the fifth element bonding conductor layer 343 through a solder layer (not shown), and cathode electrodes of the first diode elements Di1 are bonded thereto through a solder layer (not shown). Each first switching element Tr1 has a source electrode and a gate electrode on a surface opposite to the surface bonded to the fifth element bonding conductor layer 343. Each first diode element Di1 has an anode electrode on the surface opposite to the surface bonded to the fifth element bonding conductor layer 343.

Four first diode elements Di1 are spaced at intervals side by side in the X direction in an area closer to a side on the −Y direction side of the surface of the fifth element bonding conductor layer 343. Additionally, four first switching elements Tr1 are spaced at intervals side by side in the X direction between a side on the +Y direction side of the fifth element bonding conductor layer 343 and the four first diode elements Di1. The four first switching elements Tr1 positionally coincide with the four first diode elements Di1 with respect to the Y direction.

A pair of first switching elements Tr1 on both sides among the four first switching elements Tr1 and a pair of first diode elements Di1 on both sides among the four first diode elements Di1 face both ends of a long side on the +Y direction side of the first part 344a of the sixth element bonding conductor layer 344, respectively.

The first switching element Tr1 and the first diode element Di1 positionally coinciding with each other in the Y direction are connected to the +Y direction-side edge of the surface of the first part 344a of the sixth element bonding conductor layer 344 by means of four wires 351 extending substantially in the Y direction when viewed planarly. More specifically, one end of each wire 351 is bonded to the source electrode of the first switching element Tr1, and the other end of each wire 351 is bonded to the surface of the sixth element bonding conductor layer 344, and an intermediate part of each wire 351 is bonded to the anode electrode of the first diode element Di1. In other words, the components are connected together by stitch bonding in which either one of the source electrode of the first switching element Tr1 and the sixth element bonding conductor layer 344 is used as a start point, and the other one is used as an end point, and the anode electrode of the first diode element Di1 is used as a relay point. In the present embodiment, the source electrode of the first switching element Tr1 is used as a start point, and the sixth element bonding conductor layer 344 is used as an end point.

The entire arrangement width as the whole of the plurality of wires 351 covers substantially the entire width of a long side of the first part 344a of the sixth element bonding conductor layer 344 (long side on the +Y direction side). Therefore, inductance caused by the wires 351 can be reduced because the entire arrangement width of the wires 351 can be enlarged. As a result, the self-inductance of the semiconductor module 1G can be reduced.

The gate electrode of each first switching element Tr1 is connected to the fifth gate terminal conductor layer 346 by means of a wire 352. The fifth gate terminal conductor layer 346 is connected to the fifth gate terminal G5 by means of a wire 353. The source electrode of each first switching element Tr1 is connected to the fifth source terminal conductor layer 347 by means of a wire 354. The fifth source terminal conductor layer 347 is connected to the fifth source terminal S5 by means of a wire 355.

Drain electrodes of the second switching elements Tr2 are bonded to the surface of the first part 344a of the sixth element bonding conductor layer 344 through a solder layer (not shown), and cathode electrodes of the second diode elements Di2 are bonded thereto through a solder layer (not shown). Each second switching element Tr2 has a source electrode and a gate electrode on a surface opposite to the surface bonded to the sixth element bonding conductor layer 344. Each second diode element Di2 has an anode electrode on the surface opposite to the surface bonded to the sixth element bonding conductor layer 344.

Four second switching elements Tr2 are spaced at intervals side by side in the X direction in an area closer to a side on the −Y direction side of the surface of the first part 344a of the sixth element bonding conductor layer 344. Additionally, four second diode elements Di2 are spaced at intervals side by side in the X direction between a side on the +Y direction side of the first part 344a of the sixth element bonding conductor layer 344 and the four second switching elements Tr2. The four second diode elements Di2 positionally coincide with the four second switching elements Tr2 with respect to the Y direction. The four second switching elements Tr2 positionally coincide with the four first switching elements Tr1 with respect to the Y direction.

A pair of second switching elements Tr2 on both sides among the four second switching elements Tr2 and a pair of second diode elements Di2 on both sides among the four second diode elements Di2 face both ends of a long side on the +Y direction side of the third N terminal conductor layer 345, respectively.

The second switching element Tr2 and the second diode element Di2 positionally coinciding with each other in the Y direction are connected to the +Y direction-side edge of the surface of the third N terminal conductor layer 345 by means of four wires 356 extending substantially in the Y direction when viewed planarly. More specifically, one end of each wire 356 is bonded to the anode electrode of the second diode element Di2, and the other end of each wire 356 is bonded to the surface of the third N terminal conductor layer 345, and an intermediate part of each wire 356 is bonded to the source electrode of the second switching element Tr2. In other words, the components are connected together by stitch bonding in which either one of the anode electrode of the second diode element Di2 and the third N terminal conductor layer 345 is used as a start point, and the other one is used as an end point, and the source electrode of the second switching element Tr2 is used as a relay point. In the present embodiment, the anode electrode of the second diode element Di2 is used as a start point, and the third N terminal conductor layer 345 is used as an end point.

The entire arrangement width as the whole of the plurality of wires 356 covers substantially the entire width of a long side of the third N terminal conductor layer 345 (long side on the +Y direction side). Therefore, inductance caused by the wires 356 can be reduced because the entire arrangement width of the wires 356 can be enlarged. As a result, the self-inductance of the semiconductor module 1G can be reduced.

The gate electrode of each second switching element Tr2 is connected to the sixth gate terminal conductor layer 348 by means of a wire 357. The sixth gate terminal conductor layer 348 is connected to the sixth gate terminal G6 by means of a wire 358. The source electrode of each second switching element Tr2 is connected to the sixth source terminal conductor layer 349 by means of a wire 359. The sixth source terminal conductor layer 349 is connected to the sixth source terminal S6 by means of a wire 360.

The fifth element bonding conductor layer 343 is connected to the third element bonding conductor layer 243 of the second substrate assembly 240 by means of a plurality of wires 176 extending in the X direction when viewed planarly. More specifically, one end of each wire 176 is bonded to the +X direction-side edge of the surface of the fifth element bonding conductor layer 343, and an opposite end of each wire 176 is bonded to the −X direction-side edge of the surface of the third element bonding conductor layer 243. These wires 176 are disposed in parallel with each other when viewed planarly.

The sixth element bonding conductor layer 344 is connected to the fourth element bonding conductor layer 244 of the second substrate assembly 240 by means of a plurality of wires 178 extending in the X direction when viewed planarly. More specifically, one end of each wire 178 is bonded to the +X direction-side edge of the surface of the first part 344a of the sixth element bonding conductor layer 344, and an opposite end of each wire 178 is bonded to the −X direction-side edge of the surface of the fourth element bonding conductor layer 244. These wires 178 are disposed in parallel with each other when viewed planarly.

The third N terminal conductor layer 345 is connected to the second N terminal conductor layer 245 of the second substrate assembly 240 by means of a plurality of wires 177 extending in the X direction when viewed planarly. More specifically, one end of each wire 177 is bonded to the +X direction-side edge of the surface of the third N terminal conductor layer 345, and an opposite end of each wire 177 is bonded to the −X direction-side edge of the surface of the second N terminal conductor layer 245. These wires 177 are disposed in parallel with each other when viewed planarly.

Additionally, the sixth element bonding conductor layer 344 is connected to the internal wiring connection portion 23a of the first output terminal OUT1 by means of a plurality of wires 179 extending in the X direction when viewed planarly. More specifically, one end of each wire 179 is bonded to the −X direction-side edge of the surface of the first part 344a of the sixth element bonding conductor layer 344 and to the surface of the second part 344b, and an opposite end of each wire 179 is bonded to the internal wiring connection portion 23a of the first output terminal OUT1. These wires 179 are disposed in parallel with each other when viewed planarly.

Additionally, the sixth element bonding conductor layer 344 is connected to the internal wiring connection portion 24a of the second output terminal OUT2 by means of a plurality of wires 180 extending in the X direction when viewed planarly. More specifically, one end of each wire 180 is bonded to the surface of the third part 344c, and an opposite end of each wire 180 is bonded to the internal wiring connection portion 24a of the second output terminal OUT2. These wires 180 are disposed in parallel with each other when viewed planarly.

The heat dissipation plate 2 is deformed so as to become convex toward the −Z direction side as a whole when viewed from the Y direction in the same way as in the first embodiment (see FIG. 2) described above, which is not shown in the drawings.

The first gate terminal G1, the third gate terminal G3, and the fifth gate terminal G5 may be connected together in the case. Likewise, the second gate terminal G2, the fourth gate terminal G4, and the sixth gate terminal G6 may be connected together in the case. If so, only two gate terminals consisting of a single gate terminal representing the first gate terminal G1, the third gate terminal G3, and the fifth gate terminal G5 and a single gate terminal representing the second gate terminal G2, the fourth gate terminal G4, and the sixth gate terminal G6 may be exposed outwardly from the case.

The first source terminal S1, the third source terminal S3, and the fifth source terminal S5 may be connected together in the case. Likewise, the second source terminal S2, the fourth source terminal S4, and the sixth source terminal S6 may be connected together in the case. If so, only two source terminals consisting of a single source terminal representing the first source terminal S1, the third source terminal S3, and the fifth source terminal S5 and a single source terminal representing the second source terminal S2, the fourth source terminal S4, and the sixth source terminal S6 may be exposed outwardly from the case.

Although an example in which the insulating substrate is made of AlN has been described in the aforementioned embodiments, the present invention is not limited to this. Even if it is an insulating substrate made of SiN, the heat dissipation plate 2 can be deformed so as to become convex toward the −Z direction side as a whole when viewed from the Y direction in the same way as above.

Although the embodiments of the present invention have been described in detail, these embodiments are merely specific examples used to clarify the technical contents of the present invention, and the present invention should not be understood as being limited to these examples, and the scope of the present invention is to be determined solely by the appended claims.

The present application corresponds to Japanese Patent Application No. 2011-142036 filed in the Japan Patent Office on Jun. 27, 2011 and to Japanese Patent Application No.

2012-33142 filed in the Japan Patent Office on Feb. 17, 2012, and the entire disclosure of the application is incorporated herein by reference.

Reference Signs List

- 101, 102, 1, 1A~1G Semiconductor module
- 200, 100 Insulating substrate
- 201, 41A, 61A First plane
- 202, 41B, 61B Second plane
- 210 First conductor layer
- 220 Second conductor layer
- 300 Semiconductor device
- 400, 2 Heat dissipation plate
- 410, 13 Attaching through-hole
- 420, 2a Deformed portion
- 430, 2b Inverted deformed portion
- 510 First solder layer
- 520 Second solder layer
- 600, 3 Case
- 610 Containing space
- 620, 12 Attaching through-hole
- 650 Electrode
- 700, 30 Sealing resin
- 800 Bolt
- 810 Stationary plate
- 41 First insulating substrate
- 42 First bonding conductor layer (Second conductor layer)
- 43 First element bonding conductor layer (First conductor layer)
- 44 First source conductor layer (Third conductor layer)
- 44A Anode conductor layer (Third conductor layer)
- 61 Second insulating substrate
- 62 Second bonding conductor layer (Second conductor layer)
- 63 Second element bonding conductor layer (First conductor layer)
- 64 Second source conductor layer (Third conductor layer)
- 51, 71 Wire
- 57, 72, 73 Wire
- 85 to 88 Solder layer

What is claimed is:

1. A semiconductor module comprising:
   an insulating substrate that is made of AlN and that has a first plane and a second plane both of which face mutually opposite directions;
   a first conductor layer formed on the first plane;
   a second conductor layer formed on the second plane;
   a semiconductor device bonded to the first conductor layer with a first solder layer interposed therebetween; and
   a heat dissipation plate that is formed in a rectangular shape when viewed planarly and that is bonded to the second conductor layer with a second solder layer interposed therebetween;
   the heat dissipation plate being deformed so as to become convex in a direction in which the second plane is pointed when viewed from a width direction of the heat dissipation plate,
   wherein a distance in a thickness direction of a surface on a same side as a lengthwise center and lengthwise both ends of the heat dissipation plate is greater than 0 μm and is 100 μm or less.

2. The semiconductor module according to claim 1, wherein a thickness of the second solder layer is 180 μm to 270 μm.

3. The semiconductor module according to claim 1, further comprising a case bonded to the heat dissipation plate, the case having a containing space that contains the insulating substrate and the semiconductor device.

4. The semiconductor module according to claim 3, wherein the containing space is filled with an insulating sealing resin.

5. A semiconductor module comprising:
   two insulating substrates each of which is made of AlN and each of which has a first plane and a second plane facing mutually opposite directions;
   a first conductor layer formed on the first plane of each of the two insulating substrates;
   a second conductor layer formed on the second plane of each of the two insulating substrates;
   a semiconductor device bonded to each of the first conductor layers with a first solder layer interposed therebetween; and
   a heat dissipation plate that is formed in a rectangular shape when viewed planarly and that is bonded to both the second conductor layers with a second solder layer interposed therebetween;
   wherein the two insulating substrates are arranged side by side in a length direction of the heat dissipation plate,
   the heat dissipation plate having:
   a deformed portion that is positioned at an intermediate part in the length direction of the heat dissipation plate when viewed from a width direction of the heat dissipation plate and that is deformed so as to become convex in a direction in which the second plane is pointed; and
   two inverted deformed portions that are positioned on both sides of the deformed portion and that are deformed so as to become convex in a direction in which the first plane is pointed.

6. The semiconductor module according to claim 5, wherein the deformed portion is disposed between the two insulating substrates when viewed planarly.

7. The semiconductor module according to claim 5, wherein the two inverted deformed portions lie on the two insulating substrates when viewed planarly, respectively.

8. The semiconductor module according to claim 5, wherein a distance in a thickness direction of a surface on a same side as lengthwise both ends of the heat dissipation plate and as the deformed portion of the heat dissipation plate is greater than 0 μm and is 100 μm or less.

9. The semiconductor module according to claim 8, wherein a thickness of the second solder layer is 180 μm to 270 μm.

10. The semiconductor module according to claim 5, further comprising a case bonded to the heat dissipation plate, the case having a containing space that contains the insulating substrates and the semiconductor devices.

11. The semiconductor module according to claim 10, wherein the containing space is filled with an insulating sealing resin.

12. The semiconductor module according to claim 1, further comprising:
   a third conductor layer formed on the first plane of the insulating substrate; and
   a connection metal member by which the semiconductor device bonded to the first conductor layer on the first plane of the insulating substrate and the third conductor layer are connected together,
   wherein the first conductor layer has a rectangular element bonding area formed in a rectangular shape,
   wherein the third conductor layer has a rectangular element connecting area that is disposed along one long side of the element bonding area of the first conductor layer and that has a long side facing the one long side of the element bonding area, wherein a plurality of semiconductor devices each of which is the aforementioned semiconductor device are arranged side by side in a length direction of the element bonding area on the element bonding area of the first conductor layer, and wherein the semiconductor devices include two semiconductor devices that face both ends of the long side of the element connecting area of the third conductor layer.

13. The semiconductor module according to claim 12, wherein each connection metal member is disposed in parallel with a short side of the element bonding area of the first conductor layer, and one end of each connection metal member is bonded to the semiconductor device disposed on the first conductor layer whereas an opposite end of each connection metal member is bonded to the element connecting area of the third conductor layer.

14. The semiconductor module according to claim 1, further comprising:

a terminal electrically connected to the first conductor layer; and a plurality of connection metal members one end of each of which is bonded to the first conductor layer and an opposite end of each of which is bonded to the terminal, wherein the plurality of connection metal members are disposed in parallel with each other when viewed planarly, and corresponding ends of the connection metal members adjoining each other are disposed at positions deviated in a length direction of the connection metal members, respectively, when viewed from a width direction of a whole of the plurality of connection metal members.

15. The semiconductor module according to claim 2, further comprising a case bonded to the heat dissipation plate, the case having a containing space that contains the insulating substrate and the semiconductor device.

16. The semiconductor module according to claim 15, wherein the containing space is filled with an insulating sealing resin.

17. The semiconductor module according to claim 6, wherein the two inverted deformed portions lie on the two insulating substrates when viewed planarly, respectively.

* * * * *

UNITED STATES PATENT AND TRADEMARK OFFICE
CERTIFICATE OF CORRECTION

PATENT NO. : 9,129,932 B2
APPLICATION NO. : 14/129262
DATED : September 8, 2015
INVENTOR(S) : Kenji Hayashi and Masashi Hayashiguchi It is certified that error appears in the above-identified patent and that said Letters Patent is hereby corrected as shown below:

Title Page, Item 87 (PCT Pub. Date)

"Mar. 1, 2013" should be changed to --Jan. 3, 2013--

Signed and Sealed this
Fifth Day of July, 2016

Michelle K. Lee
*Director of the United States Patent and Trademark Office*